US007029602B2

(12) United States Patent
Oshio

(10) Patent No.: US 7,029,602 B2
(45) Date of Patent: Apr. 18, 2006

(54) INORGANIC OXIDE AND PHOSPHOR

(75) Inventor: Shozo Oshio, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/672,345

(22) Filed: Sep. 25, 2003

(65) Prior Publication Data

US 2004/0062699 A1    Apr. 1, 2004

(30) Foreign Application Priority Data

Sep. 25, 2002    (JP)    ............................. 2002-280035

(51) Int. Cl.
*C09K 11/79* (2006.01)
*C09K 11/80* (2006.01)
(52) U.S. Cl. .................... 252/301.4 R; 252/301.4 F
(58) Field of Classification Search ......... 252/301.4 R, 252/301.4 F; 423/263, 276, 326, 331, 600, 423/327.1, 593.1, 594.16; 117/942, 945, 117/944
See application file for complete search history.

(56) References Cited

U.S. PATENT DOCUMENTS

| 4,093,890 A * | 6/1978 | Verriet et al. ............... 313/486 |
| 5,998,925 A | 12/1999 | Shimizu et al. |
| 6,552,487 B1 | 4/2003 | Ellens et al. |

FOREIGN PATENT DOCUMENTS

| EP | 1 347 517 | 9/2003 |
| JP | 62-277488 | 12/1987 |
| JP | 10-163535 | 6/1998 |
| JP | 10-247750 | 9/1998 |
| JP | 3246386 | 11/2001 |

OTHER PUBLICATIONS

Phosphor Research Society, 1999, "Phosphor Handbook" (English language version), CRC Press LLC, USA, pp. 359-444.
Phosphor Research Society, 1987, "Fluorescent Handbook", (English language version), Ohmsha, Japan, pp. 192-240.
Geller et al. 1959, "J. Phys. Chem. Solids", Pergamon Press, Great Britain, vol. 12, pp. 111.
Baldassare Di Bartolo, 1978, "Luminescence of Inorganic Solids", Plenum Press, New york, pp. 527-528.

(Continued)

*Primary Examiner*—C. Melissa Koslow
(74) *Attorney, Agent, or Firm*—Hamre, Schumann, Mueller & Larson, P.C.

(57) ABSTRACT

The present invention provides an inorganic oxide made of $MLn_2QR_4O_{12}$, where M is at least one element selected from the group consisting of Mg, Ca, Sr, and Ba; Ln is at least one rare earth element selected from the group consisting of Sc, Y, La, Ce, Pr, Nd, Sm, Eu, Gd, Tb, Dy, Ho, Er, Tm, Yb, and Lu; Q is at least one element selected from the group consisting of Si, Ge, Sn, and Pb,; and R is at least one element selected from the group consisting of B, Al, Ga, In, and Tl. This inorganic oxide serves as a phosphor or a phosphor host and if it contains ions capable of being the luminescent center, it becomes a phosphor emitting fluorescent light. Thus, a novel oxide that can be a phosphor host of a high efficiency phosphor or the phosphor itself and a novel phosphor are provided.

20 Claims, 56 Drawing Sheets

OTHER PUBLICATIONS

JCPDS-International Centre for Diffraction Data, 2000, "Powder Diffraction File: Alphabetical Indexes for Experimental Patterns" pages related to the chemical elements Ca, Ba, Mg, Sr only.

* cited by examiner

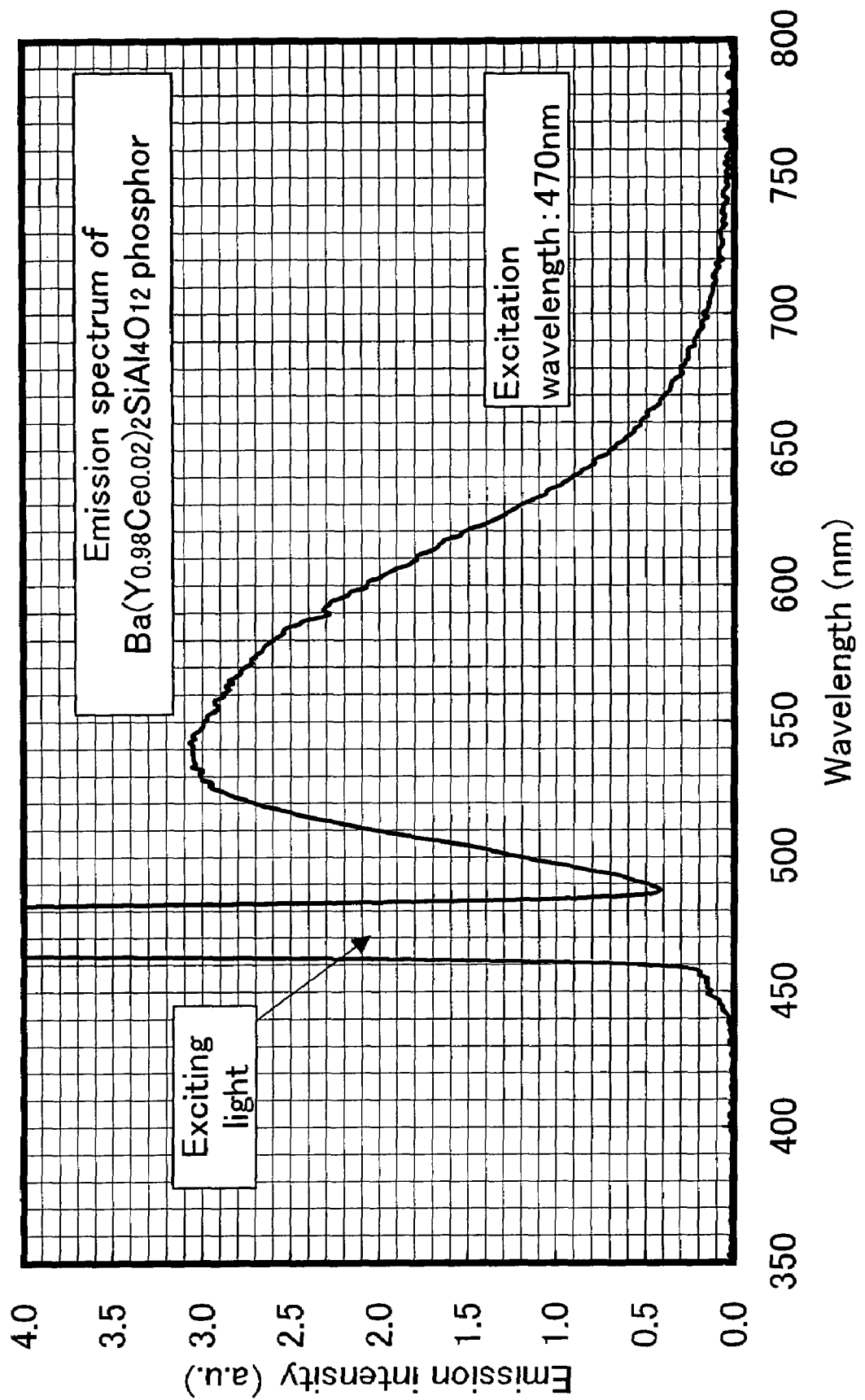

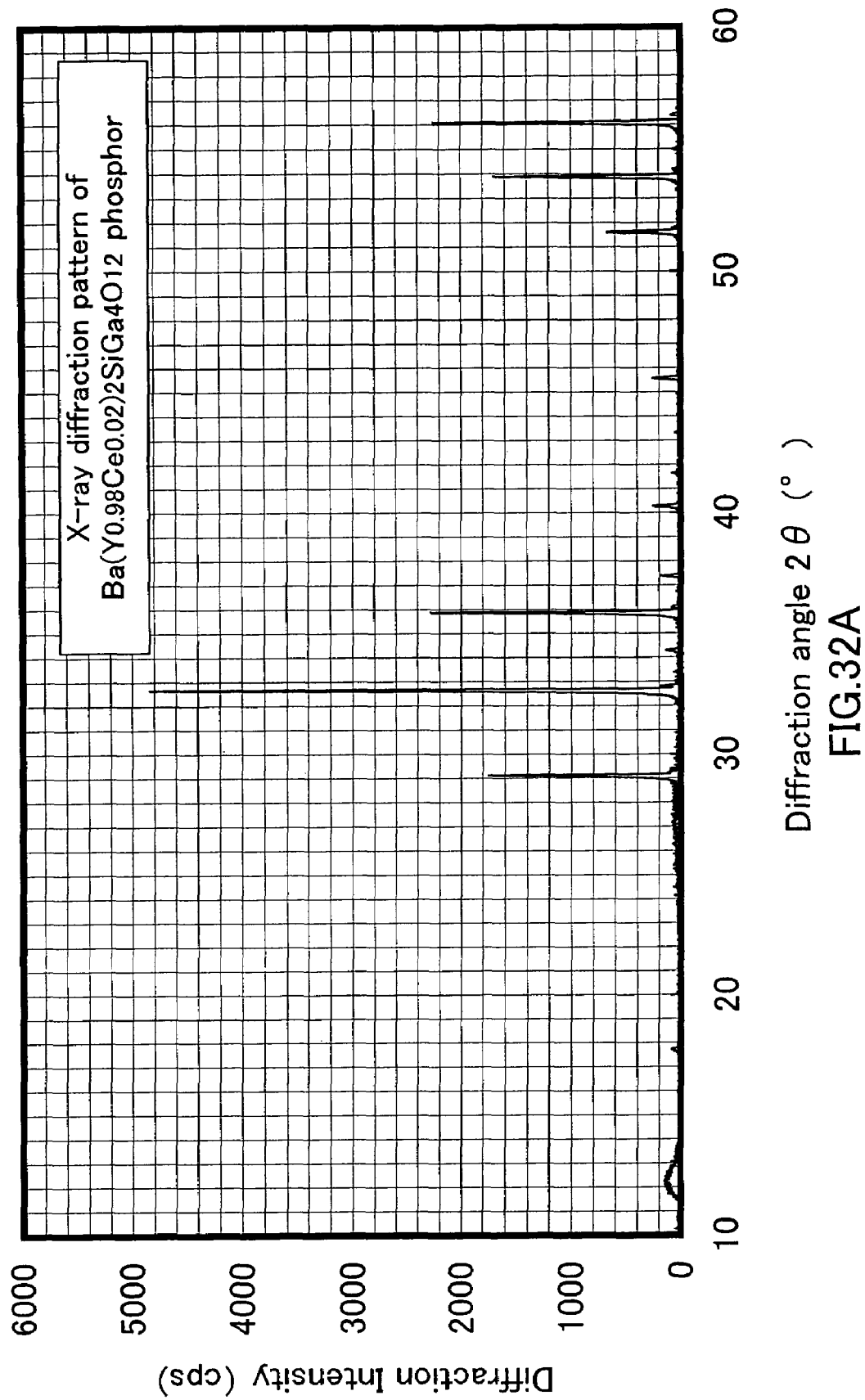

INORGANIC OXIDE AND PHOSPHOR

FIELD OF THE INVENTION

The present invention relates to novel inorganic oxides and phosphors.

BACKGROUND OF THE INVENTION

Conventionally, a large number of phosphor materials in which ions capable of emitting fluorescent light are doped into inorganic compound materials (hereinafter, referred simply as "phosphors") have been known. Phosphors have the properties of emitting ultraviolet, visible and infrared light by action of external exciting means such as irradiation of electromagnetic waves (e.g., electron beams, X-rays, ultraviolet rays, visible light, etc.) or application of an electric field, and therefore are used in a large number of photoelectric transducers or photoelectric conversion devices. Examples thereof are light-emitting devices such as white light-emitting diodes (hereinafter, referred to as "white LED"), fluorescent lamps, electron beam tubes, plasma display panels, inorganic electroluminescent displays, and scintillators.

The phosphors will be described below. Inorganic compounds that can be phosphors by adding ions capable of emitting fluorescent light are known as a "phosphor host", and the ions that emit fluorescent light by being doped to the phosphor host are known as "luminescent center". A large number of inorganic compounds can be a phosphor host, and a typical compound among them is an inorganic oxide. A large number of inorganic oxides useful as a phosphor host have been found so far, and a large number of high efficiency phosphors have been put into practice. Specific examples of inorganic oxides include $Y_2O_3$, $Zn_2SiO_4$, $LaPO_4$, $BaMgAl_{10}O_{17}$, $Y_3Al_5O_{12}$, and $GdMgB_5O_{10}$ (e.g., non-patent reference 1: *Fluorescent Handbook*, edited by Phosphor Research Society, published on Dec. 25, 1987 by Ohmsha, Ltd, pages 192–240). In the research and development field of phosphors, there is a constant demand for development of novel phosphors with the increasing variety and high performance of phosphor application equipment.

Conventionally, a $CaY_2SnFe_4O_{12}$ compound has been known as an inorganic oxide expressed by a chemical formula $AB_2CD_4O_{12}$, where A is a metal ion that can be a bivalent ion, B and D are metal ions that can be trivalent ions, and C is a metal ion that can be a tetravalent (e.g., non-patent reference 2: Geller et al., J. Phys. Chem. Solids, 12, 111 (1959)). According to this reference, it is known that a $CaY_2SnFe_4O_{12}$ compound has the crystal structure of garnet.

It is suggested that an inorganic oxide in which a part of or the entire Y of an inorganic oxide expressed by $Y_3Al_5O_{12}$ is substituted with Mg, Ca, Sr, Ba Mn, Fe, Co, Cu, Ni, Zn, Cd, Pb or the like, and a part of or the entire Al is substituted with Si, Ge, Sn, Ti, Zr, Hf, Ru, or the like can be present as the inorganic oxide expressed by $AB_2CD_4O_{12}$ having the garnet structure (e.g., non-patent reference 3: Baldassare Di bartolo *Luminescence of Inorganic Solids* Plenum Press pages 527–528). However, the inorganic oxide actually present is only $CaY_2SnFe_4O_{12}$ (e.g., non-patent reference 4: PDF (Power Data File: 2000) of JCPDS-ICDD (Joint Committee on Powder Diffraction Standard International Center for Diffraction Data)), and there has been no report regarding inorganic oxides expressed by the above-described chemical formula other than $CaY_2SnFe_4O_{12}$.

Conventionally, regarding phosphors, a phosphor expressed by a general formula $v(R_{1-a-b}Ce_aTb_b)_2O_3 \cdot wDO \cdot xAl_2O_3 \cdot ySiO_2 \cdot zB_2O_3$, where R is at least one of Y, La and Gd, D is at least one of Mg, Ca, Sr, Ba, and Zn, a, b, v, w, x, y and z are values satisfying $0<a+b \leq 1$, $v \neq 0$, $w \neq 0$, $0 \leq x$, $0 \leq y$, $0 \leq z$, $x+y>0$, $y+z>0$, and $x+z>0$, has been disclosed (patent reference 1: JP62-277488 A (page 1, Tables 1 to 4).

The patent reference 1 describes improvement of $CeMgAl_{11}O_{19}:Tb^{3+}$ phosphor, which is well known as a green phosphor having a magnet plumbite structure, and other phosphors. This can be said for the following reason. In the phosphors disclosed in the examples of the patent reference 1, for example, the ratio (the number of atoms of the alkaline-earth metal element/the number of atoms of the rare earth element) of the alkaline-earth metal element (at least one of Mg, Ca, Sr, Ba, and Zn) to the rare earth element (at least one of Y, La and Gd) is in the range from 0.7 to 1.5, and there is no description regarding phosphors whose ratio is in the range from 0 to 0.5.

Apart from the above, regarding light-emitting devices (semiconductor light-emitting elements, illumination devices, or display devices), in recent years, semiconductor light-emitting elements/illumination devices/display devices in which a light-emitting diode (LED) and a phosphor are combined have attracted attention. A typical example thereof is a light-emitting device in which a blue LED using a gallium nitride host compound semiconductor material as an active layer is combined with a yellow light-emitting phosphor containing $(Y, Gd)_3Al_5O_{12}$ inorganic oxide host material as the phosphor host and at least $Ce^{3+}$ ions as the luminescent center (hereinafter, referred to as "YAG:Ce host phosphor") (e.g., patent reference 2: Japanese Patent No. 2927279 (page 1), patent reference 3: Japanese Patent No. 3246386 (pages 1–6, Examples 1 to 5)). Such a light-emitting device in which a blue LED and a YAG:Ce host phosphor are combined can provide high intensity whitish light, for which there is a great demand for illumination and display, so that in recent years, the market is growing rapidly. In the light-emitting device in which a blue LED and a YAG:Ce host phosphor are combined, the bluish light emitted from the blue LED by allowing current to flow is absorbed by the YAG:Ce host phosphor, and the phosphor is excited with the bluish light, and converted to yellowish light with a high conversion efficiency. The mixture of the bluish light and the yellowish light can provide white light.

Recently, the YAG:Ce host phosphor also has been improved. Especially for use in illumination, the YAG:Ce host phosphor containing a large amount of a red light-emitting component is required, and for example, a phosphor in which $Pr^{3+}$ ions are coactivated has been developed (patent reference 4: JP 2001-192655 (page 1, FIG. 1)).

Another proposal is application and development of a phosphor different from the YAG:Ce host phosphor that is excited with bluish light, and emits yellowish light (defined as including a wide range of yellow-greenish, yellowish, and orangish light).

For example, there are the following applications of the phosphors that are different from the YAG:Ce host phosphor: a phosphor using (Zn, Cd)S as the phosphor host has been applied to an electron beam tube (e.g., patent reference 5: JP 10-163535 A (page 3)); and a $(Ba, Sr)2SiO_4:Eu^{2+}$ phosphor has been examined to be used for a fluorescent lamp (e.g., patent reference 6: WO 02/054503A1). On the other hand, almost no development of the phosphors different from the YAG:Ce host phosphor has been performed, partly because it requires significant effort.

On the other hand, the patent reference 3 discloses a phosphor in which a part of Y of a $Y_3Al_5O_{12}$:Ce phosphor is substituted with either one of Lu, Sc, La, Gd, and Sm and/or a part of Al is substituted with In, B, Tl, and Ga, and Si or Si and at least one selected from the group consisting of Ba, Sr, Mg, Ca and Zn are contained, and a light-emitting diode using the same.

However, the invention disclosed in the patent reference 3 basically is a phosphor that is an improvement of the YAG:Ce host phosphor. If the YAG:Ce host phosphor contains at least one element selected from the group consisting of Ba, Sr, Mg, Ca and Zn, and/or Si, a higher intensity LED lamp can be obtained.

Regarding the content of the above elements, it is preferable that at least one selected from the group consisting of Ba, Sr, Mg, Ca and Zn is contained in a ratio of 0.01 to 10.0%, and that Si is contained in a ratio of 0.001 to 5.0% in the specification of the patent reference 3. In other words, it is suggested that this phosphor contains these elements, not as the main component elements constituting the phosphor, but as impurity components that are doped in a small amount into the phosphor. In the examples, evidently, the YAG:Ce host phosphors in which the above-described elements are doped in a trace/small amount are described.

Furthermore, it is proposed that a phosphor substance used in the invention should be a host of a cerium-activated yttrium aluminum oxide host phosphor substance, and that specific examples are a phosphor having $YAlO_3$, $Y_3Al_5O_{12}$, or $Y_4Al_2O_9$ as the phosphor host (generally called YAG host phosphors) and a mixture of phosphors having the above-described compounds as the phosphor host.

As described above, inorganic oxides expressed by the chemical formula $AB_2CD_4O_{12}$ are mostly $CaY_2Fe_4SnO_{12}$ having the crystal structure of garnet, and inorganic oxides having other compositions, in particular, such a composition that can be a phosphor host, have not been proposed. $CaY_2SnFe_4O_{12}$ is an inorganic oxide that hardly serves as the phosphor host of a high efficient phosphor. For this reason, in the field of the material development of phosphors, no phosphor using a compound expressed by the chemical formula $AB_2CD_4O_{12}$ as the phosphor host has been known.

On the other hand, a blue exciting yellow phosphor other than the YAG:Ce host phosphor for a light-emitting device (e.g., white LED) in which the blue LED and a blue exciting yellow phosphor other than the YAG:Ce host phosphor are combined has a fatal problem in that the luminescent efficiency under the excitation of blue light is at least 10% lower than that of the YAG:Ce host phosphor, and has a secondary problem in that there is only a little of a red light-emitting component, which is required especially when it is used for illumination.

At the same time, a light-emitting device in which the blue LED and a blue exciting yellow phosphor other than the YAG:Ce host phosphor are combined has a problem in that the light-emitting intensity is low, the intensity of a red light-emitting component is low, and this light-emitting is inferior to a device in which the YAG:Ce host phosphor is used.

SUMMARY OF THE INVENTION

Therefore, with the foregoing in mind, it is a first object of the present invention to provide a novel oxide that can be a phosphor host of a highly efficient phosphor or a highly efficient phosphor itself, and a novel phosphor including the oxide as the phosphor host or made of the oxide. It is a second object of the present invention to provide a novel phosphor that is excited with blue light and emits light including a yellowish component, which is suitable especially as a light-emitting device to which a blue LED is applied. Furthermore, it is a third object of the present invention to provide a novel phosphor that includes a red light-emitting component in a large content, which is suitable as a device for illumination. Furthermore, it is a fourth object of the present invention to provide a novel light-emitting device that uses the novel phosphor and emits an intense output light equal to that when the YAG:Ce host phosphor is used, in particular, intense white light. The highly efficient phosphor means a phoshor having the high efficiency of emitting a light after being excited with another light.

A first inorganic oxide of the present invention is expressed by a chemical formula I below.

$$MLn_2QR_4O_{12} \qquad (I)$$

where M is at least one element selected from the group consisting of Mg, Ca, Sr, and Ba; Ln is at least one rare earth element selected from the group consisting of Sc, Y, La, Ce, Pr, Nd, Sm, Eu, Gd, Tb, Dy, Ho, Er, Tm, Yb, and Lu; Q is at least one element selected from the group consisting of Si, Ge, Sn, and Pb; and R is at least one element selected from the group consisting of B, Al, Ga, In, and Tl.

A second inorganic oxide of the present invention is expressed by the general formula III below.

$$(1-x)MLn_2QR_4O_{12}\cdot xLn_3R_5O_{12} \qquad (III)$$

where M is at least one element selected from the group consisting of Mg, Ca, Sr, and Ba; Ln is at least one rare earth element selected from the group consisting of Sc, Y, La, Ce, Pr, Nd, Sm, Eu, Gd, Tb, Dy, Ho, Er, Tm, Yb, and Lu; Q is at least one element selected from the group consisting of Si, Ge, Sn, and Pb; R is at least one element selected from the group consisting of B, Al, Ga, In, and Tl; and x is a value satisfying $0<x\leqq0.98$.

A third inorganic oxide of the present invention is a solid solution of an inorganic oxide expressed by a chemical formula I below and an inorganic oxide expressed by a chemical formula II.

$$MLn_2QR_4O_{12} \qquad (I)$$

$$Ln_3R_5O_{12} \qquad (II)$$

where M is at least one element selected from the group consisting of Mg, Ca, Sr, and Ba; Ln is at least one rare earth element selected from the group consisting of Sc, Y, La, Ce, Pr, Nd, Sm, Eu, Gd, Tb, Dy, Ho, Er, Tm, Yb, and Lu; Q is at least one element selected from the group consisting of Si, Ge, Sn, and Pb; and R is at least one element selected from the group consisting of B, Al, Ga, In, and Tl.

A phosphor of the present invention is characterized by having any of the above-described inorganic oxides as the phosphor host.

BRIEF DESCRIPTION OF THE DRAWINGS

FIG. 24 is the emission spectrum of the phosphor of Example 5 of the present invention.

FIG. 32A is the X-ray diffraction pattern of a phosphor $[Ba(Y_{0.98}Ce_{0.02})_2SiGa_4O_{12}]$ of Example 11 of the present invention.

DESCRIPTION OF THE PREFERRED EMBODIMENTS

Figure 1:
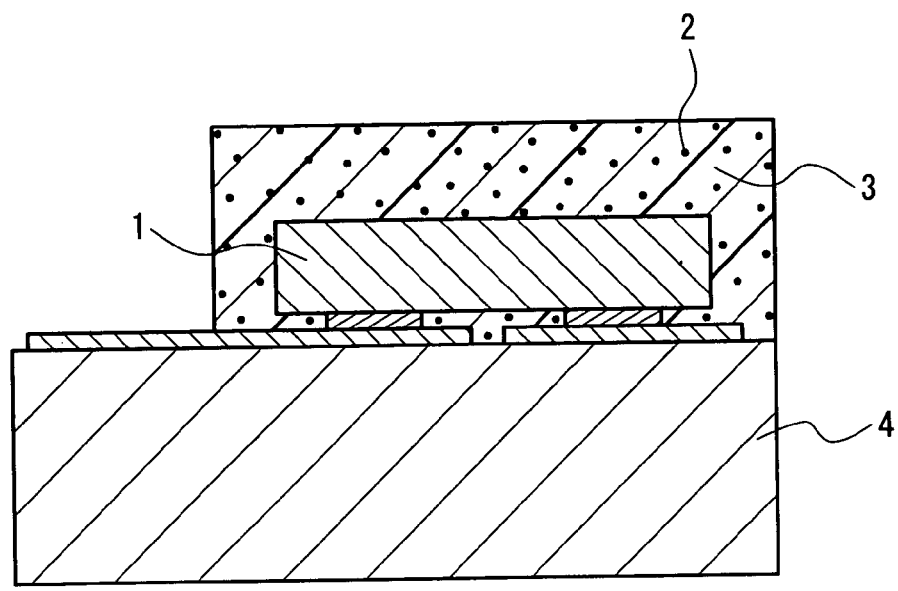
FIG. 1 is a cross-sectional view of a semiconductor light-emitting element of an embodiment of the present invention.

The inorganic oxide of the present invention can be a phosphor or a phosphor host, and if it contains ions that can be the center of luminescence, the inorganic oxide of the present invention can become a phosphor that emits fluorescent light.

A first inorganic oxide of the present invention can be a phosphor expressed by a general formula $vLn_2O_3 \cdot wMO \cdot xR_2O_3 \cdot yQO_2$, where Ln is a rare earth element, M is at least one of Mg, Ca, Sr, and Ba, R is at least one of B, Al, Ga, Ln, and Tl, Q is at least one of Si, Ge, Sn, and Pb, and v=1, w=1, x=2, and y=1.

A second inorganic oxide of the present invention can be a phosphor expressed by a general formula $vLn_2O_3 \cdot wMO \cdot xR_2O_3 \cdot yQO_2$, where Ln is a rare earth element, M is at least one of Mg, Ca, Sr, Ba and Zn, R is at least one of B, Al, Ga, Ln, and Tl, Q is at least one of Si, Ge, Sn, and Pb, and v, w, x and y are values satisfying $1<v \leq 1.49$, $0.02 \leq w < 1$, $2 < x \leq 2.49$, $0.02 \leq y < 1$, $x-v=1$, $w=y$, and $3v+w+3x+2y=12$.

A third inorganic oxide of the present invention is a solid solution, so that its crystal structure is chemically stable. In addition, the third inorganic oxide has no crystals having different phases, so that it is an inorganic oxide having chemically stable properties.

In the above-described inorganic oxides, the value range of x preferably is $0 < x \leq 0.9$, more preferably $0 < x \leq 0.7$, and most preferably $0 < x \leq 0.5$. In these ranges, the maximum firing temperature is reduced, so that an inorganic oxide can be produced in a relatively low temperature.

In the inorganic oxides of the present invention, Ln may be at least one rare earth element selected from Sc, Y, La, and Gd, Q is at least one element of Si and Ge, and R is at least one of B, Al, and Ga. With this composition, not only can the inorganic oxide serve as a phosphor host of a high efficiency phosphor or the phosphor itself, but also inexpensive inorganic oxide materials are available, and the inorganic oxide can become a phosphor that does not contain a heavy metal such as Pb or Tl. Therefore, not only can a low cost be achieved, but also it is easy to produce the phosphor and to manage or dispose of the materials.

In the above-described inorganic oxides, it is preferable that the majority of Ln is made up of Y. Herein, "the majority of Ln is made up of Y" means that the majority of the groups of atoms constituting Ln is made up of Y atoms. That is, "the majority of Ln is made up of Y" means that >50% of number of Ln atoms are Y atoms. With this composition, the inorganic oxide can serve as a phosphor host of a higher efficiency phosphor or the phosphor itself. Furthermore, it is possible to select a larger number of elements constituting M, Q, and R, so that a large number of kinds of inorganic oxides can be provided.

In the above-described inorganic oxides, it is preferable that the majority of Q is made up of Si. With this composition, the inorganic oxide can serve as a phosphor host of an even higher efficiency phosphor or the phosphor itself.

In the above-described inorganic oxides, it is preferable that the majority of R is made up of at least one of Al and Ga, and it is more preferable that the majority of R is made up of Al. With this composition, not only can the inorganic oxide be produced easily, but also it can serve as a phosphor host of an even higher efficiency phosphor or the phosphor itself.

It is preferable that the inorganic oxide has the crystal structure of garnet. With such a crystal structure, the inorganic oxide can serve as a phosphor host of a phosphor that can emit light having a higher intensity or the phosphor itself.

It is preferable that the above-described inorganic oxide has at least one rare earth element selected from the group consisting of Ce, Pr, Nd, Sm, Eu, Gd, Tb, Dy, Ho, Er, Tm, Yb, and Lu, more preferably, the group consisting of Ce, Pr, Eu, and Tb. The above rare earth elements are elements that can form a luminescent center ion. In particular, Ce, Pr, Eu, and Tb can form a luminescent center ion that emits high intensity-luminescence of a luminescent color that is suitable for light-emitting devices, so that this inorganic oxide itself can be a phosphor that is preferable for light-emitting devices.

Next, since the phosphor of the present invention can serve as a phosphor host of a phosphor that can emit light having a higher intensity or the phosphor itself, if the phosphor contains any ion that can be the luminescent center, it becomes a highly efficient phosphor.

As described above, in the inorganic oxide of the present invention, the inorganic oxide itself not only can become a phosphor, but also is a novel material as a phosphor. Therefore, with this embodiment, a totally novel phosphor can be provided.

In either one of the above-described phosphors, it is preferable that the phosphor contains at least one of $Ce^{3+}$ ions, $Pr^{3+}$ ions, $Eu^{3+}$ ions, and Tb3+ ions. The $Ce^{3+}$ ions can emit ultraviolet to deep red light. The $Pr^{3+}$ ions can emit light containing at least one emitted light component of blue and red. The $Eu^{3+}$ ions can emit red light, and Tb3+ ions can emit green light. Therefore, with this embodiment, the phosphor emits fluorescent light of a color for which there is a great demand for light-emitting devices (either one of ultraviolet, blue, green, yellow and red).

It is preferable that the phosphor contains at least $Ce^{3+}$ ions as the luminescent center. By doing this, the phosphor can be a highly efficient phosphor that is excited with blue light and emits yellowish light. Therefore, the phosphor is suitable for light-emitting devices (e.g., white LED or illumination devices) in which a blue LED and a yellowish phosphor are combined.

It is preferable that the phosphor containing the $Ce^{3+}$ ions also contains $Pr^{3+}$ ions as the luminescent center. The $Pr^{3+}$ ions are luminescent centers that can absorb blue light and emit a red light-emitting component, and the $Ce^{3+}$ ions allow sensitized luminescence. Therefore, by doing this, the phosphor becomes blue light exciting yellow light-emitting phosphor containing a large amount of a red light-emitting component, which is required especially for illumination use.

The phosphor is a highly efficient phosphor and can be a highly efficient phosphor whose properties are similar to those of the conventional phosphor having the inorganic oxide expressed by the chemical formula $Ln_3R_5O_{12}$ as the phosphor host. A $Ce^{3+}$ ion activated phosphor can emit ultraviolet to deep red light. A $Eu^{3+}$ ion activated phosphor can emit red light, and a $Tb^{3+}$ ion activated phosphor can emit green light. Therefore, such phosphors can be used widely for light-emitting devices. In particular, a phosphor having the garnet structure can be applied widely to conventional light-emitting devices that can be constituted by a phosphor having the conventional inorganic oxide expressed by the chemical formula $Ln_3R_5O_{12}$ as the phosphor host. Therefore, the light-emitting devices constituted thereby can have a luminescent performance as high as that of the conventional light-emitting device. In other words, a light-emitting device using the phosphor of the present invention for a light-emitting layer or a wavelength conversion layer can be obtained.

In a preferable embodiment of the light-emitting device, a light-emitting element having a luminescent peak in a wavelength region of 405 nm or more and 515 nm or less, and any of the above-described phosphors can be combined so that the phosphor covers the light-emitting element. This phosphor has an excitation band in a blue wavelength region of 405 nm or more and 515 nm or less, and is a high efficiency phosphor having a yellowish light-emitting component and also can contain a red light-emitting component in relatively a large content. Therefore, by doing this, a high light output light-emitting device can be formed that emits whitish light by a mixture of bluish light having a luminescent peak in a wavelength region of 405 nm or more and 515 nm or less that is emitted by the light-emitting element, and yellow-green, yellow or orange light.

In the above-described light-emitting device, it is preferable that the light-emitting element is either one of a light-emitting diode or a laser diode (including a plane emission laser diode). Such a light-emitting element emits a high output bluish light, so that the light-emitting device can emit a higher output whitish light.

The present invention is carried out by finding the following five experimental facts through the synthesis experiments of inorganic oxides.

(1) A novel inorganic oxide expressed by the chemical formula I was obtained.
(2) An inorganic oxide expressed by the general formula III, which is a solid solution of the novel inorganic oxide expressed by the chemical formula I and the conventional inorganic oxide expressed by the chemical formula II was obtained.
(3) Both the novel inorganic oxide expressed by the chemical formula I and the inorganic oxide expressed by the general formula III can serve sufficiently as a phosphor host of a phosphor or a phosphor itself.
(4) Both the novel inorganic oxide expressed by the chemical formula I to which $Ce^{3+}$ ions are doped as the luminescent center and the inorganic oxide expressed by the general formula III can be a blue light-excitable phosphor.
(5) The blue light-excitable phosphor can be a phosphor that emits a high efficient yellowish light that is comparable to the YAG:Ce host phosphor under blue light excitation conditions by defining the composition.

The present invention can provide a novel inorganic oxide expressed by the chemical formula $MLn_2QR_4O_{12}$ or the general formula $(1-x)MLn_2QR_4O_{12} \cdot xLn_3R_5O_{12}$, a novel phosphor having the novel inorganic oxide as the phosphor host or a phosphor itself, in particular, a blue light-exciting yellow light-emitting phosphor that has similar properties to the conventional YAG:Ce host phosphor. At the same time, the present invention also can provide a light-emitting device that emits a high output whitish light that is comparable to the conventional light-emitting device constituted by using the YAG:Ce host phosphor, in particular, a light-emitting device that emits whitish light. Thus, the present invention is highly useful.

Embodiment 1

Hereinafter, the inorganic oxides and the phosphors of the present invention will be described as Embodiment 1 of the present invention.

One embodiment of the inorganic oxides that can be a phosphor or a phosphor host of the present invention is expressed by a chemical formula I below and preferably has the crystal structure of garnet.

$MLn_2QR_4O_{12}$ (I)

where in the chemical formula I, M is at least one element selected from the group consisting of Mg, Ca, Sr, and Ba; Ln is at least one rare earth element selected from the group consisting of Sc, Y, La, Ce, Pr, Nd, Sm, Eu, Gd, Tb, Dy, Ho, Er, Tm, Yb, and Lu, and preferably Sc, Y, La, and Gd; Q is at least one element selected from the group consisting of Si, Ge, Sn, and Pb, and preferably Si and Ge; and R is at least one element selected from the group consisting of B, Al, Ga, In, and Tl, preferably Al and Ga.

In the crystal structure, a part of M can be substituted with at least one element (e.g., Zn) selected from the group consisting of elements that can become bivalent ions, other than Mg, Ca, Sr, and Ba. Similarly, it is possible that a part of Ln can be substituted with at least one element (e.g., In) selected from the group consisting of elements that can become trivalent ions, other than the above rare earth elements. A part of Q can be substituted with at least one element (e.g., Ti) selected from the group consisting of elements that can become tetravalent ions, other than Si, Ge, Sn, and Pb. In addition, a part of R can be substituted with at least one element (e.g., Sc) selected from the group consisting of elements that can become trivalent ions, other than B, Al, Ga, In, and Tl.

There is no particular limitation regarding the inorganic oxides of the present invention, as long as they are the inorganic oxides expressed by the chemical formula I, other than $CaY_2SnFe_4O_{12}$.

In the inorganic oxides expressed by the chemical formula I of the present invention, the ratio (the number of atoms of the alkaline-earth metal element/the number of atoms of the rare earth element) of the alkaline-earth metal element (M) to the rare earth element (Ln) is 0.5.

Another embodiment of the inorganic oxides that can be a phosphor or a phosphor host of the present invention is expressed by a general formula III below and preferably has the crystal structure of garnet.

$xMLn_2QR_4O_{12} \cdot (1-x)Ln_3R_5O_{12}$ (III)

where M, Ln, Q and R in the general formula III are the same as those in the chemical formula I, and x is a value satisfying $0 < x \leq 0.98$.

The inorganic oxide expressed by the general formula III is a solid solution of the inorganic oxide expressed by the chemical formula I and an inorganic oxide expressed by the chemical formula II that has been conventionally known.

$Ln_3R_5O_{12}$ (II)

where Ln and R in the chemical formula II are the same as those in the chemical formula I.

In the inorganic oxides expressed by the general formula III of the present invention, the ratio (the number of atoms of the alkaline-earth metal element/the number of atoms of the rare earth element) of the alkaline-earth metal element (M) to the rare earth element (Ln) is 0 to 0.5.

The inorganic oxide expressed by the chemical formula I of the present invention and the inorganic oxide expressed by the general formula III can be a phosphor or a phosphor host, and if they contain ions that can be the luminescent center, they emit fluorescent light.

Furthermore, the inorganic oxides of the present invention have insulating properties and dielectric properties, so that they can be applied to an insulator or a dielectric. In addition, since they are inorganic oxides, they can be formed into a ceramic product such as a ceramic member.

An inorganic oxide expressed by the chemical formula I having a crystal structure different from the garget structure, such as a perovskite structure, has been confirmed to exist. Therefore, it is inferred that there is an inorganic oxide expressed by the general formula III having a crystal structure different from the garget structure.

The inorganic oxide expressed by the chemical formula I and the inorganic oxide expressed by the general formula III of the present invention can be produced, for example, by classical solid phase reaction that conventionally has been used as a synthetic method of inorganic oxides. Hereinafter, this method will be described below. The inorganic oxide and the phosphor of the present invention are not limited to those produced by the following method.

As the material constituting M, for example, oxides, hydroxides, carbonates, oxalates, or nitrates of an alkaline-earth metal (at least one element selected from the group consisting of Mg, Ca, Sr, and Ba) are used. As the material constituting Ln, for example, oxides, hydroxides, carbonates, oxalates, or nitrates of a rare earth element (at least one element selected from the group consisting of Sc, Y, La, Ce, Pr, Nd, Sm, Eu, Gd, Tb, Dy, Ho, Er, Tm, Yb, and Lu) are used. As the material constituting Q, for example, oxides of an element of the IVb group (at least one element selected from the group consisting of Si, Ge, Sn, and Pb) except for C (carbon) are used. As the material constituting R, for example, oxides, hydroxides, or nitrates of an element of the IIIb group (at least one element selected from the group consisting of B, Al, Ga, In, and Tl) are used.

As the material constituting M, compounds containing elements that can become bivalent ions other than those described above, such as Zn, Cd, or Fe, can be used. Similarly, as the material constituting Ln, compounds containing elements that can become trivalent ions other than those described above, such as In or Bi can be used. As the material constituting Q, compounds containing elements that can become tetravalent ions other than those described above, such as Ti, Zr, Ru or Hf can be used. Furthermore, as the material constituting R, compounds containing elements that can become trivalent ions other than those described above, such as Sc, V, Ru or In can be used.

A mixture of the above-described materials that are mixed in a predetermined element ratio (M:Ln:Q:R=1:2:1:4) or a ratio close to this ratio are fired in a predetermined atmosphere (in the air, in a vacuum, in an inert gas, a reducing atmosphere or the like). The firing can be performed in several times in a separated manner. The firing temperature and the firing time are set to the temperature and the time in which the inorganic oxide expressed by the chemical formula I having a single crystal phase or a substantially single crystal phase can be formed (e.g., 1200 to 1600° C., 0.5 to 100 hours). In order to increase the reactivity of the materials, a small amount of a reaction accelerator (flux) may be doped. Examples of the compounds that are effective as the flux include various fluorides, chlorides, and boron compounds. The compound used as the flux can be doped in an amount of, for example, about 0.003 to 30 mol % per mol of the phosphor.

The inorganic oxides expressed by the chemical formula I and the general formula III that can be obtained in the above-described manner can be an inorganic oxide serving a phosphor itself or a phosphor host, and if they contain a small amount of ions that can be the luminescent center (e.g., $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Mn^{2+}$, $Pb^{2+}$, etc.), they become phosphors that emit fluorescent light. The ions that can be the luminescent center are not limited to those described above. For example, it is possible that many ions can be contained as described in the non-patent reference 1.

As the material to which ions that can be the luminescent center is doped, for example, various rare earth compounds, in particular, Ce, Pr, Sm, Eu or Tb compounds (oxides, carbonates, nitrates, chlorides, fluorides or the like), various transition metal compounds, in particular, Mn compounds (oxides, carbonates, nitrates, chlorides, fluorides or the like) are used. Metal rare earths or metal Mn also can be used.

The luminescent center is doped by substituting a part of either element of M, Ln, Q or R, or they can be doped between the lattices of the phosphor host. The luminescent center is doped in an amount substituted for either one of M, Ln, Q and R of, for example, 0.01 to 30 at %, and preferably 0.03 to 10 at %. In other words, n/(n+m)=0.0001 to 0.3, preferably 0.0003 to 0.1, where n= the number of the atoms of the element forming the luminescent center, and m is the total number of the atoms of the group of elements constituting either one of M, Ln, Q and R. When the amount of the luminescent center doped is small, the amount of the luminescent center that contributes to luminescence is small, so that the intensity of the emitted light is small. On the other hand, when the amount of the luminescent center doped is large, the concentration quenching mechanism due to the interaction of the luminescent center or the like decreases the intensity of the emitted light.

Hereinafter, the composition of the inorganic oxide that is preferable as a phosphor host will be described.

A preferable composition as a phosphor host is such that Ln is at least one rare earth element selected from the group consisting of Sc, Y, La, and Gd, more preferably at least one rare earth element selected from the group consisting of Y and Gd. In particular, a composition in which the majority of Ln is made up of Y or a composition in which Ln is substantially made up of Y are preferable, and a phosphor host of a high efficiency phosphor can be obtained relatively easily.

As the Q, a composition containing Si is preferable in terms of the crystallinity, and a composition in which the majority of Q is made up of Si, in particular a composition in which 80 at % or more of Q is made up of Si, is preferable in terms of the luminescent performance. A composition in which Q is substantially made up of Si is preferable because the composition can be a phosphor host of a $Ce^{3+}$ activated yellowish light-emitting phosphor having a high luminescent efficiency under blue light excitation. Herein, "yellowish" refers to a color containing a yellow component such as yellow-green, yellow, and orange.

As the R, a composition containing at least Al or Ga, in particular, a composition in which the majority of R is made up of at least Al or Ga is preferable in terms of the crystallinity. A composition in which 50 at % or more, preferably 80 at % or more of R, is made up of Al is preferable in terms of the luminescence performance. A composition in which R is substantially made up of Al is preferable because the composition can be a phosphor host of a $Ce^{3+}$ activated yellowish light-emitting phosphor having a high luminescent efficiency under blue light excitation.

As the M, a composition containing at least Ba or Mg is preferable in terms of the crystallinity. A composition in which 50 at % or more, preferably 80 at % or more of M is made up of Ba is preferable in terms of the luminescent performance. A composition in which M is substantially made up of Ba is preferable because the composition can be a phosphor host of a $Ce^{3+}$ activated phosphor having a high luminescent efficiency under blue light excitation. At least in the inorganic oxide as the phosphor host of the $Ce^{3+}$ activated phosphor, if the composition has a large content of Mg, yellowish fluorescent light having a large content of a red light-emitting component can be obtained, and this is preferable as a white LED in terms of the luminescent color.

The value of x in the inorganic oxide expressed by the general formula III that seems to be a solid solution is $0<x\leq0.98$, preferably $0<x\leq0.95$, more preferably $0<x\leq0.9$, even more preferably $0<x\leq0.7$, and most preferably $0<x\leq0.5$. A composition having a value of x closer to 0 is more preferable because it can be produced in a lower firing temperature. On the other hand, a composition having a larger value as x can provide a more preferable phosphor or phosphor host. In other words, an inorganic oxide containing the luminescent center becomes a high efficient phosphor.

Table 1 shows the relationship between the typical values of x and the total number of the atoms constituting each of Ln, R, M and Q. The values in Table 1 are normalized by taking the total number of the atoms constituting Ln as 3.

TABLE 1

| | ratio of total number of atoms constituting each of Ln, R, M and Q (the number of atoms) | | | |
|---|---|---|---|---|
| x | Ln | R | M | Q |
| 1.00 | 3.000 | 5.000 | 0.000 | 0.000 |
| 0.98 | 3.000 | 5.013 | 0.020 | 0.020 |
| 0.95 | 3.000 | 5.034 | 0.051 | 0.051 |
| 0.90 | 3.000 | 5.069 | 0.103 | 0.103 |
| 0.70 | 3.000 | 5.222 | 0.333 | 0.333 |
| 0.50 | 3.000 | 5.400 | 0.600 | 0.600 |
| 0.30 | 3.000 | 5.609 | 0.913 | 0.913 |
| 0.10 | 3.000 | 5.857 | 1.286 | 1.286 |
| 0.00 | 3.000 | 6.000 | 1.500 | 1.500 |

Table 1 shows the following:

(1) The inorganic oxide expressed by the general formula III having x=0.98 contains the constituent element R in an excess of an amount corresponding to 1.3 at % (0.013 atoms) per mol of the conventional inorganic oxide expressed by $Ln_3R_5O_{12}$ and further contains each of the constituent elements M and Q in an amount corresponding to 2.0 at %.

(2) The inorganic oxide expressed by the general formula III having x=0.95 contains the constituent element R in an excess of an amount corresponding to 3.4 at % per mol of the conventional inorganic oxide expressed by $Ln_3R_5O_{12}$ and further contains each of the constituent elements M and Q in an amount corresponding to 5.1 at %.

(3) The inorganic oxide expressed by the general formula III having x=0.9 contains the constituent element R in an excess of an amount corresponding to 6.9 at % per mol of the conventional inorganic oxide expressed by $Ln_3R_5O_{12}$ and further contains each of the constituent elements M and Q in an amount corresponding to 10.3 at %.

(4) The inorganic oxide expressed by the general formula III having x=0.7 contains the constituent element R in an excess of an amount corresponding to 22.2 at % per mol of the conventional inorganic oxide expressed by $Ln_3R_5O_{12}$ and further contains each of the constituent elements M and Q in an amount corresponding to 33.3 at %.

(5) The inorganic oxide expressed by the general formula III having x=0.5 contains the constituent element R in an excess of an amount corresponding to 40 at % per mol of the conventional inorganic oxide expressed by $Ln_3R_5O_{12}$ and further contains each of the constituent elements M and Q in an amount corresponding to 60 at %.

(6) The inorganic oxide expressed by the general formula III having x=0.3 contains the constituent element R in an excess of an amount corresponding to 60.9 at % per mol of the conventional inorganic oxide expressed by $Ln_3R_5O_{12}$ and further contains each of the constituent elements M and Q in an amount corresponding to 91.3 at %.

(7) The inorganic oxide expressed by the general formula III having x=0.1 contains the constituent element R in an excess of an amount corresponding to 85.7 at % per mol of the conventional inorganic oxide expressed by $Ln_3R_5O_{12}$ and further contains each of the constituent elements M and Q in an amount corresponding to 128.6 at %.

(8) The inorganic oxide expressed by the general formula III having x=0 contains the constituent element R in an excess of an amount corresponding to 100 at % per mol of the conventional inorganic oxide expressed by $Ln_3R_5O_{12}$ and further contains each of the constituent elements M and Q in an amount corresponding to 150.0 at %.

(9) As described in the patent reference 3, a composition in which only either one of the constituent elements M and Q or both the constituent elements M and Q are contained in the conventional inorganic oxide expressed by $Ln_3R_5O_{12}$ does not provide the inorganic oxide of the present invention in terms of the composition. The composition should contain further the constituent element R in an excessive amount.

The inorganic oxides of the present invention (the inorganic oxides expressed by the chemical formulae I and the general formula III) can serve either as a phosphor host of a phosphor that emits a relatively high efficiency fluorescent light at least under excitation conditions with electromagnetic waves (ultraviolet rays, near ultraviolet rays, blue light and the like) at a wavelength in the range of 250 to 515 nm or as the phosphor itself.

A preferable luminescent center ion is any of $Ce^{3+}$, $Pr^{3+}$, $Eu^{3+}$, and $Tb^{3+}$, and the inorganic oxide containing at least one of $Ce^{3+}$ ions, $Pr^{3+}$ ions, $Eu^{3+}$ ions, and $Tb^{3+}$ ions can be a highly efficient phosphor that emits ultraviolet to red light, in particular green to red light, having good color purity, which is said to be useful for a light-emitting device.

In the inorganic oxides (the inorganic oxides expressed by the chemical formula I and the general formula III) containing a small amount of at least one rare earth element selected from the group consisting of Ce, Pr, Nd, Sm, Eu, Gd, Tb, Dy, Ho, Er, Tm, Yb, and Lu, the rare earth element can form luminescent centers, as described, for example, in the non patent reference 1. Therefore, the inorganic oxide itself can be a phosphor without intentionally adding a luminescent center ion.

In other words, the phosphor of the present invention may have the inorganic oxide (the inorganic oxides expressed by the chemical formula I or the general formula III) as the phosphor host, or may contain as an active component the inorganic oxide containing at least one rare earth element selected from the group consisting of Ce, Pr, Nd, Sm, Eu, Gd, Tb, Dy, Ho, Er, Tm, Yb, and Lu, in particular, Ce, Pr, Eu, and Tb, for example, in a small amount. Herein, the "active component" refers to a component contained in a ratio of 50 mol % or more.

Regarding the crystal structure, the garnet structure is preferable because the inorganic oxide can be a phosphor host of a high efficiency phosphor or the phosphor itself, but basically the present invention is not limited thereto.

$Ce^{3+}$ ions are preferable as luminescent centers for a phosphor for light-emitting devices (e.g., the while LED as described above) in which a blue light-emitting element is combined. If the $Ce^{3+}$ ions are contained in a small amount, the inorganic oxide can be a phosphor that emits yellowish light such as yellow-green or yellow light by the excitation of blue light of 405 nm or more and 515 nm or less. Therefore, a phosphor that can provide a novel light-emitting device having a luminescent performance comparable to that of the conventional light-emitting device using the YAG:Ce host phosphor by combining a blue LED, using the blue LED as the excitation source.

Furthermore, if $Pr^{3+}$ ions are co-doped as the luminescent center to the inorganic oxide to which $Ce^{3+}$ ions have been doped, red light can be doped and a phosphor containing a large ratio of a red light-emitting component can be provided, as in the case of the YAG:Ce host phosphor.

This is because the $Pr^{3+}$ ions emit bright-line light in a red region in the vicinity of a wavelength of 610 nm under the excitation of blue light.

It is preferable that the amount of the $Pr^{3+}$ ions that are co-doped as the luminescent center is smaller than that of the $Ce^{3+}$ ions doped. Regarding the substitution amount as described above, for example, the substitution amount of the Pr atoms is 0.01 to 1 at % with respect to a substitution amount of the Ce atoms of 0.1 to 10 at %. This resulted from a problem inherent to the $Pr^{3+}$ ions. The $Pr^{3+}$ ions have a large concentration quenching, and if the amount of the substituent is larger than the range as described above, the luminescent intensity is reduced significantly.

Examples of preferable phosphors of the present invention include $MgY_2SiAl_4O_{12}:Ce^{3+}$, $(Ba, Mg)Y_2SiAl_4O_{12}:Ce^{3+}$, $BaY_2SiAl_4O_{12}:Ce^{3+}, Pr^{3+}$, $0.3MgY_2SiAl_4O_{12} \cdot 0.7Y_3Al_5O_{12}:Ce^{3+}$ (which are phosphors emitting yellowish light), $BaY_2SiAl_4O_{12}:Ce^{3+}$, $0.3BaY_2SiAl_4O_{12} \cdot 0.7Y_3Al_5O_{12}:Ce^{3+}$, $SrY_2SiAl_4O_{12}:Ce^{3+}$, $BaY_2Si(Al, Ga)_4O_{12}:Ce^{3+}$, $BaY_2SiAl_4O_{12}:Tb^{3+}$ (which are phosphors emitting yellow-greenish or greenish light), and $BaY_2SiAl_4O_{12}:Eu^{3+}$ (which are phosphors emitting redish light).

In other words, examples of preferable inorganic oxides of the present invention include $Mg(Y, Ce)_2SiAl_4O_{12}$, $(Ba, Mg)(Y, Ce)_2SiAl_4O_{12}$, $Ba(Y, Ce, Pr)_2SiAl_4O_{12}$, $0.3(Mg(Y, Ce)_2SiAl_4O_{12} \cdot 0.7((Y, Ce)_3Al_5O_{12})$, $Ba(Y, Ce)_2SiAl_4O_{12}$, $0.7(Ba(Y, Ce)_2SiAl_4O_{12}) \cdot 0.3((Y, Ce)_3Al_5O_{12})$, $Sr(Y, Ce)_2SiAl_4O_{12}$, $Ba(Y, Ce)_2Si(Al, Ga)_4O_{12}$, $Ba(Y, Tb)_2SiAl_4O_{12}$, and $Ba(Y, Eu)_2SiAl_4O_{12}$.

Such a phosphor (inorganic oxide) has the crystal structure of garnet that is the same as the conventional phosphor having the $Y_3Al_5O_{12}$ compound as the phosphor host and is a high efficiency phosphor whose light-emitting characteristics are similar to those of the conventional phosphor. As the phosphors having the $Y_3Al_5O_{12}$ compound as the phosphor host, $Y_3Al_5O_{12}:Ce^{3+}$, (yellow-green phosphors for flying-spot tubes or high pressure mercury lamps), $(Y, Gd)_3Al_5O_{12}:Ce^{3+}$ and $Y_3Al_5O_{12}:Ce^{3+}, Pr^{3+}$ (yellow phosphors for white LED), $Y_3Al_5O_{12}:Eu^{3+}$, (red phosphors that have been examined for electron beam tubes and plasma display panels), $Y_3Al_5O_{12}:Tb^{3+}$ (green phosphors for flying-spot tubes, projection tubes, or high pressure mercury lamps), $Y_3Al_5O_{12}:Nd^{3+}$ (phosphors for infrared laser) have been conventionally known. Therefore, the phosphor of the present invention can be used as a light-emitting layer or a wavelength converting layer as a substitute of the conventional phosphors having these $Y_3Al_5O_{12}$ compounds as the phosphor host for the above-mentioned light-emitting devices (electron beam tubes, high pressure mercury lamps, plasma display panels, white LED and the like).

The phosphor having a yellowish light-emitting component of the present invention (phosphor containing at least $Ce^{3+}$ ions as the luminescent center of the phosphors that emit yellowish light or the phosphors that emit yellow-greenish light) is particularly preferable as a phosphor for light-emitting devices (white LED or illumination devices) in which a light-emitting element (blue LED or blue laser diodes) having a luminescent peak in a wavelength region of 405 nm or more and 515 nm or less and the phosphor having a yellowish light-emitting component are combined. In other words, the light-emitting device using the phosphor of the present invention as the substitute of the yellow light-emitting YAG:Ce host phosphor can be a light-emitting device having a luminescent performance as high as that of the conventional light-emitting device using the YAG:Ce host phosphor.

Some of the inorganic oxides and the phosphors of the present invention have a crystal structure different from the garnet structure, as described in the examples. Examples thereof include $BaY_2SiB_4O_{12}$, $Ba(Y, Ce)_2SiB_4O_{12}$, $Ba(Y, Eu)_2SiB_4O_{12}$, $Ba(Y, Tb)_2SiB_4O_{12}$, $Sr(Gd, Ce)_2SiB_4O_{12}$, $Sr(Gd, Eu)_2SiB_4O_{12}$, $Sr(Gd, Tb)_2SiB_4O_{12}$, $Sr(Gd, Pr)_2SiB_4O_{12}$, $Sr(Gd, Ce)_2SiAl_4O_{12}$, $Sr(Gd, Eu)_2SiAl_{4O12}$, $Sr(Gd, Tb)_2SiAl_4O_{12}$, and $Sr(Gd, Pr)_2SiAl_4O_{12}$. Among these, $Ba(Y, Eu)_2SiB_4O_{12}$, $Ba(Y, Tb)_2SiB_4O_{12}$, $Sr(Gd, Eu)_2SiB_4O_{12}$, $Sr(Gd, Tb)_2SiB_4O_{12}$, $Sr(Gd, Pr)_2SiB_4O_{12}$, $Sr(Gd, Eu)_2SiAl_4O_{12}$, $Sr(Gd, Tb)_2SiAl_4O_{12}$, and $Sr(Gd, Pr)_2SiAl_4O_{12}$ are preferable as a phosphor, because they exhibit a fluorescent activity.

Embodiment 2

Figure 2:
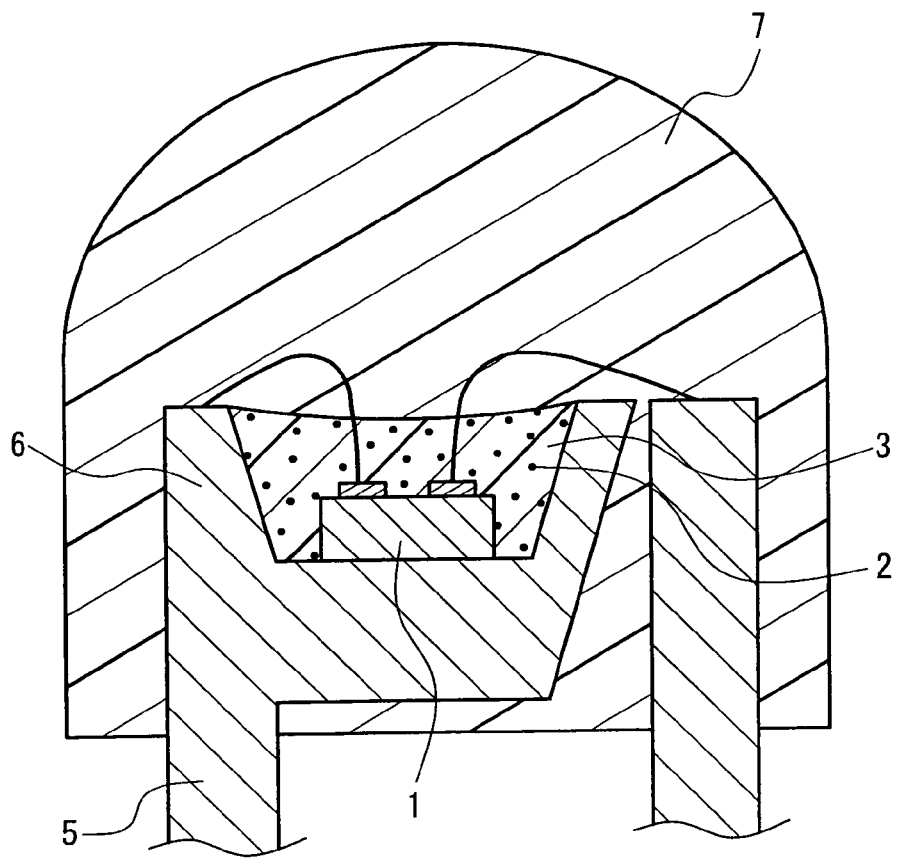
FIG. 2 is a cross-sectional view of a semiconductor light-emitting element of another embodiment of the present invention.
Figure 3:
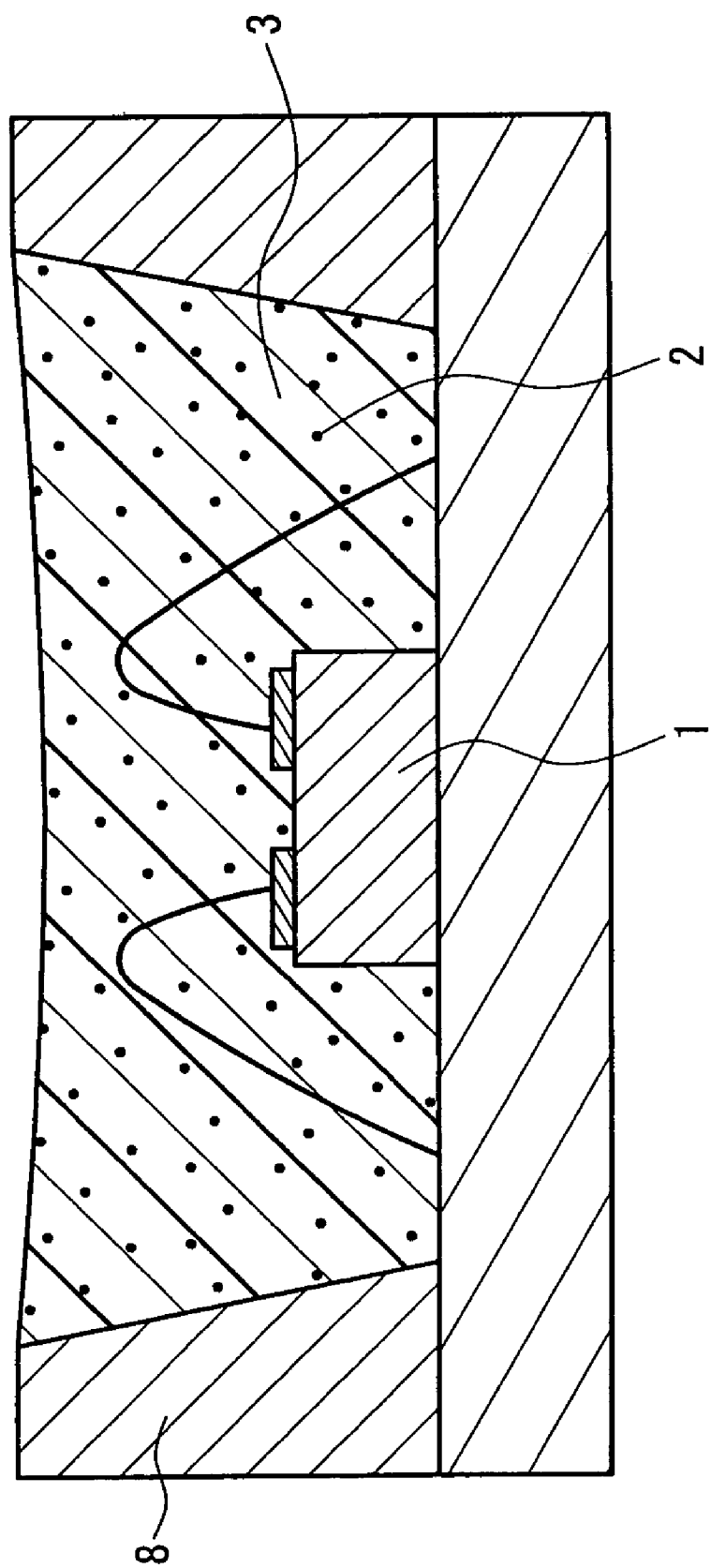
FIG. 3 is a cross-sectional view of a semiconductor light-emitting element of yet another embodiment of the present invention.

FIGS. 1 to 3 are longitudinal sectional views of semiconductor light-emitting elements as examples of the light-emitting element of the present invention. FIG. 1 shows a typical example of a semiconductor light-emitting element having a structure in which a light-emitting element 1 is conductively mounted on a sub-mount element 4, and the light-emitting element 1 is sealed with a resin package that contains at least the phosphor 2 of the present invention as described above (hereinafter, referred to as the phosphor 2 of the present invention) and also serves as a phosphor layer 3.

FIG. 2 shows a semiconductor light-emitting element having a structure in which a light-emitting element 1 is conductively mounted on a cup 6 provided in a mount lead of a lead frame 5, a phosphor layer 3 formed of a resin containing at least the phosphor 2 of the present invention is provided in the cup 6, and the whole is sealed with a sealing resin 7.

FIG. 3 shows a semiconductor light-emitting element of a chip type having a structure in which a light-emitting element 1 is provided in a housing 8, and a phosphor layer 3 formed of a resin containing at least the phosphor 2 of the present invention is provided in the housing 8.

In FIGS. 1 to 3, the light-emitting elements 1 may be photoelectric transducers that convert electric energy to light, and specific examples thereof include a light-emitting diode, a laser diode, a plane emission laser diode, an inorganic electroluminescent device, and an inorganic electroluminescent device, but a preferable example is a light-emitting diode or a laser diode, in particular, a plane emission laser diode, because the high output and the long lifetime of the semiconductor light-emitting element can be achieved. Basically, there is no particular limitation regarding the wavelength of the light emitted by the light-emitting element 1, and any wavelength can be used, as long as it excites the phosphor 2 of the present invention.

The phosphor having at least $Ce^{3+}$ as the luminescent center of the present invention can convert bluish exciting light to yellowish light with a high efficiency, and therefore this phosphor is preferable for the conventional white semiconductor light-emitting element that is obtained by combining a blue LED and a yellow phosphor and emits whitish light. For the purpose of producing such a white semiconductor light-emitting element having a high performance, the light-emitting element 1 preferably has a luminescent peak in a wavelength region from 405 nm or more and 515 nm or less, preferably 430 nm or more and 490 nm or less, and more preferably 440 nm or more and 480 nm or less, and it is preferable to combine this light-emitting element and a phosphor having at least $Ce^{3+}$ as the luminescent center, preferably a phosphor further containing $Pr^{3+}$ ions co-doped as the luminescent center to produce a semiconductor light-emitting element.

In FIGS. 1 to 3, the phosphor layer 3 contains at least the phosphor 2 of the present invention, and can comprise a resin (not shown) such as an epoxy resin or a silicon resin containing 2 to 60 mass %, preferably 5 to 30 mass % of the phosphor 2 of the present invention.

The phosphor 2 of the present invention contained in the phosphor layer 3 can be a phototransformation material for absorbing a part of or the entire light emitted by the light-emitting element 1 and transforming the light into blue-green to orange light by allowing current through the light-emitting element 1. Therefore, with this structure, the phosphor 2 of the present invention is excited by the light-emitting element 1, and the semiconductor light-emitting element emits light including at least a light-emitting component emitted by the phosphor 2 of the present invention. Consequently, for example, when a light-emitting element emitting bluish light is used as the light-emitting element 1, and the phosphor 2 of the present invention is used as a phosphor emitting a yellowish light-emitting phosphor, bluish light emitted from the light-emitting element 1 and yellowish light emitted from the phosphor 2 of the present invention are mixed so that whitish light can be obtained, and thus a semiconductor light-emitting element emitting whitish light, for which there is a great demand, can be obtained.

The semiconductor light-emitting element of the present invention is constituted by the phosphor 2 of the present invention having the same luminescent characteristics comparable to those of the YAG:Ce host phosphor as described in Embodiment 1, and therefore has a larger light output than that of a semiconductor light-emitting element constituted by a phosphor other than the conventional YAG:Ce host phosphor. The same light output as that of a semiconductor light-emitting element constituted by the YAG:Ce host phosphor, which is desired, can be obtained.

Figure 4:
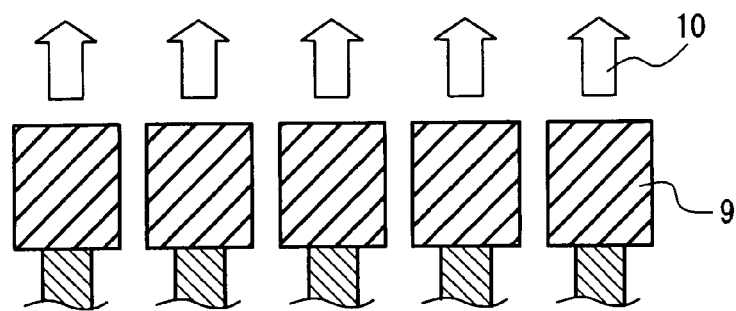
FIG. 4 is a schematic cross-sectional view of an illumination/display device of an embodiment of the present invention.
Figure 5:
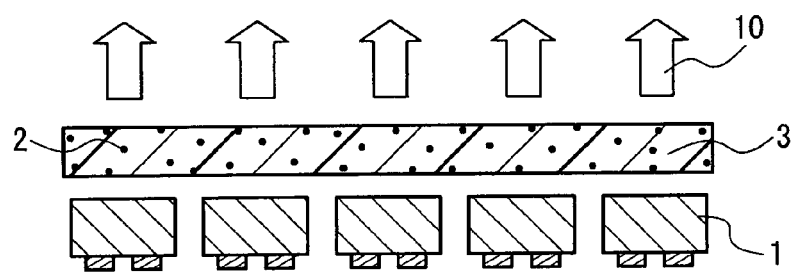
FIG. 5 is a schematic cross-sectional view of an illumination/display device of another embodiment of the present invention.

FIGS. 4 and 5 show schematic structures of illumination and display (illumination/display) device as examples of the light-emitting device of the present invention. FIG. 4 shows an illumination/display device comprising at least one semiconductor light-emitting element 9 as described above, and FIG. 5 shows an illumination/display device in which at least one light-emitting element 1 and the phosphor layer 3 containing at least the phosphor 2 of the present invention are combined. Reference numeral 10 denotes output light. The light-emitting element 1 and the phosphor layer 3 are the same as those of the above-described semiconductor light-emitting element and therefore will not be described further. The function and the effect of the illumination/display device having such a structure are the same as those of the above-described semiconductor light-emitting element and therefore will not be described further, either.

Figure 6:
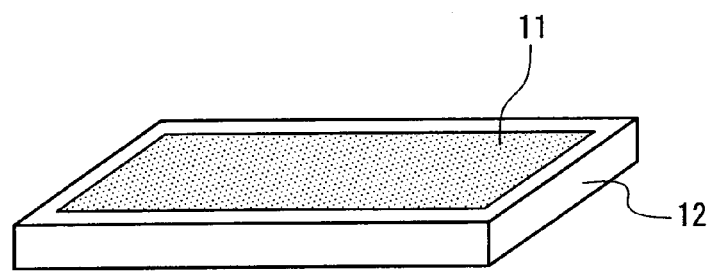
FIG. 6 is a perspective view showing an illumination device of an embodiment of the present invention.
Figure 7:
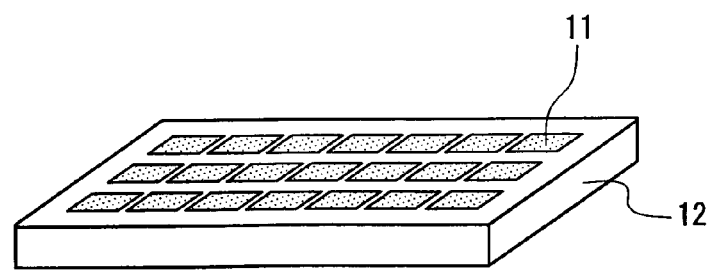
FIG. 7 is a perspective view showing an illumination device of another embodiment of the present invention.
Figure 8:
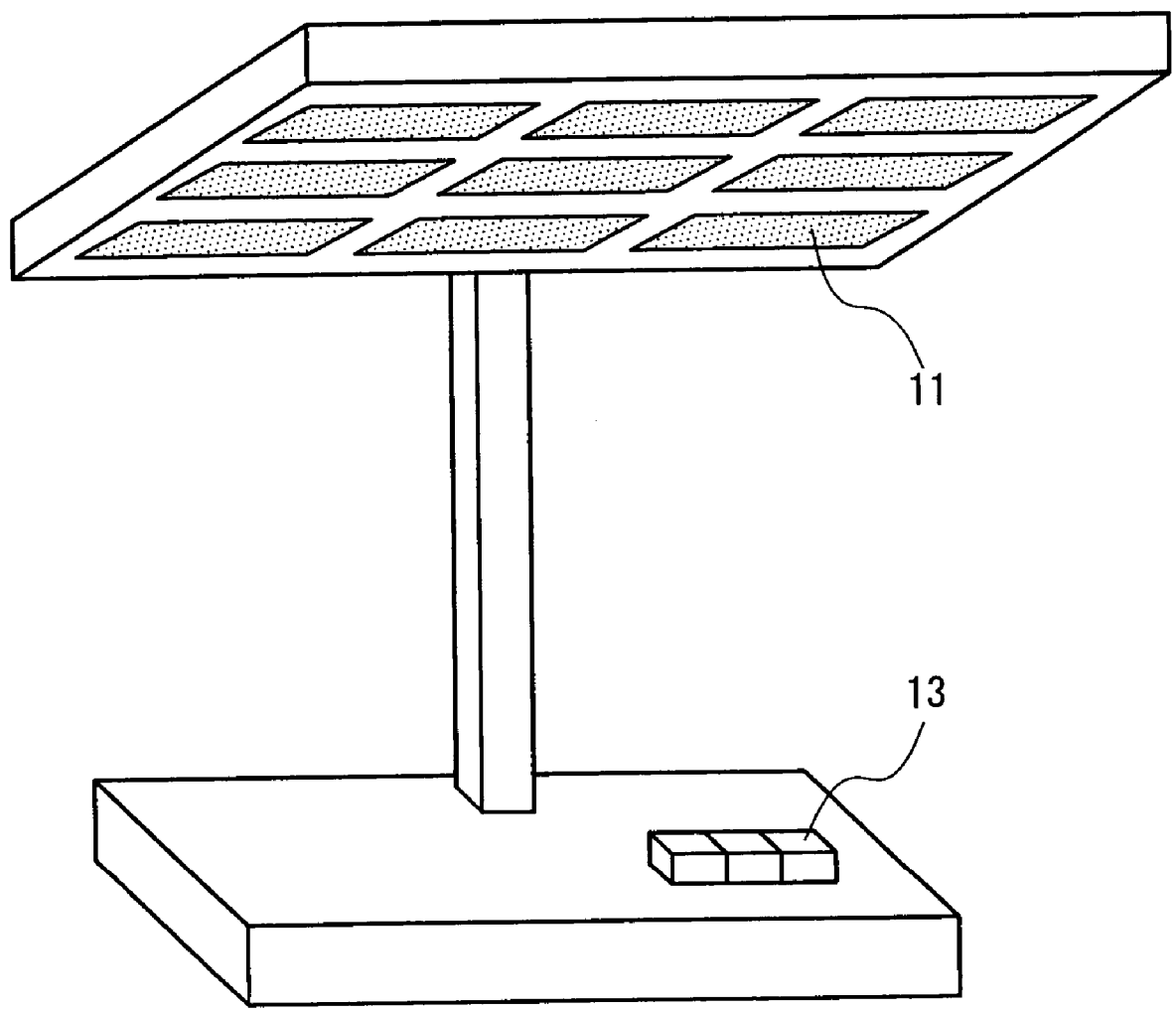
FIG. 8 is a perspective view showing an illumination device of yet another embodiment of the present invention.
Figure 9A:
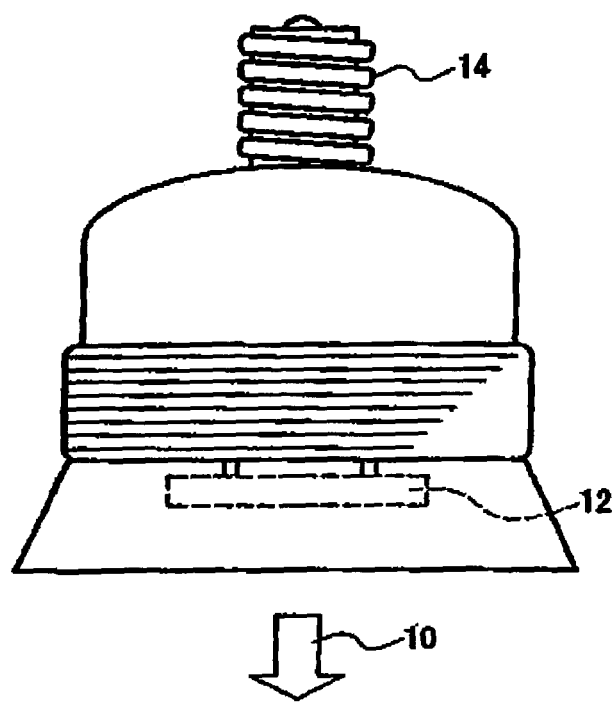
FIG. 9A is a side view of an illumination device of yet another embodiment of the present invention.
Figure 9B:
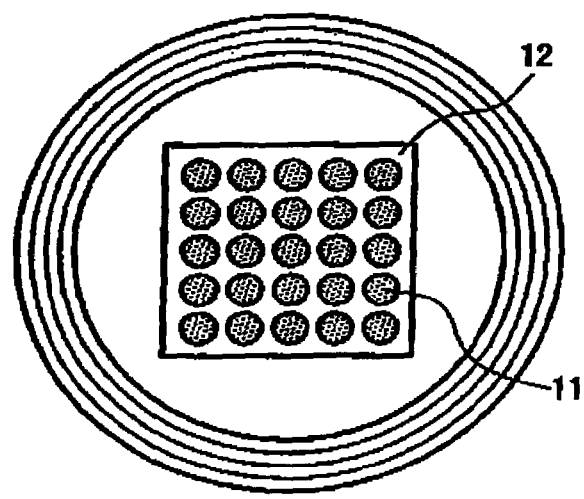
FIG. 9B is a bottom view thereof.
Figure 10:
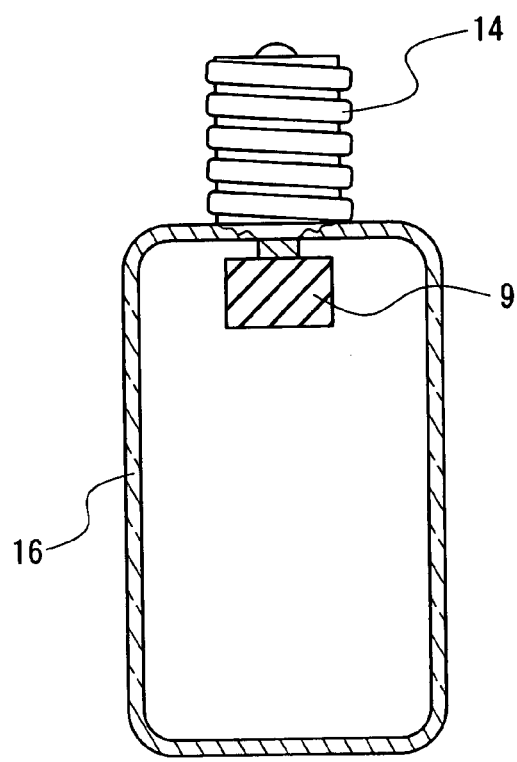
FIG. 10 is a partial cross-sectional view of an illumination device of another embodiment of the present invention.
Figure 11:
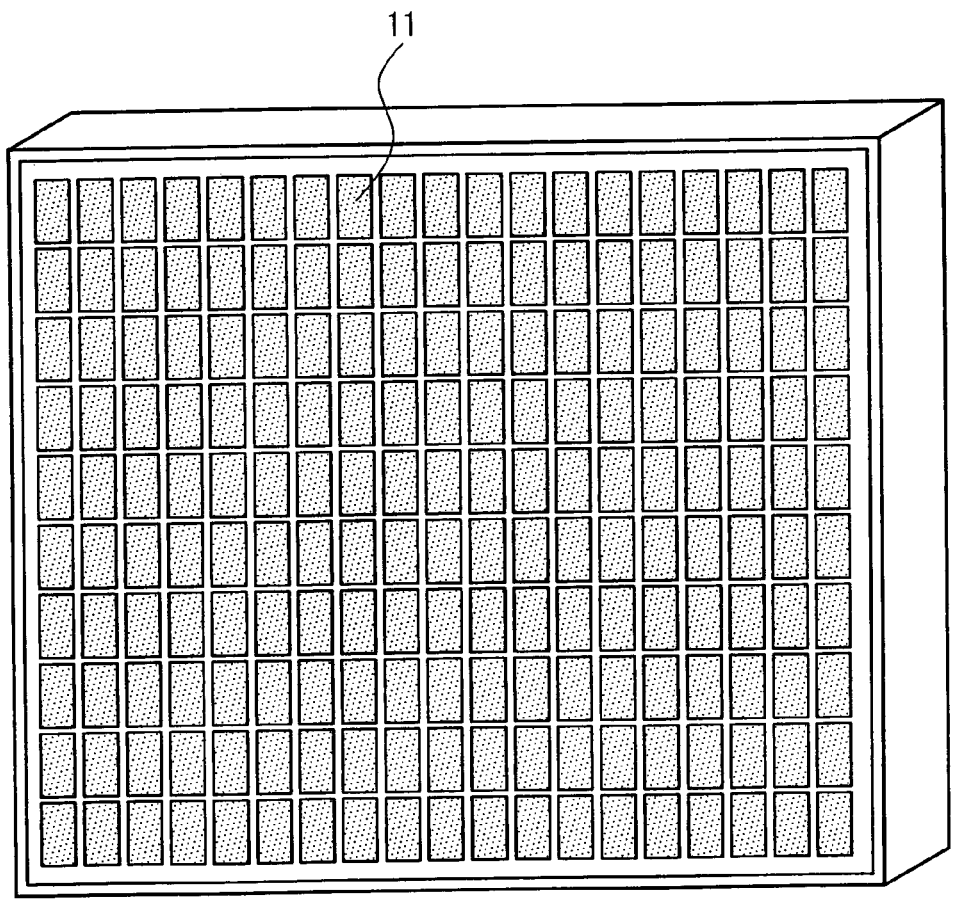
FIG. 11 is a perspective view showing a display device of another embodiment of the present invention.
Figure 12:
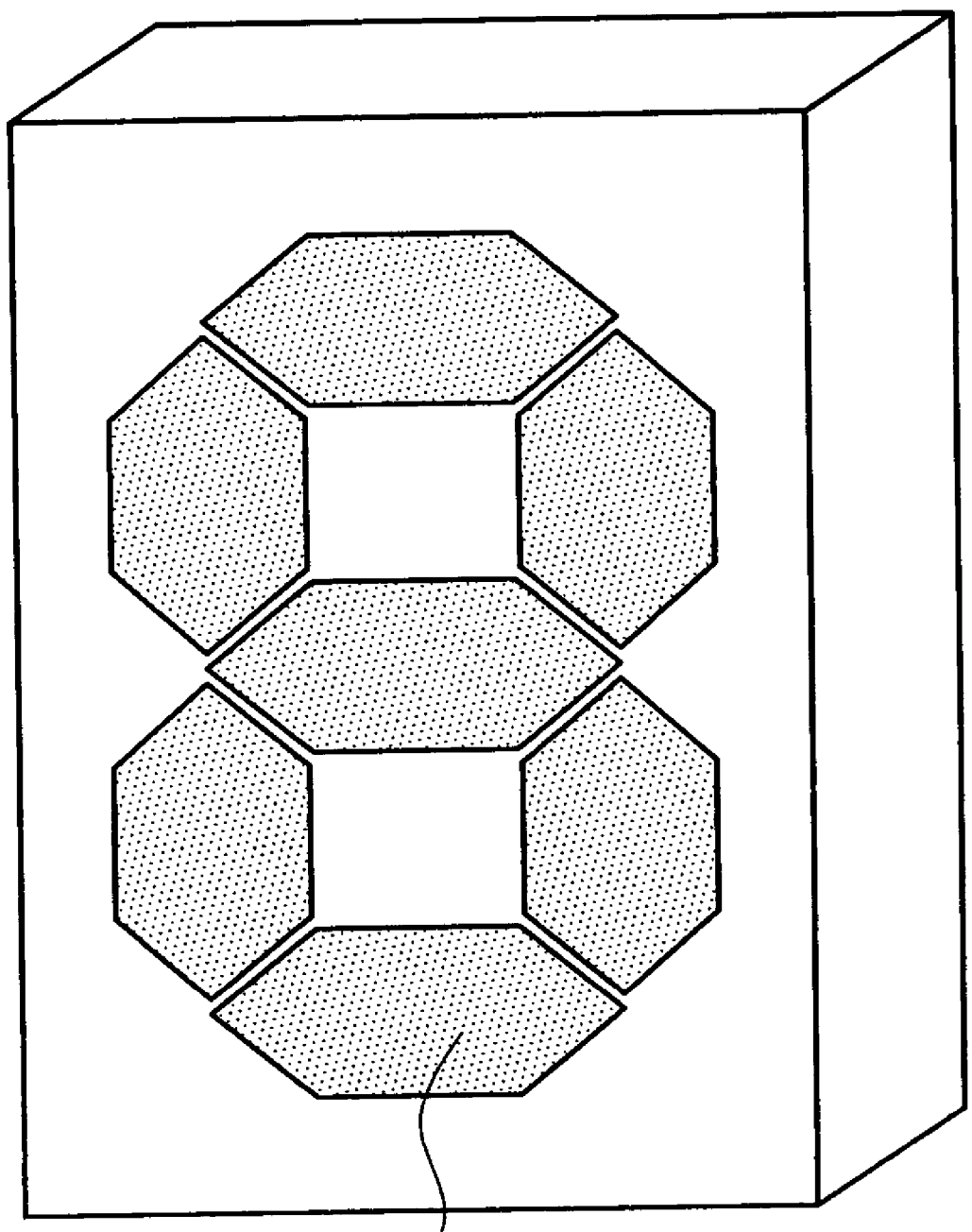
FIG. 12 is a perspective view showing a display device of yet another embodiment of the present invention.

FIGS. 6 to 12 show specific examples of the illumination/display devices of the present invention that are shown schematically in FIGS. 4 and 5. More specifically, FIG. 6 is an illumination module 12 having an integrated light-emitting portion 11. FIG. 7 is an illumination module 12 having a plurality of light-emitting portions 11. FIG. 8 is an illumination device in the form of a table lamp in which on/off control and dimming can be performed with a handy switch 13. FIG. 9 is an illumination device as a light source constituted by an illumination module 12 having a threaded lamp base 14 and a plurality of light-emitting portions 11. FIG. 10 is a bulb-shaped light source having a structure in which the semiconductor light-emitting element 9 is provided in a translucent bulb 16, and electricity is supplied to the semiconductor light-emitting element 9 through a treaded lamp base 14. FIG. 11 is a flat plate-shaped image display device. FIG. 12 is a number display device of a segment type.

The illumination/display device of the present invention is comprises the phosphor of the present invention having good luminescent characteristics that is comparable to the conventional YAG:Ce host phosphor as a light-emitting layer or a wavelength converting layer, so that a larger light output than that of the conventional semiconductor light-emitting element constituted by a phosphor other than the YAG:Ce host phosphor can be provided.

The phosphor of the present invention can be used to provide a display device (light-emitting device) such as an electron tube or a plasma display panel. In this case, a phosphor containing at least one selected from the group consisting of $Ce^{3+}$ ions, $Eu^{3+}$ ions, and $Tb^{3+}$ ions as the luminescent center is preferable. For color display devices, a phosphor emitting each light of red, green and blue, which are the three primary colors, is required. Red luminescence can be realized by a $Eu^{3+}$ ion activated phosphor. Green luminescence can be realized by a $Tb^{3+}$ ion activated phosphor. Blue luminescence can be realized theoretically by a $Ce^{3+}$ ion activated phosphor. In the display device that requires light with a short afterglow, the $Ce^{3+}$ ion activated phosphor is suitable. This is because the luminescence of $Ce^{3+}$ ions is based on an allowed 5d to 4f transition.

EXAMPLES

Example 1

Hereinafter, a method of producing a $Ba(Y_{0.98}Ce_{0.02})_2SiAl_4O_{12}$ inorganic oxide, that is, a $BaY_2SiAl_4O_{12}:Ce^{3+}$ phosphor, and the characteristics thereof will be described in Example 1 of the present invention.

The following inorganic compound powders were used as the phosphor raw materials (inorganic oxide raw materials).
(1) barium carbonate ($BaCO_3$): 9.87 g, the purity 99.95%
(2) yttrium oxide ($Y_2O_3$): 11.07 g, the purity 99.99%
(3) aluminum oxide ($Al_2O_3$): 10.20 g, the purity 99.99%
(4) silicon dioxide ($SiO_2$): 3.07 g, the purity 99.9%
(5) cerium oxide ($CeO_2$): 0.34 g, the purity 99.99%

In Example 1, no flux was used for simplicity.

The phosphor raw materials were mixed sufficiently with an automatic mill, and then the mixed raw materials were fed into a firing container and were fired under the following firing conditions.

firing atmosphere: in the air firing temperature: 1500° C.

firing time: two hours

For simplification of work, a post-treatment (pulverizing/classification/washing etc.) after firing was omitted.

Figure 13A:
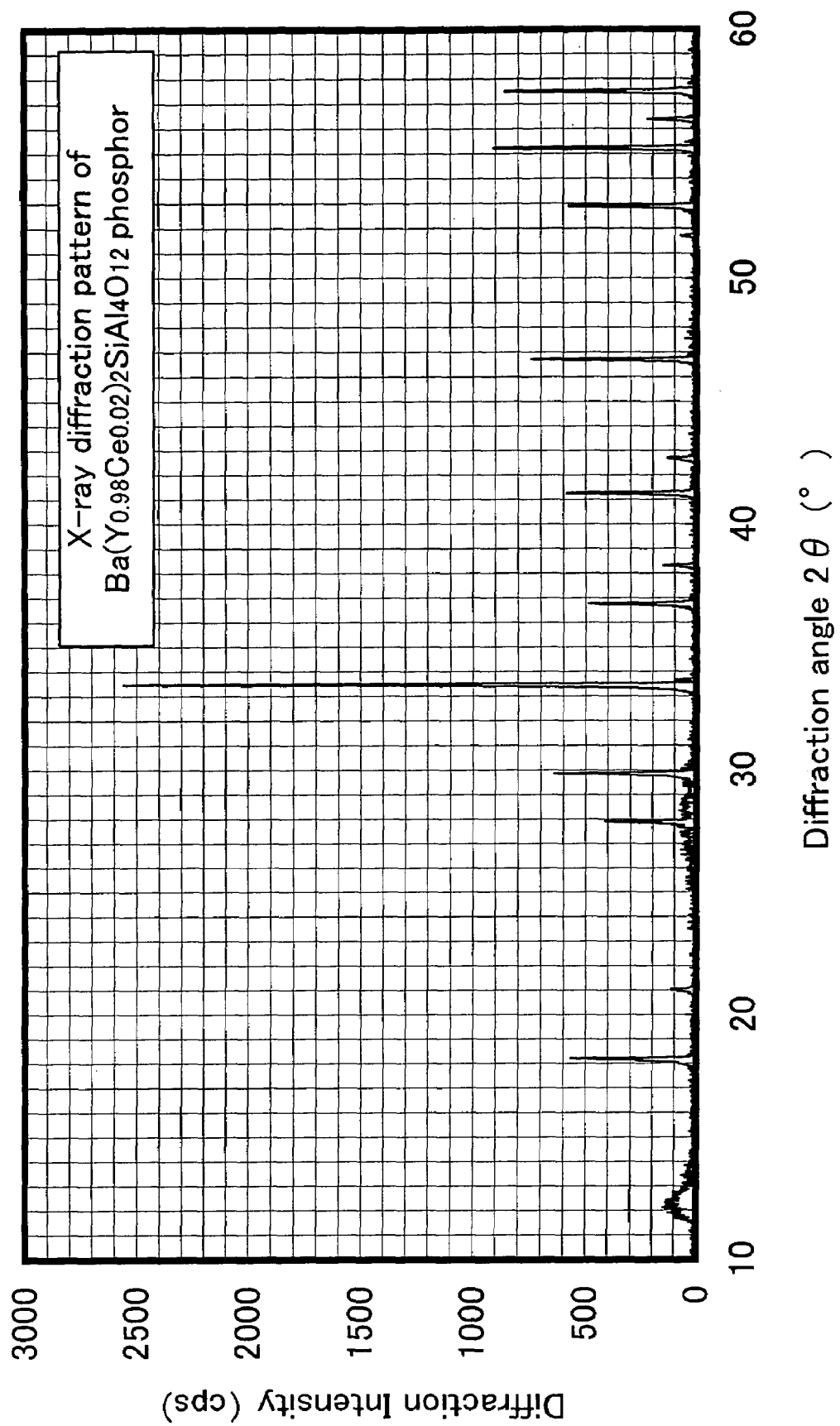
FIG. 13A is the X-ray diffraction pattern of a phosphor $[Ba(Y_{0.98}Ce_{0.02})_2SiAl_4O_{12}]$ of Example 1 of the present invention.
Figure 13B:
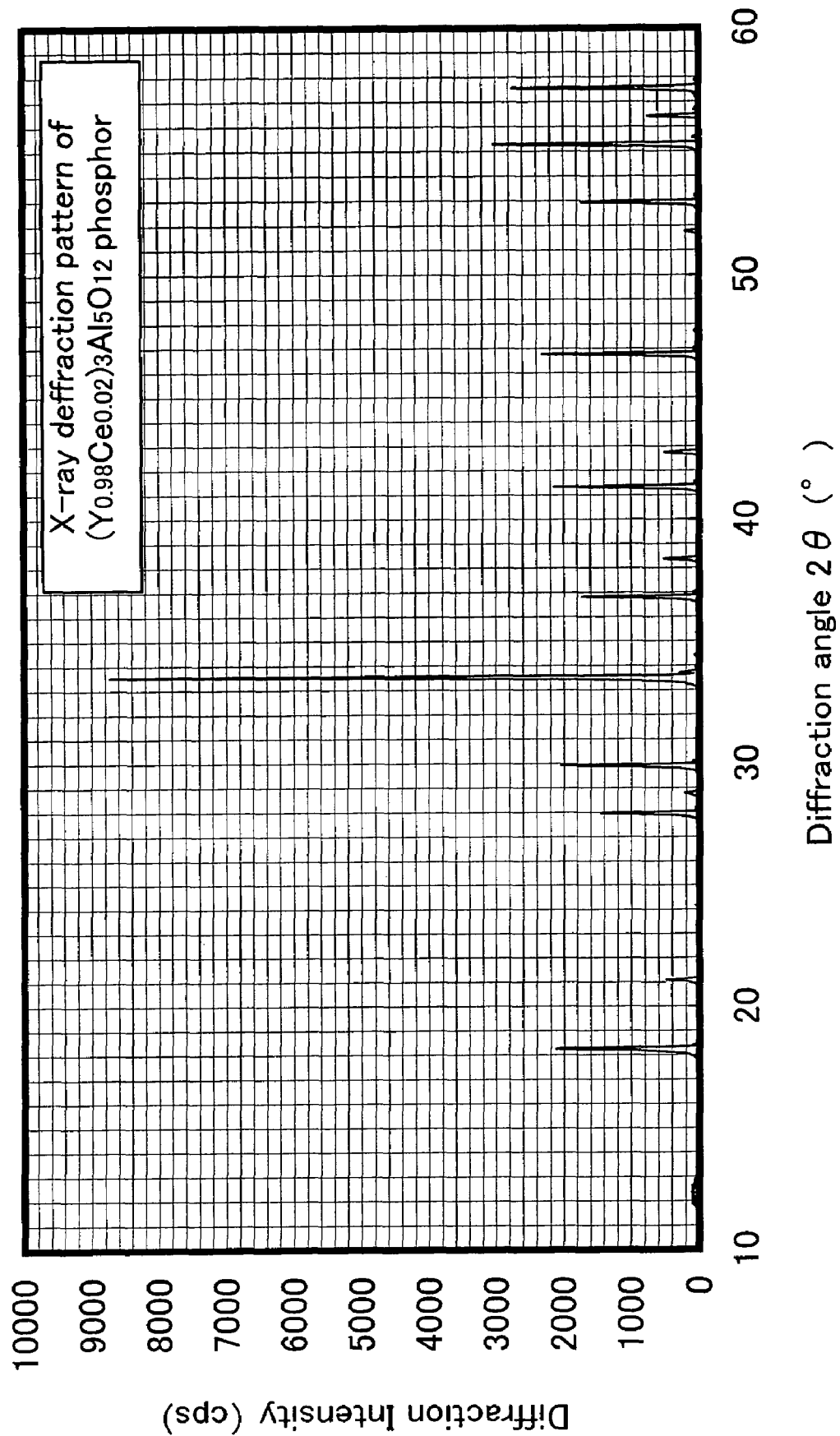
FIG. 13B is the X-ray diffraction pattern of a phosphor $[(Y_{0.98}Ce_{0.02})_3Al_5O_{12}]$ of Example 1 of the present invention.

The results of evaluating the crystal structure by X-ray diffraction indicate that a fired product is a composition of a substantially single crystal phase having a garnet crystal structure. For reference, the X-ray diffraction pattern of the fired product is shown in FIG. 13A. For comparison, the X-ray diffraction pattern of a known $(Y_{0.98}Ce_{0.02})_3Al_5O_{12}$ compound having the garnet structure, that is, a $Y_3Al_5O_{12}:Ce^{3+}$ phosphor is shown in FIG. 13B. As seen from a comparison between FIGS. 13A and 13B, the diffraction pattern of the fired product is the same as that of the $Y_5Al_5O_{12}:Ce^{3+}$ phosphor, which indicates that the fired product is a composition of a single crystal phase having the garnet structure.

The results of evaluating the composition by the ICP emission spectrometry (the ratio of the only metal atoms: Ba, Y, Al, Si and Ce) indicated that the fired product had the same composition as the composition when being fed for firing.

Figure 14:
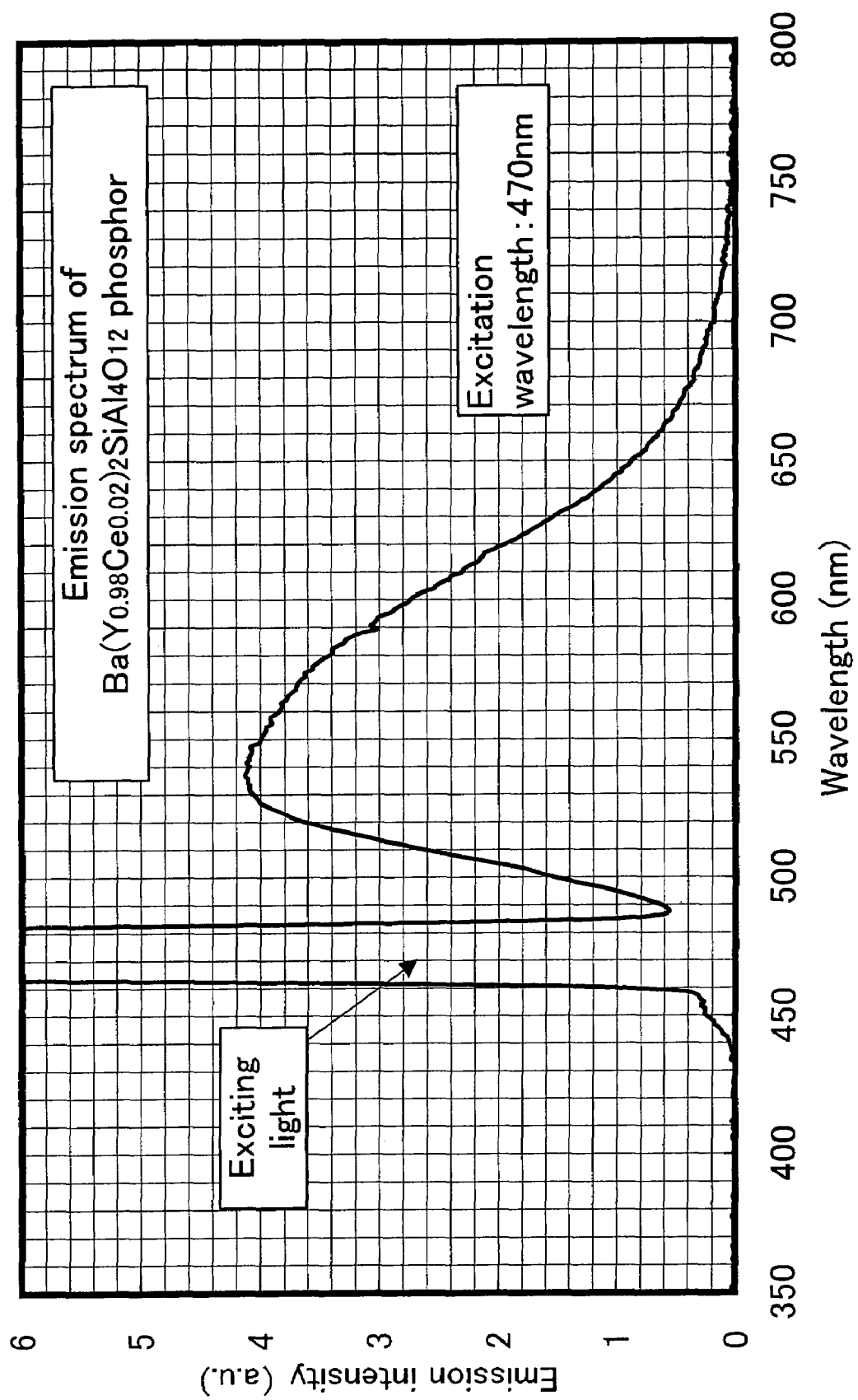
FIG. 14 is the emission spectrum of a phosphor of Example 1 of the present invention.
Figure 15:
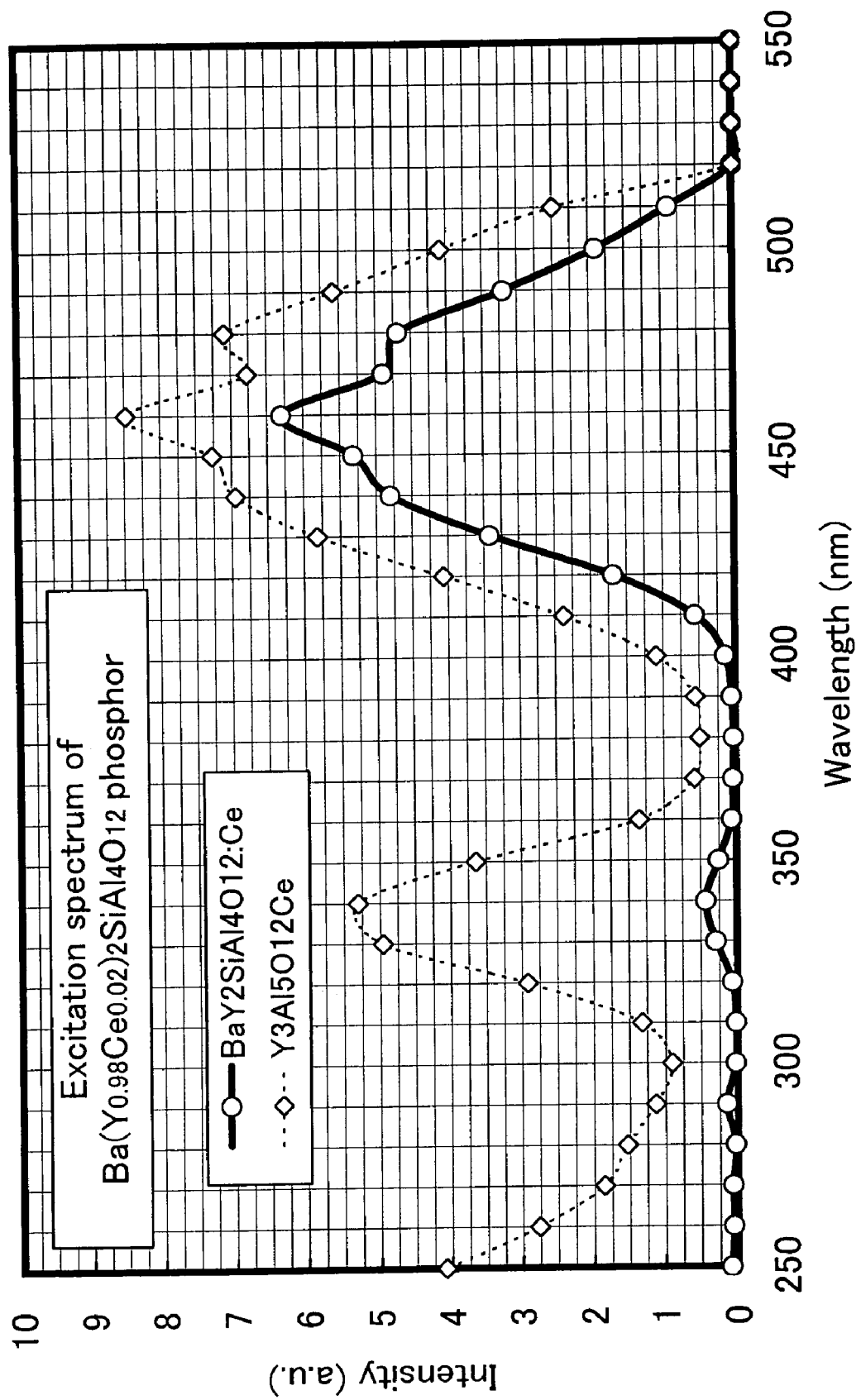
FIG. 15 is the excitation spectrum of a phosphor of Example 1 of the present invention.

FIG. 14 shows the emission spectrum of the fired product that was measured under excitation of blue light of 470 nm, and FIG. 15 shows the excitation spectrum (monitored luminescent wavelength: 540 nm) in the excitation wavelength range from 250 to 550 nm. For comparison, FIG. 15 also shows the excitation spectrum of the known $Y_3Al_5O_{12}:Ce^{3+}$ phosphor.

FIG. 14 indicates that the fired product is a phosphor emitting yellow-greenish light having a luminescent peak in the vicinity of a wavelength of 540 nm. FIG. 15 indicates that the fired product is a phosphor having an excitation band in a blue wavelength region of 405 nm or more and 515 nm or less, which is the same as that of the YAG:Ce host phosphor.

The above results confirmed that the fired product is a $Ba(Y_{0.98}Ce_{0.02})_2SiAl_4O_{12}$ inorganic oxide having a crystal structure of the garnet structure, and also is a $BaY_2SiAl_4O_{12}:Ce^{3+}$ phosphor that is excited with bluish light and emits yellow-green light containing a yellowish light-emitting component.

Example 2

Hereinafter, a method of producing a $Sr(Y_{0.98}Ce_{0.02})_2SiAl_4O_{12}$ inorganic oxide, that is, a $SrY_2SiAl_4O_{12}:Ce^{3+}$ phosphor and the characteristics thereof will be described in Example 2 of the present invention.

The following inorganic compound powders were used as the phosphor raw materials (inorganic oxide raw materials).
(1) strontium carbonate ($SrCO_3$): 7.38 g, the purity 99.9%
(2) yttrium oxide ($Y_2O_3$): 11.07 g, the purity 99.99%
(3) aluminum oxide ($Al_2O_3$): 10.20 g, the purity 99.99%
(4) silicon dioxide ($SiO_2$): 3.07 g, the purity 99.9%
(5) cerium oxide ($CeO_2$): 0.34 g, the purity 99.99%

Also in Example 2, no flux was used.

Figure 16:
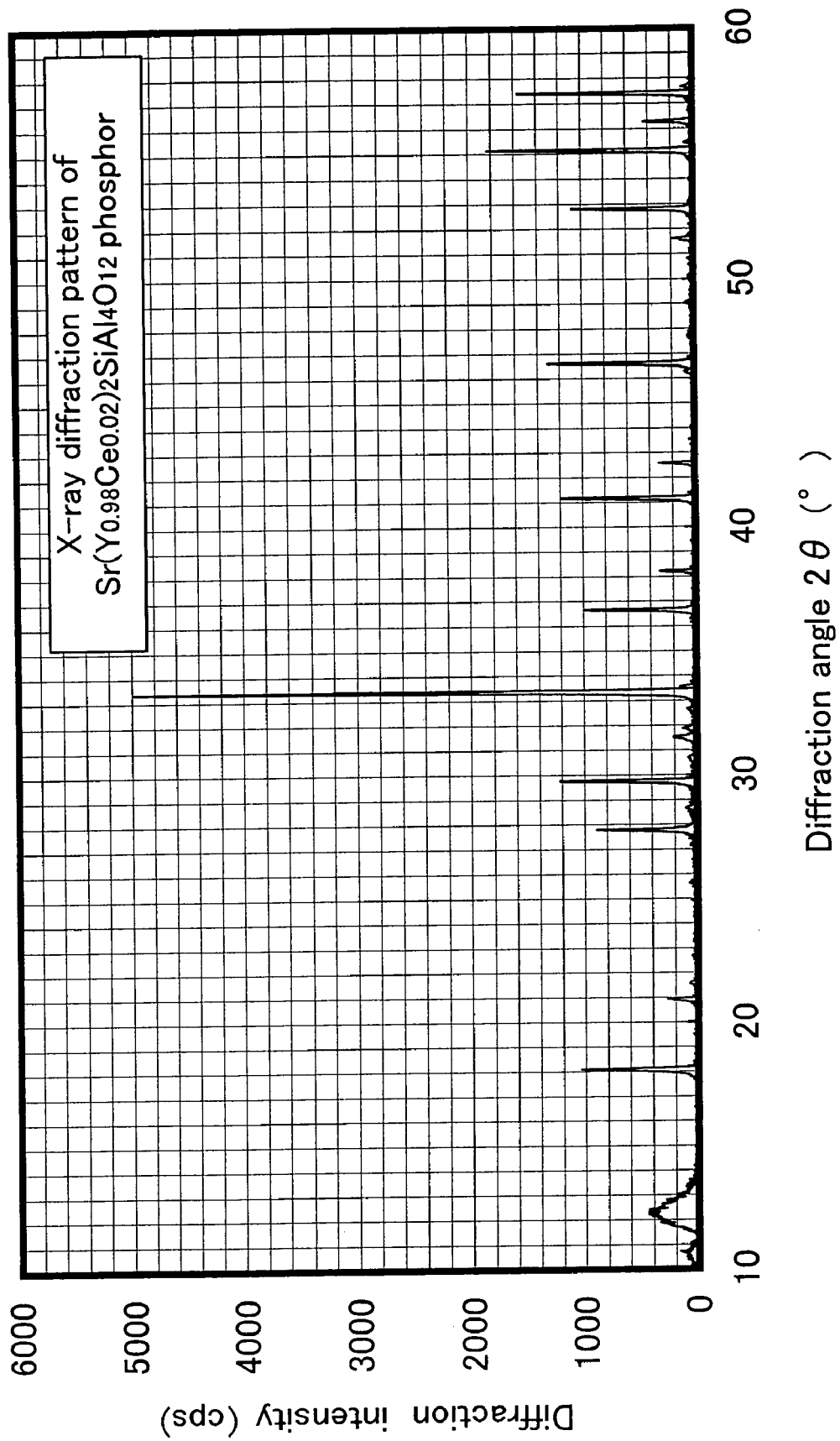
FIG. 16 is the X-ray diffraction pattern of a phosphor of Example 2 of the present invention.

A fired product was obtained in the same manner and conditions as in Example 1. The results of evaluating the crystal structure by X-ray diffraction indicate that the fired product is a composition of a substantially single crystal phase having a garnet crystal structure, as in Example 1. For reference, the X-ray diffraction pattern of the fired product is shown in FIG. 16. A comparison with FIG. 13A or 13B indicates that the fired product is a composition of a single crystal phase having a garnet crystal structure.

The results of evaluating the composition by the ICP emission spectrometry (the ratio of the only metal atoms: Sr, Y, Al, Si and Ce) indicated that the fired product had substantially the same composition as the composition when being fed for firing.

Figure 17:
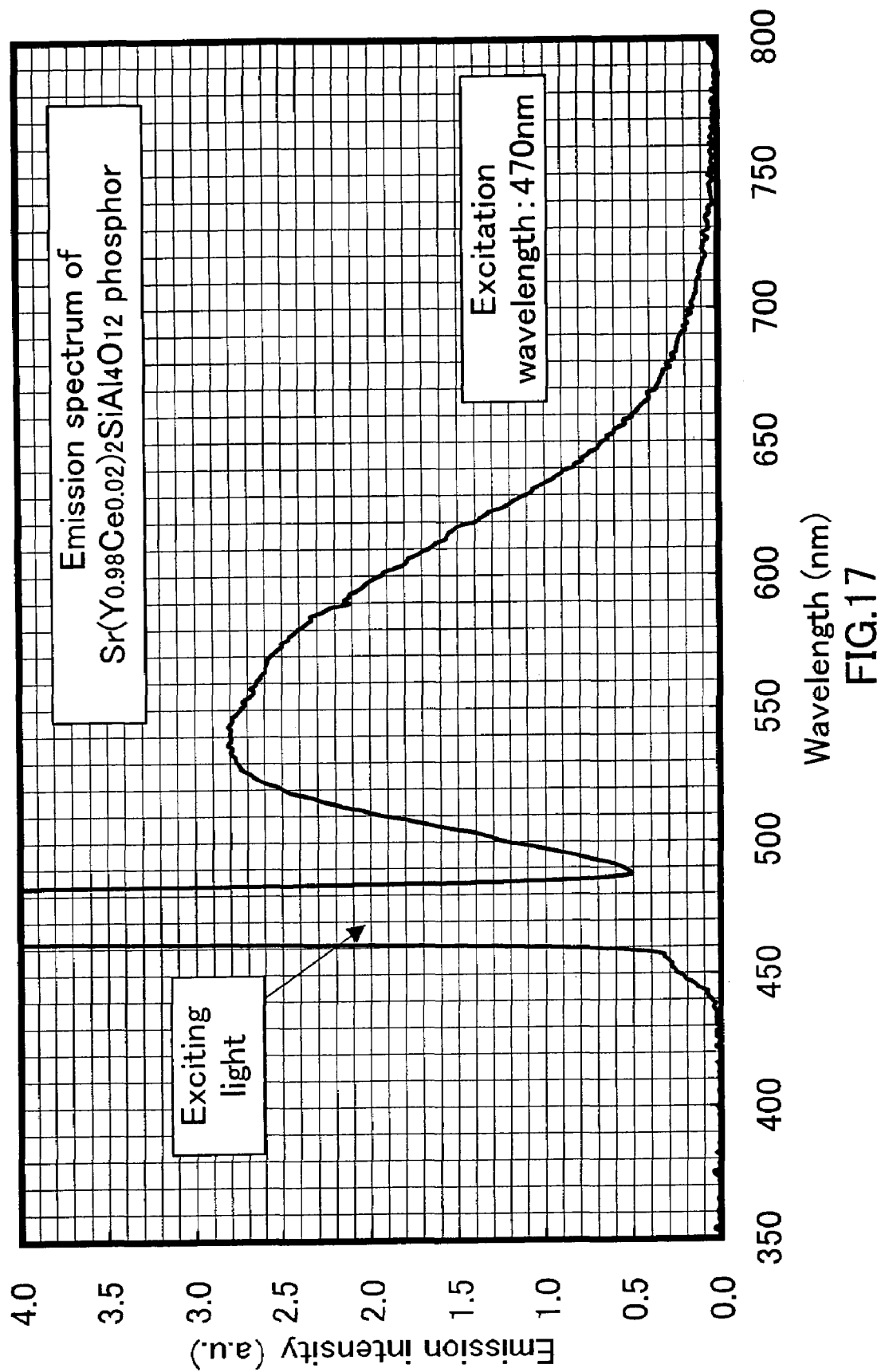
FIG. 17 is the emission spectrum of the phosphor of Example 2 of the present invention.

FIG. 17 shows the emission spectrum of the fired product that was measured under excitation of blue light of 470 nm. FIG. 17 indicates that the fired product is a phosphor having a luminescent peak in the vicinity of a wavelength of 540 nm. The excitation spectrum is not described, but it was similar to the excitation spectrum of the phosphor of Example 1.

The above results confirmed that the fired product is a $Sr(Y_{0.98}Ce_{0.02})_2SiAl_4O_{12}$ inorganic oxide having a garnet crystal structure, and also is a $SrY_2SiAl_4O_{12}:Ce^{3+}$ phosphor that is excited with bluish light and emits yellow-greenish light.

Example 3

Hereinafter, a method of producing a $Ca(Y_{0.98}Ce_{0.02})_2SiAl_4O_{12}$ inorganic oxide, that is, a $CaY_2SiAl_4O_{12}:Ce^{3+}$ phosphor, and the characteristics thereof will be described in Example 3 of the present invention.

The following inorganic compound powders were used as the phosphor raw materials (inorganic oxide raw materials).
(1) calcium carbonate ($CaCO_3$): 5.00 g, the purity 99.99%
(2) yttrium oxide ($Y_2O_3$): 11.07 g, the purity 99.99%
(3) aluminum oxide ($Al_2O_3$): 10.20 g, the purity 99.99%
(4) silicon dioxide ($SiO_2$): 3.07 g, the purity 99.9%
(5) cerium oxide ($CeO_2$): 0.34 g, the purity 99.99%

Also in Example 3, no flux was used.

Figure 18:
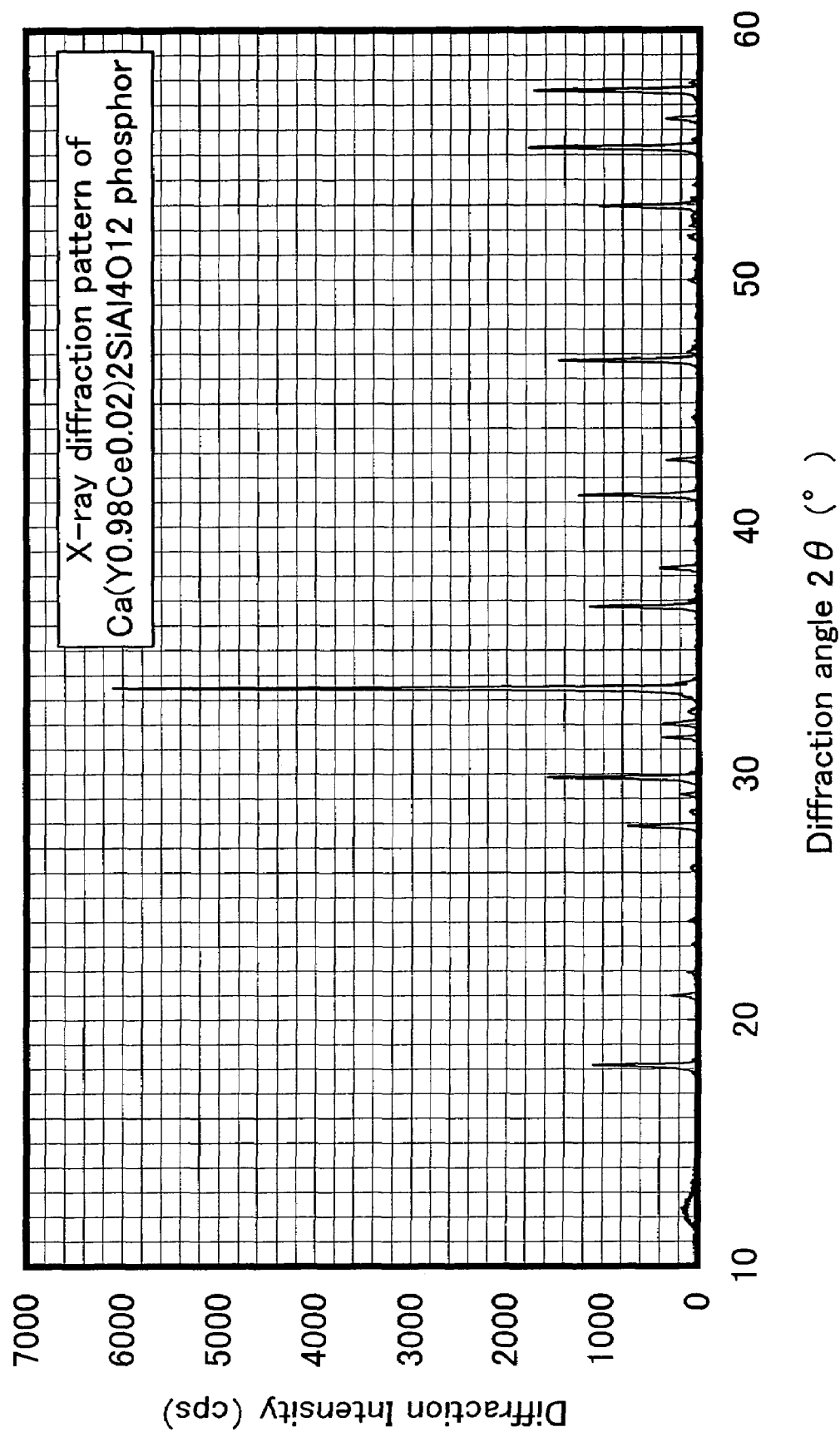
FIG. 18 is the X-ray diffraction pattern of a phosphor of Example 3 of the present invention.

A fired product was obtained in the same manner and conditions as in Example 1. The results of evaluating the crystal structure by X-ray diffraction indicate that the fired product is a composition of a substantially single crystal phase having a garnet crystal structure, as in Example 1. For reference, the X-ray diffraction pattern of the fired product is shown in FIG. 18. A comparison with FIG. 13A or 13B indicates that the fired product is a composition of a substantially single crystal phase having a crystal structure of the garnet. In FIG. 18, some diffraction peaks that seem to be due to a different type of compound can be seen, but this is because firing was not performed under the optimal conditions.

Figure 19:
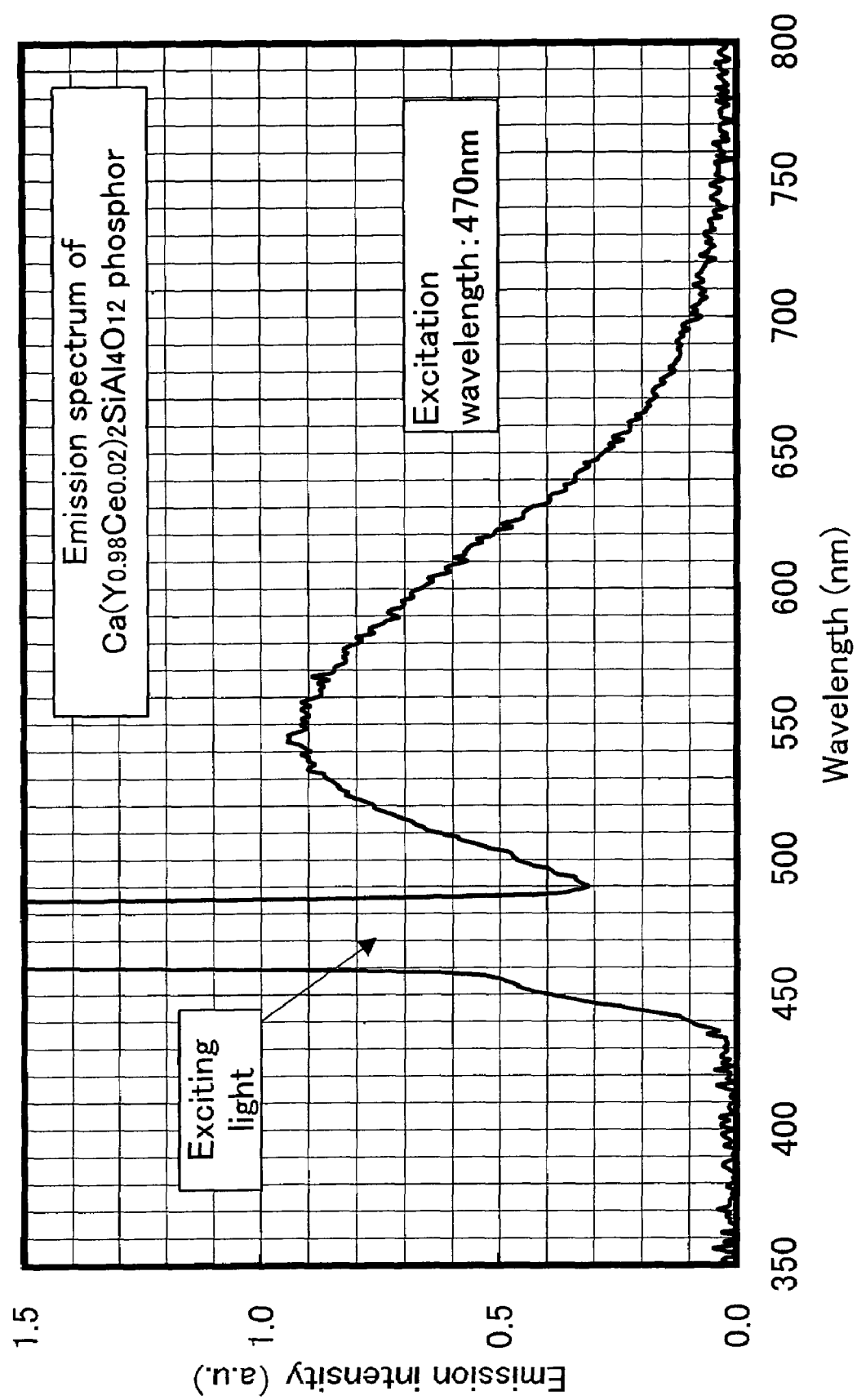
FIG. 19 is the emission spectrum of the phosphor of Example 3 of the present invention.

FIG. 19 shows the emission spectrum of the fired product that was measured under excitation of blue light of 470 nm. FIG. 19 indicates that the fired product is a phosphor having a luminescent peak in the vicinity of a wavelength of 550 nm. The excitation spectrum is not described, but it was similar to the excitation spectrum of the phosphor of Example 1.

The above results confirmed that the fired product is a $Ca(Y_{0.98}Ce_{0.02})_2SiAl_4O_{12}$ inorganic oxide, and also is a $CaY_2SiAl_4O_{12}:Ce^{3+}$ phosphor that is excited with bluish light and emits yellow-greenish light.

Example 4

Hereinafter, a method of producing a $Mg(Y_{0.98}Ce_{0.02})_2SiAl_4O_{12}$ inorganic oxide, that is, a $MgY_2SiAl_4O_{12}:Ce^{3+}$ phosphor, and the characteristics thereof will be described in Example 4 of the present invention.

The following inorganic compound powders were used as the phosphor raw materials (inorganic oxide raw materials).
(1) basic magnesium carbonate (($MgCO_3$)$_4$·$Mg(OH)_2$·$3H_2O$): 4.80 g, the purity >99.9%
(2) yttrium oxide ($Y_2O_3$): 11.07 g, the purity 99.99%
(3) aluminum oxide ($Al_2O_3$): 10.20 g, the purity 99.99%
(4) silicon dioxide ($SiO_2$): 3.07 g, the purity 99.9%
(5) cerium oxide ($CeO_2$): 0.34 g, the purity 99.99%

Also in Example 4, no flux was used.

Figure 20:
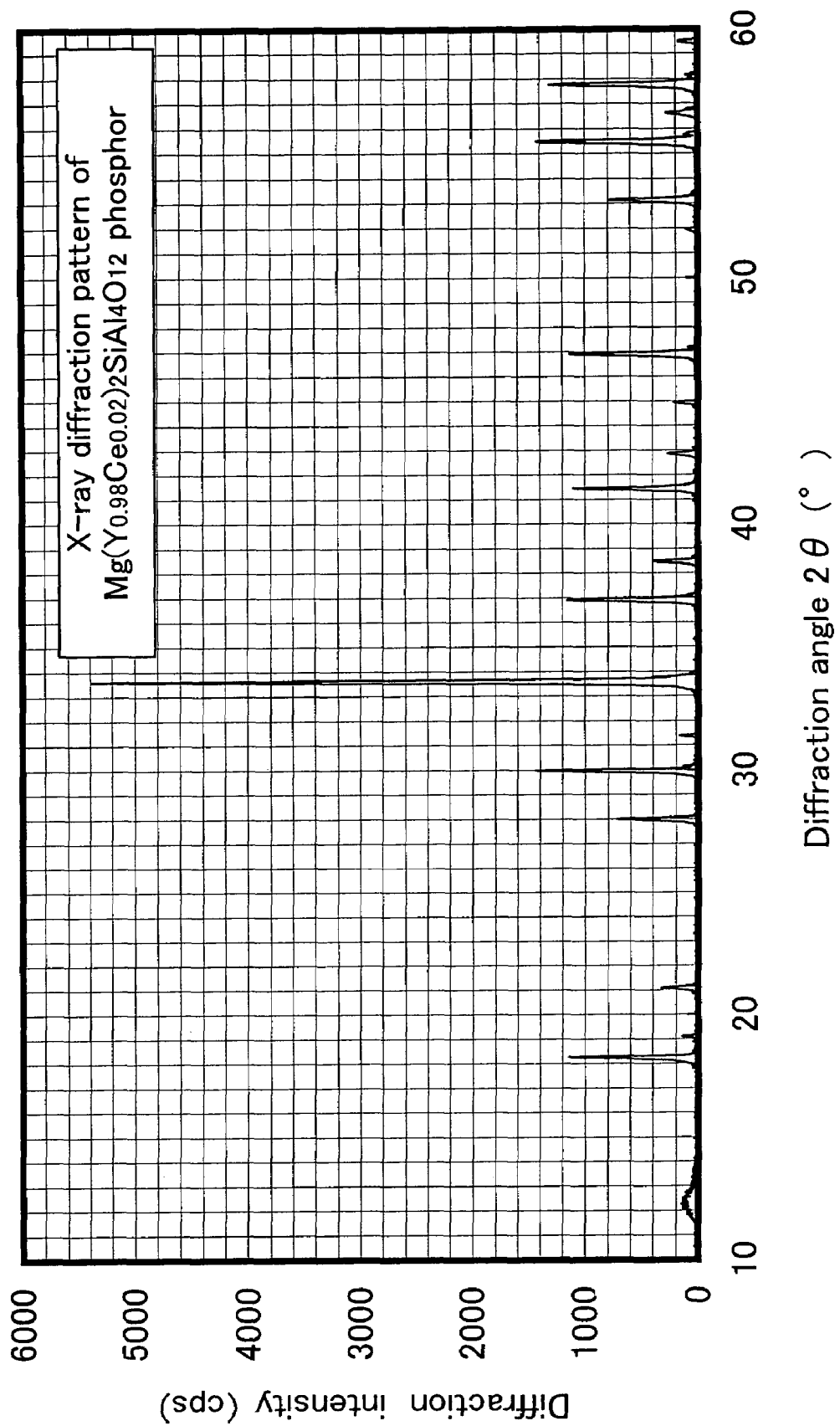
FIG. 20 is the X-ray diffraction pattern of a phosphor of Example 4 of the present invention.

A fired product was obtained in the same manner and conditions as in Example 1. The results of evaluating the crystal structure by X-ray diffraction indicate that the fired product is a composition of a single crystal phase having a garnet crystal structure, as in Example 1. For reference, the X-ray diffraction pattern of the fired product is shown in FIG. 20.

Figure 21:
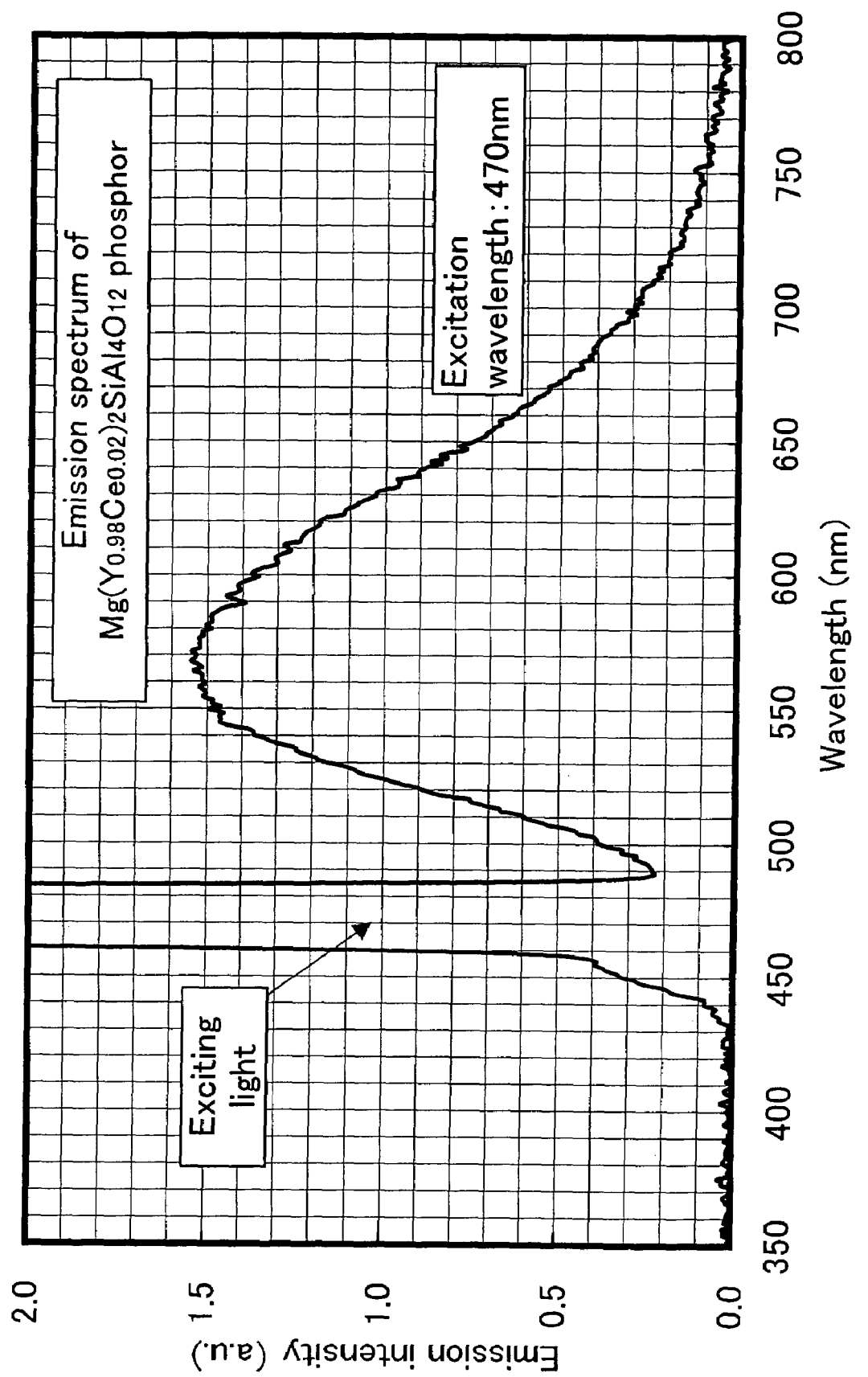
FIG. 21 is the emission spectrum of the phosphor of Example 4 of the present invention.

FIG. 21 shows the emission spectrum of the fired product that was measured under excitation of blue light of 470 nm.

Figure 22:
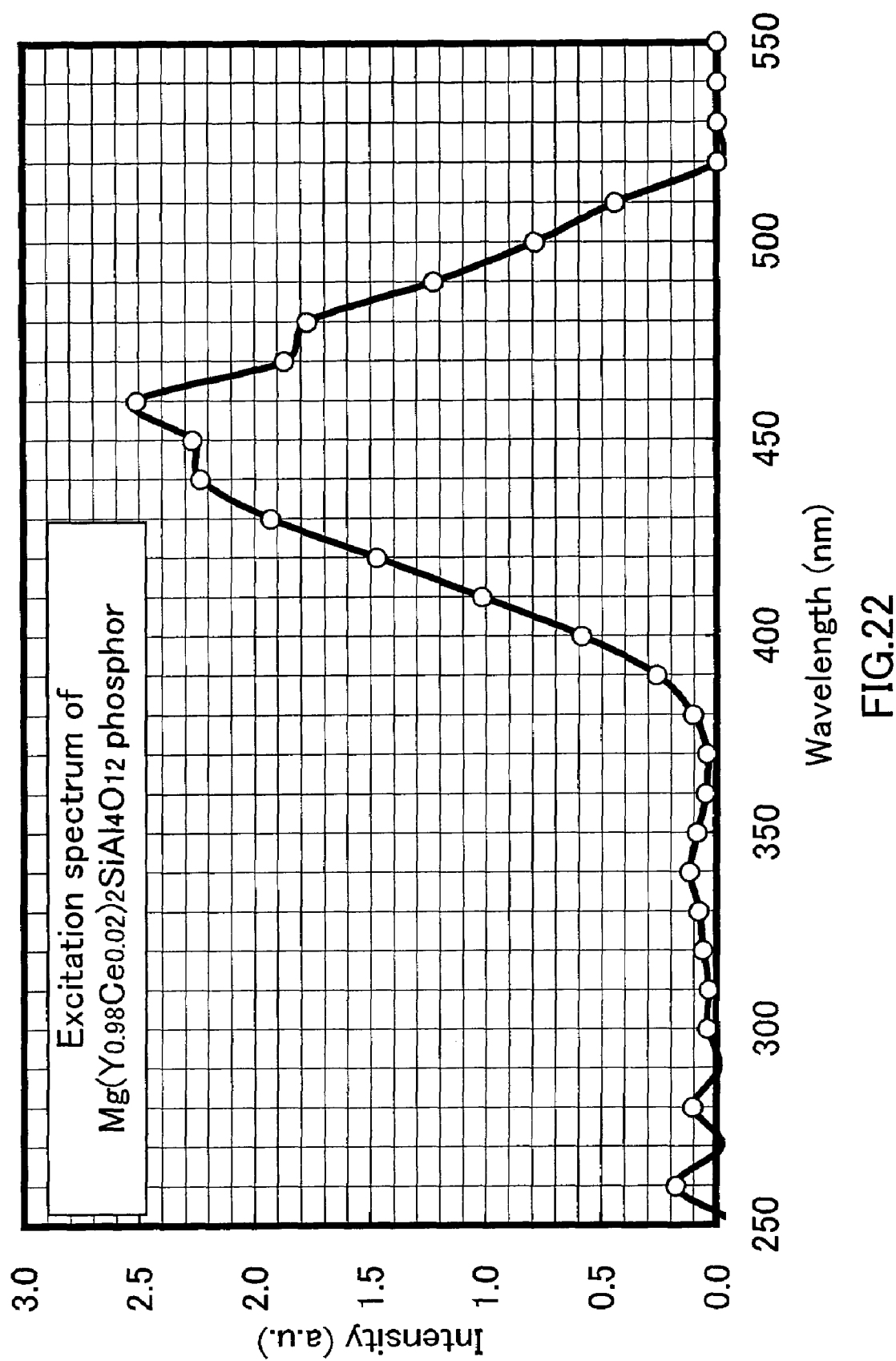
FIG. 22 is the excitation spectrum of the phosphor of Example 4 of the present invention.

FIG. 21 indicates that the fired product is a phosphor having a luminescent peak in a yellowish region in the vicinity of a wavelength of 570 nm. FIG. 22 shows the excitation spectrum. The excitation spectrum was similar to the excitation spectrum of the phosphor of Example 1.

The above results confirmed that the fired product is a $Mg(Y_{0.98}Ce_{0.02})_2SiAl_4O_{12}$ inorganic oxide having a garnet crystal structure, and also is a $MgY_2SiAl_4O_{12}:Ce^{3+}$ phosphor that is excited with bluish light and emits yellowish light.

Example 5

Hereinafter, the characteristics of a $Ba(Y_{0.98}Ce_{0.02})_2SiAl_4O_{12}$ inorganic oxide, that is, a $BaY_2SiAl_4O_{12}:Ce^{3+}$ phosphor manufactured by a manufacturing method different from the one in Example 1, will be described as Example 5 of the present invention.

The following inorganic compound powders were used as the phosphor raw materials (inorganic oxide raw materials).
(1) barium carbonate ($BaCO_3$): 9.87 g, the purity 99.95%
(2) yttrium oxide ($Y_2O_3$): 11.07 g, the purity 99.99%
(3) aluminum oxide ($Al_2O_3$): 10.20 g, the purity 99.99%
(4) silicon dioxide ($SiO_2$): 3.07 g, the purity 99.9%
(5) cerium oxide ($CeO_2$): 0.34 g, the purity 99.99%

In Example 5, the following flux was used.
(6) barium fluoride ($BaF_2$): 0.088 g, the purity 99.9%

The $BaF_2$ flux was doped in an amount of 0.01 mol (corresponding to 1 mol %) per mol of the inorganic oxide.

The phosphor raw materials were mixed sufficiently with an automatic mill, and then the mixed raw materials were fed into a firing container and were fired under the following firing conditions.

firing atmosphere: nitrogen and hydrogen mixed gas atmosphere (95 volume % of nitrogen+5 volume % of hydrogen)

firing temperature: 1450° C.

firing time: two hours

For simplification of work, a post-treatment (pulverizing/classification/washing etc.) after firing was omitted.

Figure 23:
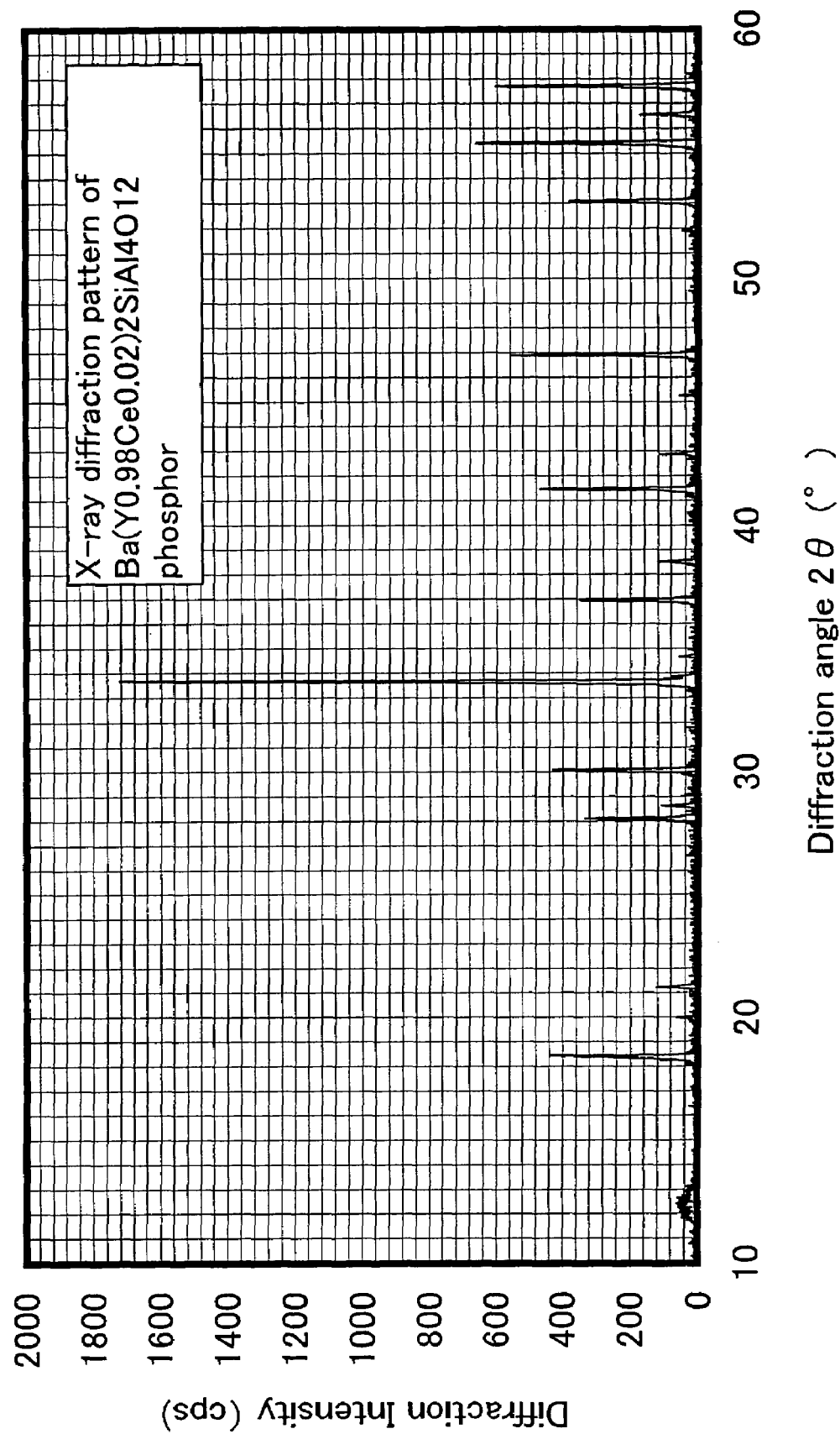
FIG. 23 is the X-ray diffraction pattern of a phosphor of Example 5 of the present invention.

The results of evaluating the crystal structure by X-ray diffraction indicate that a fired product is a composition of a substantially single crystal phase having a garnet crystal structure. For reference, the X-ray diffraction pattern of the fired product is shown in FIG. 23. The diffraction pattern of the fired produce is the same as that of the $Y_3Al_5O_{12}:Ce^{3+}$ phosphor shown in FIG. 13B, which indicates that the fired product is a composition of a single crystal phase having the garnet structure.

FIG. 24 shows the emission spectrum of the fired product that was measured under excitation of blue light of 470 nm. FIG. 24 indicates that the fired product is a phosphor emitting yellow-greenish light having a luminescent peak in the vicinity of a wavelength of 540 nm.

The above results confirmed that the fired product is a $Ba(Y_{0.98}Ce_{0.02})_2SiAl_4O_{12}$ inorganic oxide having a garnet crystal structure, and also is a $BaY_2SiAl_4O_{12}:Ce^{3+}$ phosphor that is excited with bluish light and emits yellow-green light containing a yellowish light-emitting component.

Example 6

Hereinafter, a method of producing a $Ba(Y_{0.979}Ce_{0.02}Pr_{0.001})_2SiAl_4O_{12}$ inorganic oxide and a $Ba(Y_{0.977}Ce_{0.02}Pr_{0.003})_2SiAl_4O_{12}$ inorganic oxide, that is, $BaY_2SiAl_4O_{12}:Ce^{3+}$, $Pr^{3+}$ phosphors having different amounts of Pr doped, and the characteristics thereof will be described in Example 6 of the present invention.

The following inorganic compound powders were used as the phosphor raw materials (inorganic oxide raw materials).
(1) barium carbonate ($BaCO_3$): 9.87 g, the purity 99.95%
(2) yttrium oxide ($Y_2O_3$): 11.05 g or 11.03 g, the purity 99.99%
(3) aluminum oxide ($Al_2O_3$): 10.20 g, the purity 99.99%
(4) silicon dioxide ($SiO_2$): 3.07 g, the purity 99.9%
(5) cerium oxide ($CeO_2$): 0.34 g, the purity 99.99%
(6) praseodymium oxide ($Pr_6O_{11}$): 0.017 g or 0.051 g, the purity 99.9%

Also in Example 6. the following flux was used.
(7) barium fluoride ($BaF_2$): 0.088 g, the purity 99.9%

The $BaF_2$ flux was doped in a ratio corresponding to 1 mol % per mol of the inorganic oxide.

Fired products were obtained in the same manner and conditions as in Example 5. The results of evaluating the crystal structure by X-ray diffraction indicate that the fired products are compositions of a substantially single crystal phase having a garnet crystal structure, as in Example 1.

Figure 25A:
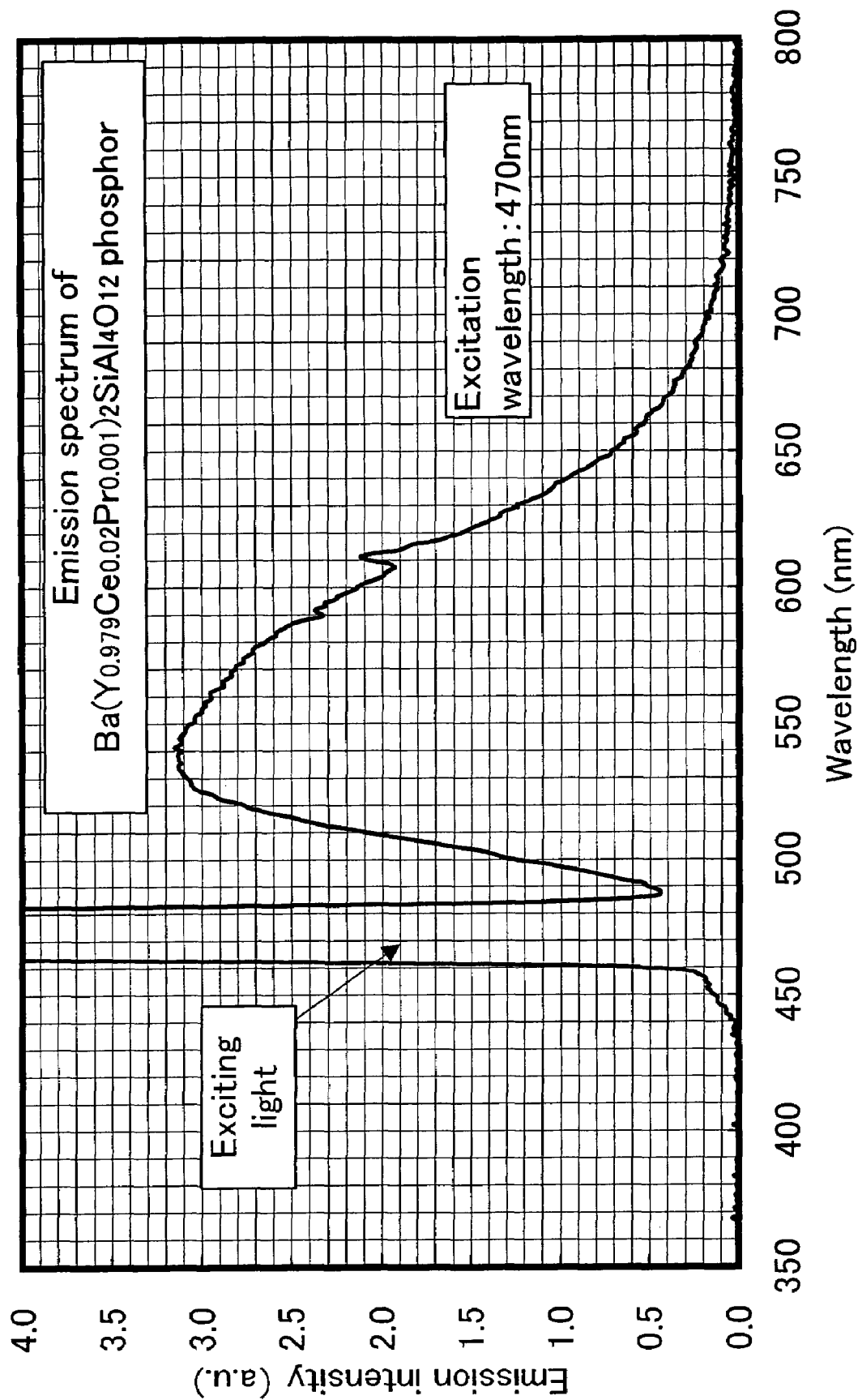
FIG. 25A is the emission spectrum of a phosphor $[Ba(Y_{0.979}Ce_{0.02}Pr_{0.001})_2SiAl_4O_{12}]$ of Example 6 of the present invention.
Figure 25B:
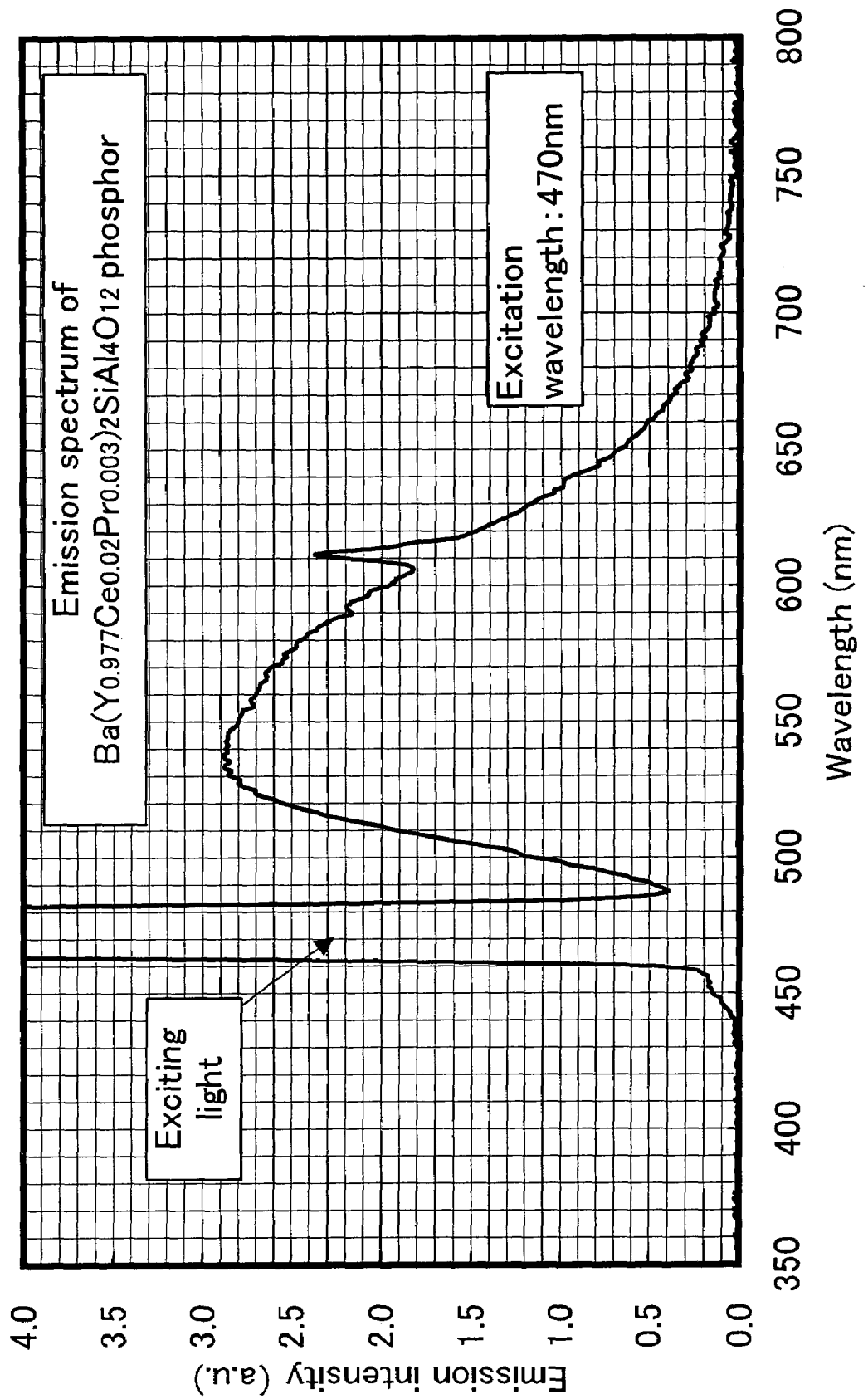
FIG. 25B is the emission spectrum of a phosphor $[(Y_{0.977}Ce_{0.02}Pr_{0.003})_2SiAl_4O_{12}]$ of Example 6 of the present invention.

FIGS. 25A and 25B show the emission spectra of the fired products that were measured under excitation of blue light of 470 nm. FIGS. 25A and 25B indicate that the fired products are phosphors emitting light in which light with a wide spectrum wide having a luminescent peak in a yellow-green region in the vicinity of 540 nm and bright-line light having a luminescent peak in a red region in the vicinity of 610 nm are overlapped. The excitation spectrum is not described, but the excitation spectrum was similar to the excitation spectrum of the phosphor of Example 1.

The above results confirmed that the fired products are a $Ba(Y_{0.979}Ce_{0.02}Pr_{0.001})_2SiAl_4O_{12}$ inorganic oxide and a $Ba(Y_{0.977}Ce_{0.02}Pr_{0.003})_2SiAl_4O_{12}$ inorganic oxide having a garnet crystal structure, and both of them are $BaY_2SiAl_4O_{12}:Ce^{3+}$, $Pr^{3+}$ phosphors that are excited with bluish light and emit yellow-greenish light including a sharp bright-line red light-emitting component.

In Example 6, the substitution amount of the Pr atoms with respect to Ln is 0.1 at % and 0.3 at %. However, if the substitution amount of the Pr atoms is at least 0.03 at % or more and 1 at % or less, a red light-emitting component can be identified.

Example 7

Hereinafter, a method of producing a $Ba(Y_{0.88}Gd_{0.1}Ce_{0.02})_2 SiAl_4O_{12}$ inorganic oxide, that is, a $Ba(Y, Gd)_2SiAl_4O_{12}:Ce^{3+}$ phosphor, and the characteristics thereof will be described in Example 7 of the present invention.

The following inorganic compound powders were used as the phosphor raw materials (inorganic oxide raw materials).
(1) barium carbonate ($BaCO_3$): 9.87 g, the purity 99.95%
(2) yttrium oxide ($Y_2O_3$): 9.93 g, the purity 99.99%
(3) gadolinium oxide ($Gd_2O_3$): 1.81 g, the purity 99.9%
(4) aluminum oxide ($Al_2O_3$): 10.20 g, the purity 99.99%
(5) silicon dioxide ($SiO_2$): 3.07 g, the purity 99.9%
(6) cerium oxide ($CeO_2$): 0.34 g, the purity 99.99%

Also in Example 7, the following flux was used.
(7) barium fluoride ($BaF_2$): 0.088 g, the purity 99.9%

The $BaF_2$ flux was doped in a ratio corresponding to 1 mol % per mol of the inorganic oxide.

Figure 26:
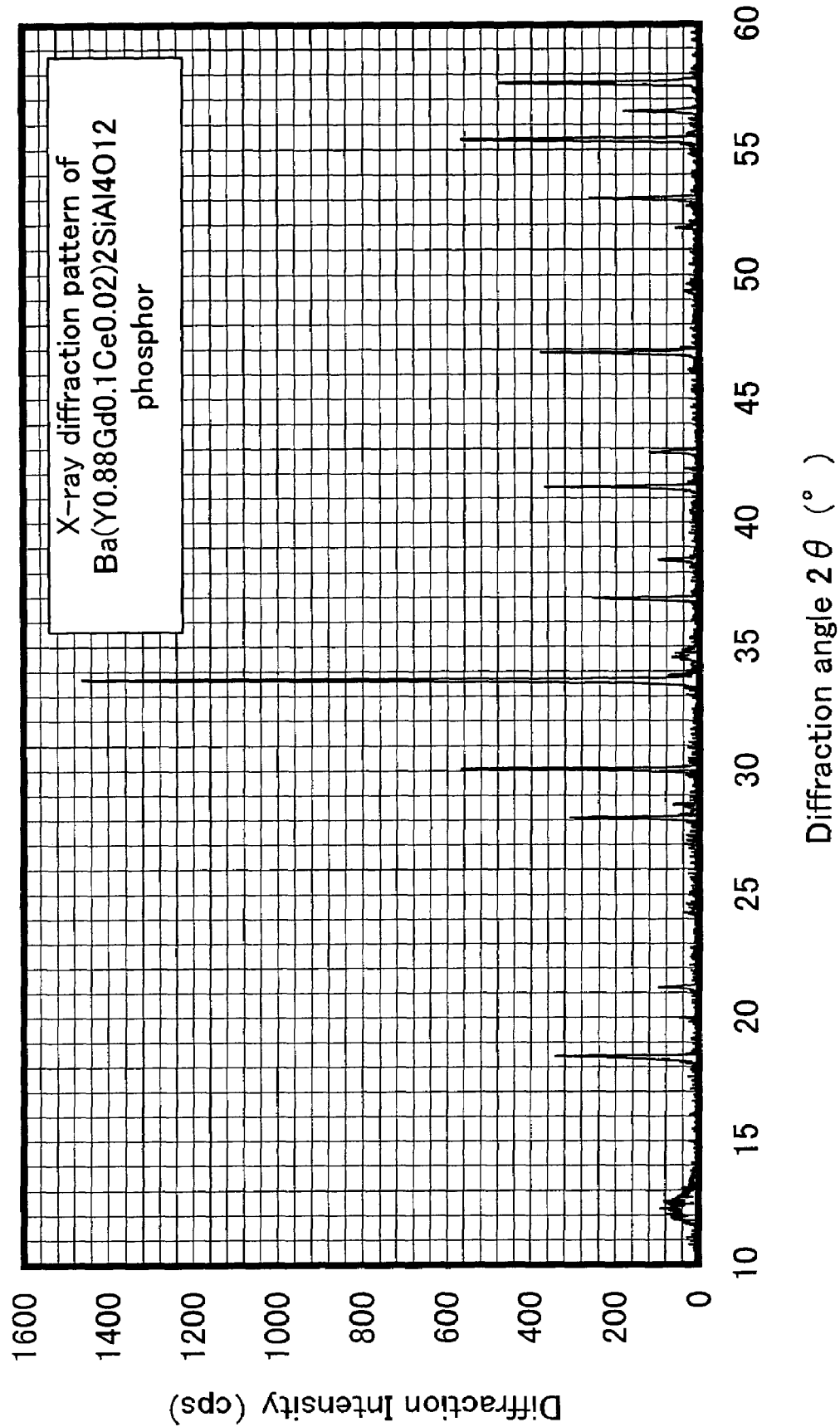
FIG. 26 is the X-ray diffraction pattern of a phosphor of Example 7 of the present invention.

A fired product was obtained in the same manner and conditions as in Example 5. The results of evaluating the crystal structure by X-ray diffraction indicate that the fired product is a composition of a substantially single crystal phase having a garnet crystal structure, as in Example 1. For reference, the X-ray diffraction pattern of the fired product is shown in FIG. 26. A comparison with FIG. 13B indicates that the fired product is a composition of a substantially single crystal phase having a garnet crystal structure.

Figure 27:
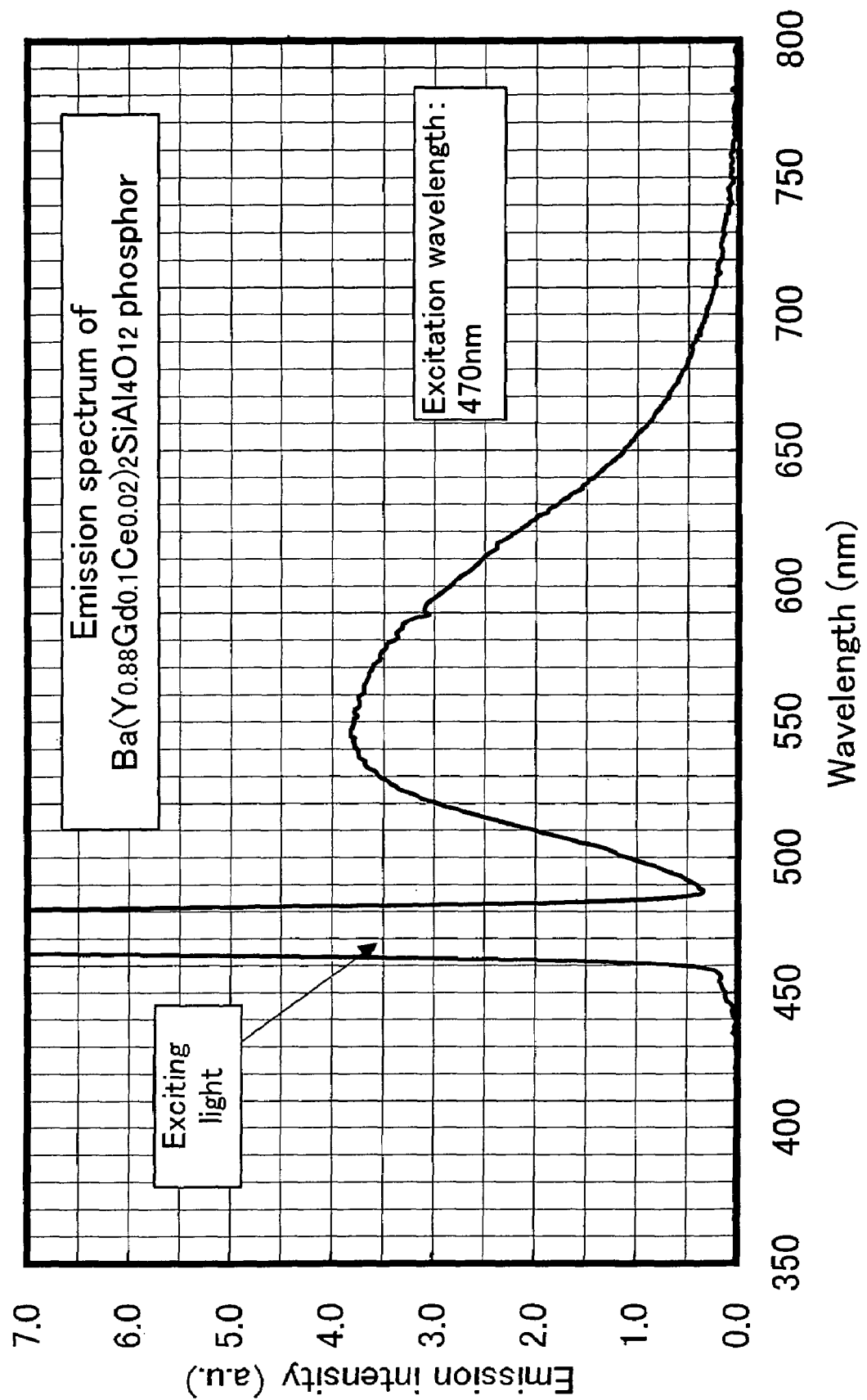
FIG. 27 is the emission spectrum of the phosphor of Example 7 of the present invention.

FIG. 27 shows the emission spectrum of the fired product that was measured under excitation of blue light of 470 nm. FIG. 27 indicates that the fired product is a phosphor emitting light having a luminescent peak in a yellow-green region in the vicinity of 550 nm. The excitation spectrum is not described, but the excitation spectrum was similar to the excitation spectrum of the phosphor of Example 1.

The above results confirmed that the fired product is a $Ba(Y_{0.88}Gd_{0.1}Ce_{0.02})_2SiAl_4O_{12}$ inorganic oxide having a garnet crystal structure, and is a $Ba(Y, Gd)_2SiAl_4O_{12}:Ce^{3+}$ phosphor that is excited with bluish light and emits yellow-greenish light.

Example 8

Hereinafter, a method of producing a $Ba(Y_{0.98}Eu_{0.02})_2SiAl_4O_{12}$ inorganic oxide, that is, a $BaY_2SiAl_4O_{12}:Eu^{3+}$ phosphor, and the characteristics thereof will be described in Example 8 of the present invention.

The following inorganic compound powders were used as the phosphor raw materials (inorganic oxide raw materials).
(1) barium carbonate ($BaCO_3$): 9.87 g, the purity 99.95%
(2) yttrium oxide ($Y_2O_3$): 11.07 g, the purity 99.99%
(3) aluminum oxide ($Al_2O_3$): 10.20 g, the purity 99.99%
(4) silicon dioxide ($SiO_2$): 3.07 g, the purity 99.9%
(5) europium oxide ($Eu_2O_3$): 0.35 g, the purity 99.9%

In Example 8, no flux was used for simplicity.

A fired product was obtained in the same manner and conditions as in Example 1. The results of evaluating the crystal structure by X-ray diffraction indicate that the fired product is a composition having a garnet crystal structure.

Figure 28:
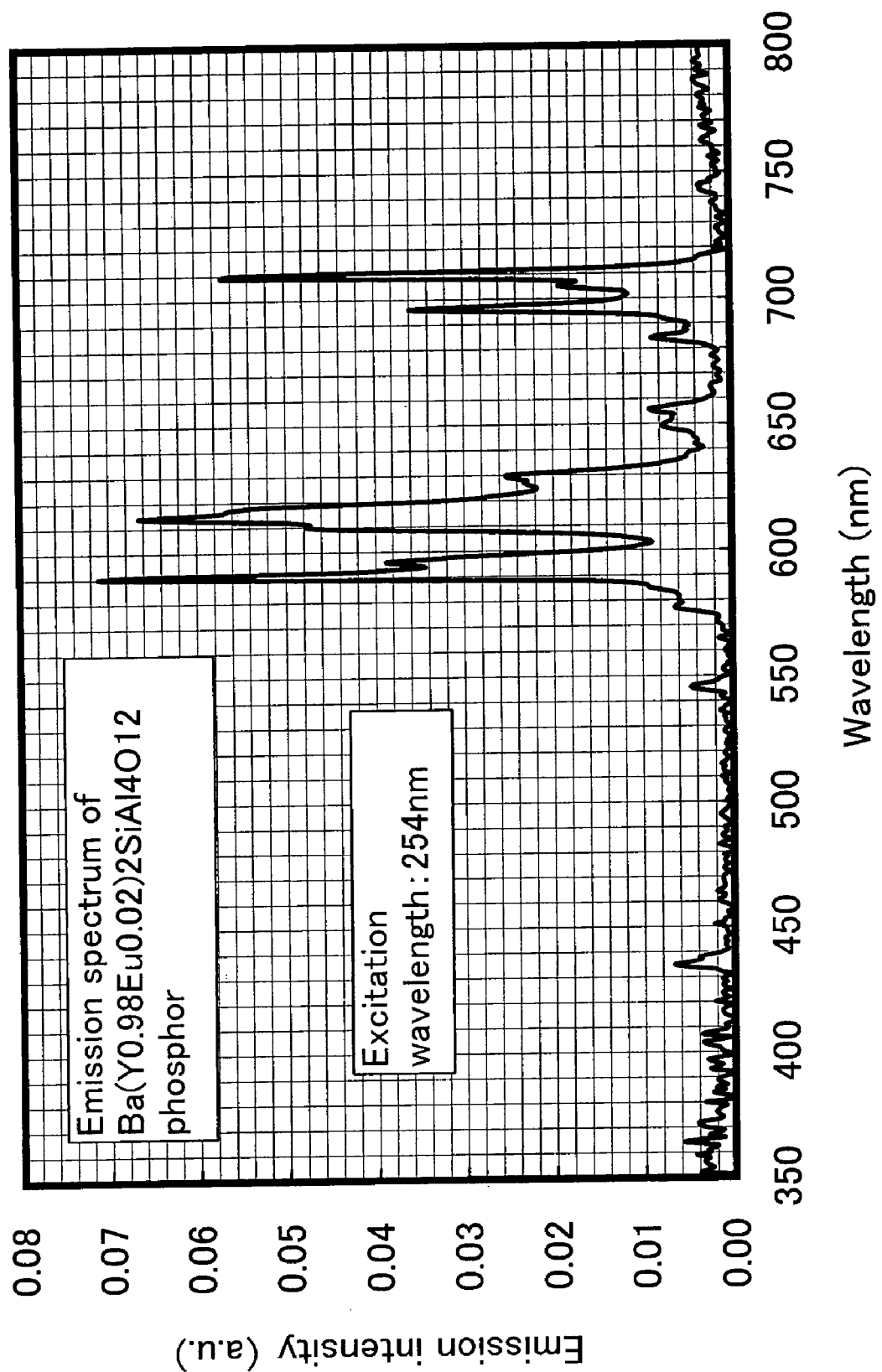
FIG. 28 is the emission spectrum of the phosphor of Example 8 of the present invention.

FIG. 28 shows the emission spectrum of the fired product that was measured under excitation of ultraviolet rays of 254 nm. FIG. 28 indicates that the fired product is a phosphor emitting light with a plurality of bright lines in orange, red to infrared regions in the vicinity of wavelengths 590 nm, 613 nm, 696 nm, and 710 nm.

The above results confirmed that the fired product is a $Ba(Y_{0.98}Eu_{0.02})_2SiAl_4O_{12}$ inorganic oxide, and is a $BaY_2SiAl_4O_{12}:Eu^{3+}$ phosphor that is excited with ultraviolet light and emits redish light with sharp bright lines.

Example 9

Hereinafter, a method of producing a $Ba(Y_{0.98}Tb_{0.02})_2SiAl_4O_{12}$ inorganic oxide, that is, a $BaY_2SiAl_4O_{12}:Tb^{3+}$ phosphor, and the characteristics thereof will be described in Example 9 of the present invention.

The following inorganic compound powders were used as the phosphor raw materials (inorganic oxide raw materials).
(1) barium carbonate ($BaCO_3$): 9.87 g, the purity 99.95%
(2) yttrium oxide ($Y_2O_3$): 11.07 g, the purity 99.99%
(3) aluminum oxide ($Al_2O_3$): 10.20 g, the purity 99.99%
(4) silicon dioxide ($SiO_2$): 3.07 g, the purity 99.9%
(5) terbium oxide ($Tb_4O_7$): 0.37 g, the purity 99.9%

Also in Example 9, no flux was used.

A fired product was obtained in the same manner and conditions as in Example 1. The results of evaluating the crystal structure by X-ray diffraction indicate that the fired product is a composition having a garnet crystal structure.

Figure 29:
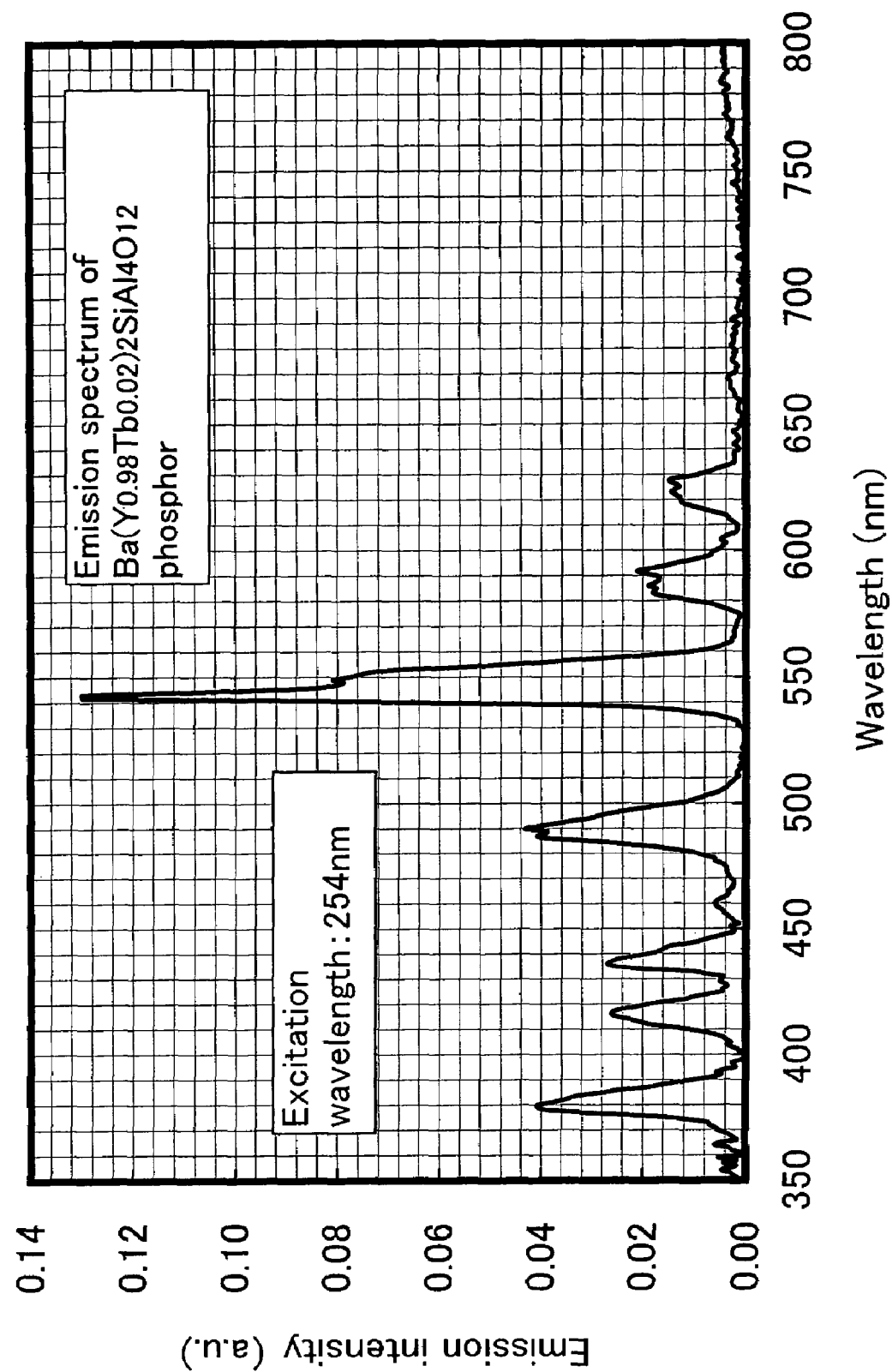
FIG. 29 is the emission spectrum of the phosphor of Example 9 of the present invention.

FIG. 29 shows the emission spectrum of the fired product that was measured under excitation of ultraviolet rays of 254 nm. FIG. 29 indicates that the fired product is a phosphor emitting light with a plurality of bright lines having a central peak in a green region in the vicinity of a wavelength 542 nm.

The above results confirmed that the fired product is a $Ba(Y_{0.98}Tb_{0.02})_2SiAl_4O_{12}$ inorganic oxide, and is a $BaY_2SiAl_4O_{12}:Tb^{3+}$ phosphor that is excited with ultraviolet light and emits greenish light with sharp bright lines.

Example 10

Hereinafter, a method of producing a $Mg(Y_{0.98}Ce_{0.02})_2GeAl_4O_{12}$ inorganic oxide, that is, a $MgY_2GeAl_4O_{12}:Ce^{3+}$ phosphor, and the characteristics thereof will be described in Example 10 of the present invention.

The following inorganic compound powders were used as the phosphor raw materials (inorganic oxide raw materials).
(1) basic magnesium carbonate (($MgCO_3)_4 \cdot Mg(OH)_2 \cdot 3H_2O$): 4.80 g, the purity >99.9%
(2) yttrium oxide ($Y_2O_3$): 11.07 g, the purity 99.99%
(3) aluminum oxide ($Al_2O_3$): 10.20 g, the purity 99.99%
(4) germanium oxide ($GeO_2$): 5.23 g, the purity 99.995%
(5) cerium oxide ($CeO_2$): 0.34 g, the purity 99.99%

Also in Example 10, no flux was used.

Figure 30:
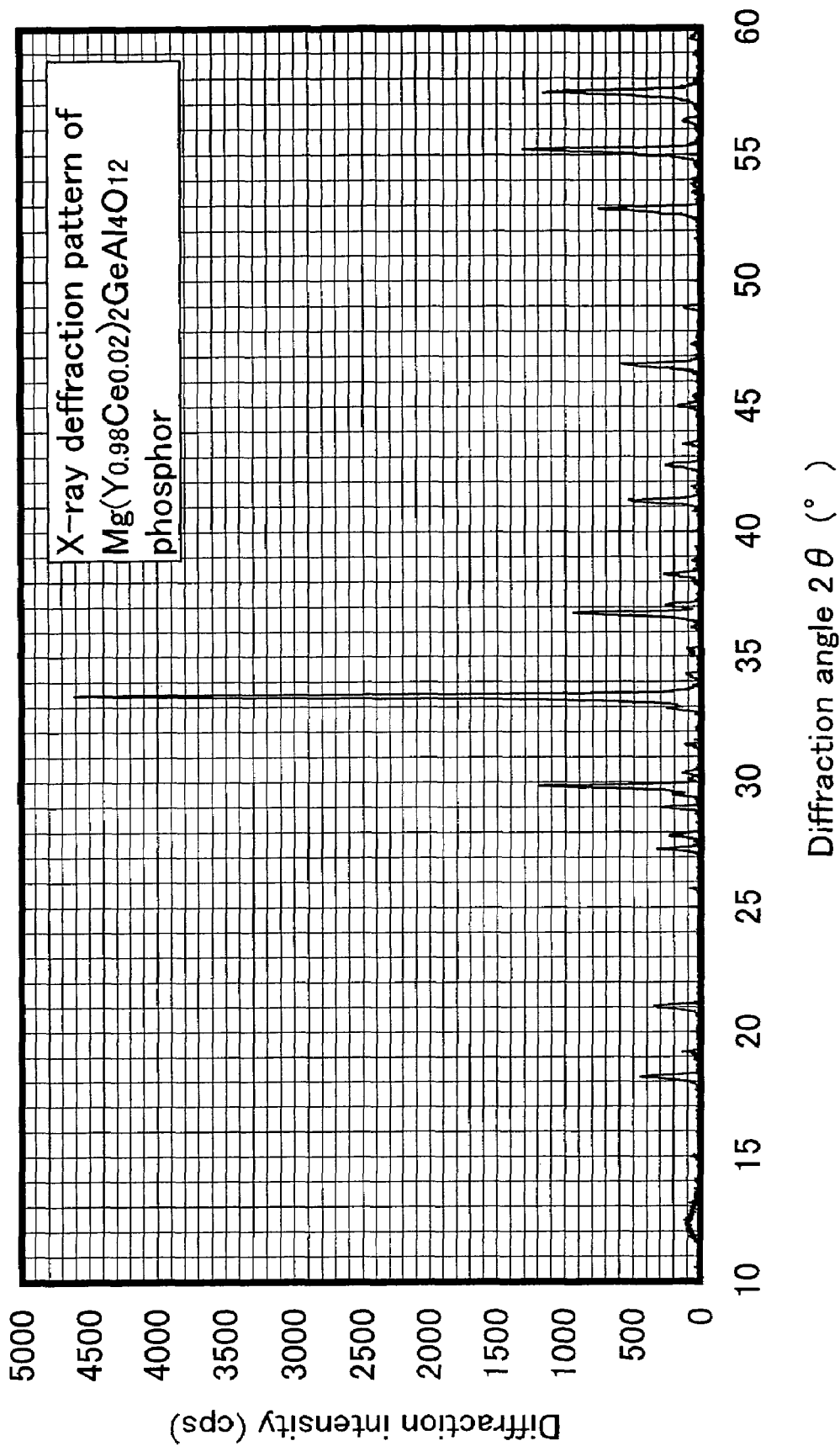
FIG. 30 is the X-ray diffraction pattern of a phosphor of Example 10 of the present invention.

A fired product was obtained in the same manner and conditions as in Example 1. The results of evaluating the crystal structure by X-ray diffraction indicate that the fired product is a composition having a crystal structure of the garnet. For reference, the X-ray diffraction pattern of the fired product is shown in FIG. 30. A comparison with FIG. 13B indicates that the fired product is a composition of a substantially single crystal phase having a garnet crystal structure.

In FIG. 30, some diffraction peaks that seem to be due to a different type of compound are observed, but this is because firing was not performed under the optimal conditions.

Figure 31:
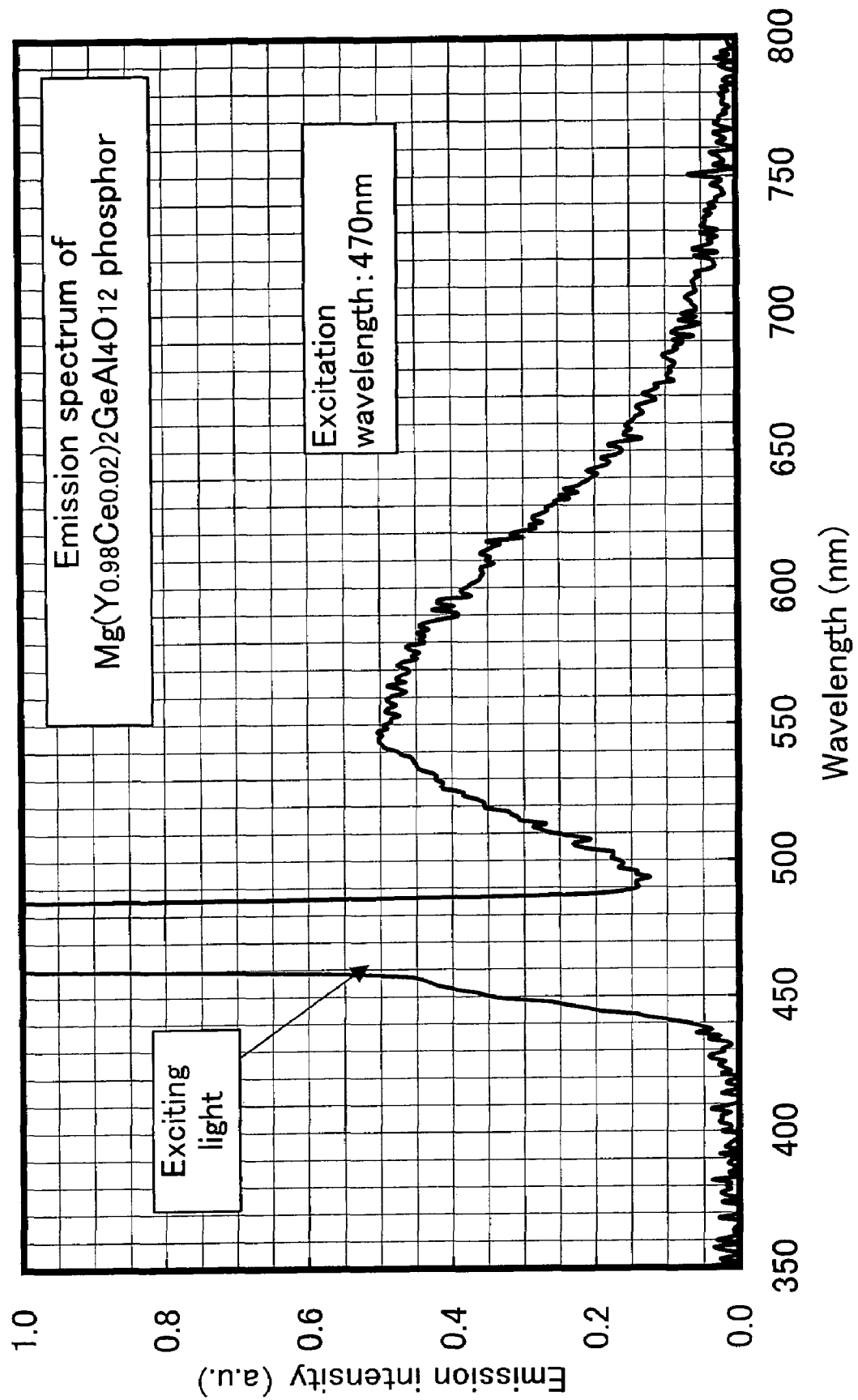
FIG. 31 is the emission spectrum of the phosphor of Example 10 of the present invention.

FIG. 31 shows the emission spectrum of the fired product that was measured under excitation of blue light of 470 nm. FIG. 31 indicates that the fired product is a phosphor having a luminescent peak in the vicinity of a wavelength 545 nm.

The above results confirmed that the fired product is a $Mg(Y_{0.98}Ce_{0.02})_2GeAl_4O_{12}$ inorganic oxide having a garnet crystal structure, and is a $MgY_2GeAl_4O_{12}:Ce^{3+}$ phosphor that is excited with bluish light and emits yellow-greenish light.

Example 11

Hereinafter, a method of producing a $Ba(Y_{0.98}Ce_{0.02})_2SiGa_4O_{12}$ inorganic oxide, that is, a $BaY_2SiGa_4O_{12}:Ce^{3+}$ phosphor, and the characteristics thereof will be described in Example 11 of the present invention.

The following inorganic compound powders were used as the phosphor raw materials (inorganic oxide raw materials).
(1) barium oxide ($BaCO_3$): 9.87 g, the purity 99.95%
(2) yttrium oxide ($Y_2O_3$): 11.07 g, the purity 99.99%
(3) gallium oxide ($Ga_2O_3$): 18.74 g, the purity 99.99%
(4) silicon dioxide ($SiO_2$): 3.07 g, the purity 99.9%
(5) cerium oxide ($CeO_2$): 0.34 g, the purity 99.99%

Also in Example 11, no flux was used.

Figure 32B:
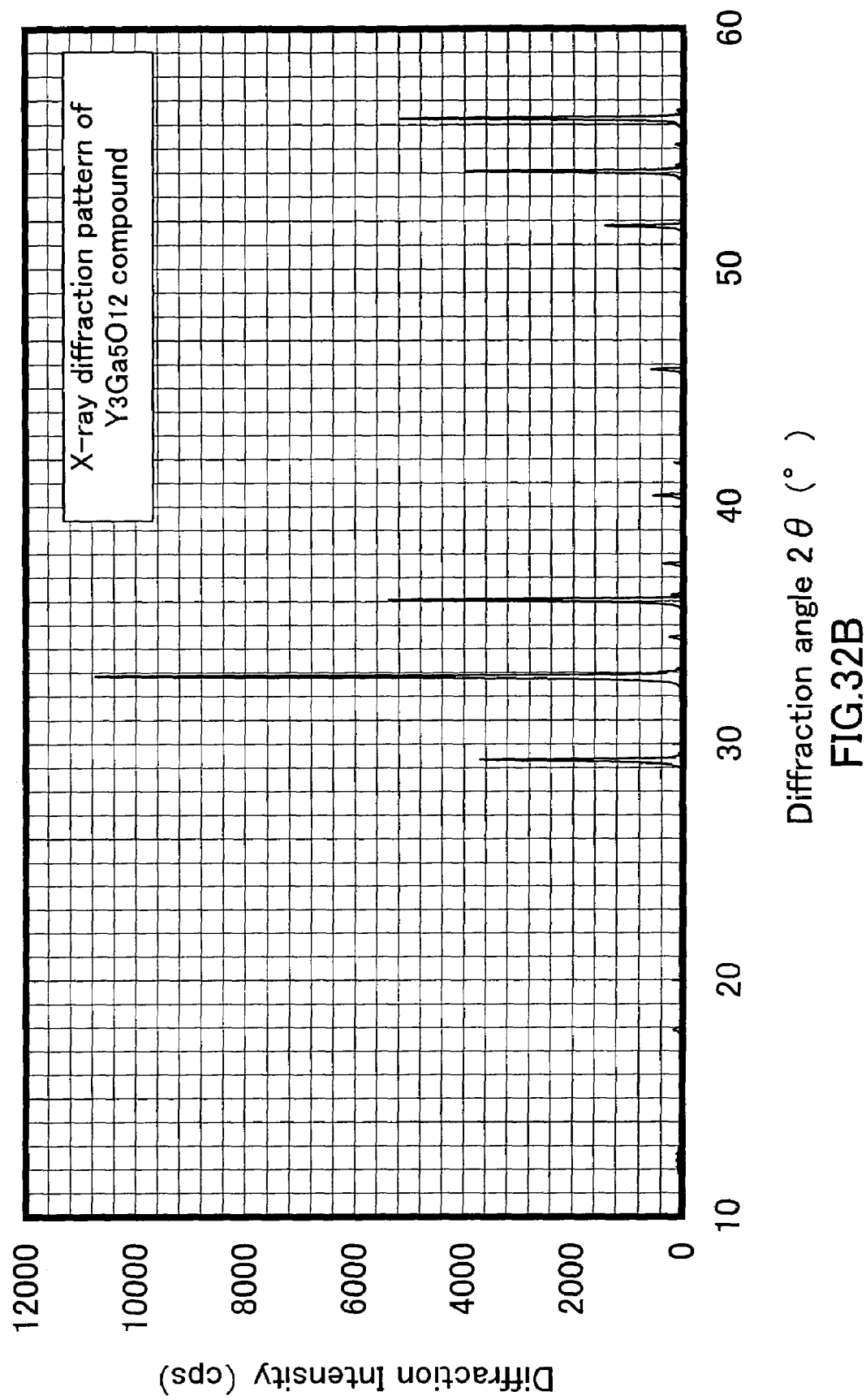
FIG. 32B is an X-ray diffraction pattern of a phosphor $[Y_{0.98}Ga_5O_{12}]$ of Example 11 of the present invention.

A fired product was obtained in the same manner and conditions as in Example 1. The results of evaluating the crystal structure by X-ray diffraction indicate that the fired product is a composition having a garnet crystal structure. For reference, the X-ray diffraction pattern of the fired product is shown in FIG. 32A. For comparison, FIG. 32B shows the X-ray diffraction pattern of the known $Y_3Ga_5O_{12}$ compound having the garnet structure. A comparison with FIG. 32B indicates that the fired product is a composition of a single crystal phase having the garnet structure.

Figure 33:
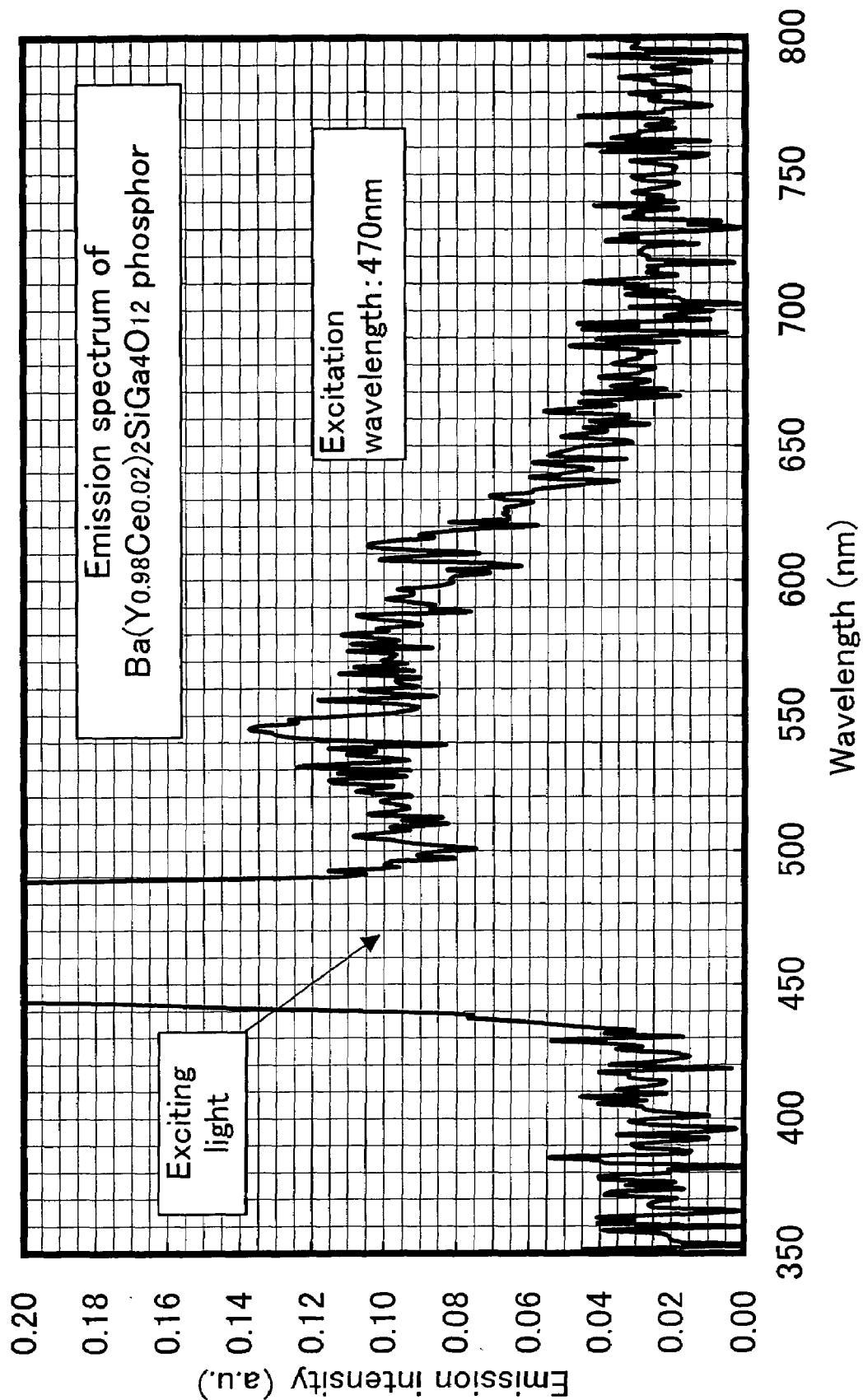
FIG. 33 is the emission spectrum of the phosphor of Example 11 of the present invention.

FIG. 33 shows the emission spectrum of the fired product that was measured under excitation of blue light of 470 nm. Although the light intensity under the excitation of blue light of 470 nm is weak, FIG. 33 indicates that the fired product is a phosphor having a luminescent peak in the vicinity of a wavelength 545 nm.

The above results confirmed that the fired product is a $Ba(Y_{0.98}Ce_{0.02})_2SiGa_4O_{12}$ inorganic oxide having a garnet crystal structure, and is a $BaY_2SiGa_4O_{12}:Ce^{3+}$ phosphor that is excited with bluish light and emits yellow-greenish light.

Example 12

Hereinafter, a method of producing a $Mg(Y_{0.98}Ce_{0.02})_2SiGaAl_3O_{12}$ inorganic oxide, that is, a $MgY_2SiGaAl_3O_{12}:Ce^{3+}$ phosphor, and the characteristics thereof will be described in Example 12 of the present invention.

The following inorganic compound powders were used as the phosphor raw materials (inorganic oxide raw materials).
(1) basic magnesium carbonate (($MgCO_3)_4.Mg(OH)_2$. $3H_2O$): 4.80 g, the purity >99.9%
(2) yttrium oxide ($Y_2O_3$): 11.07 g, the purity 99.99%
(3) gallium oxide ($Ga_2O_3$): 4.69 g, the purity 99.99%
(4) aluminum oxide ($Al_2O_3$): 7.65 g, the purity 99.99%
(5) silicon dioxide ($SiO_2$): 3.07 g, the purity 99.9%
(6) cerium oxide ($CeO_2$): 0.34 g, the purity 99.99%
Also in Example 12, no flux was used.

Figure 34:
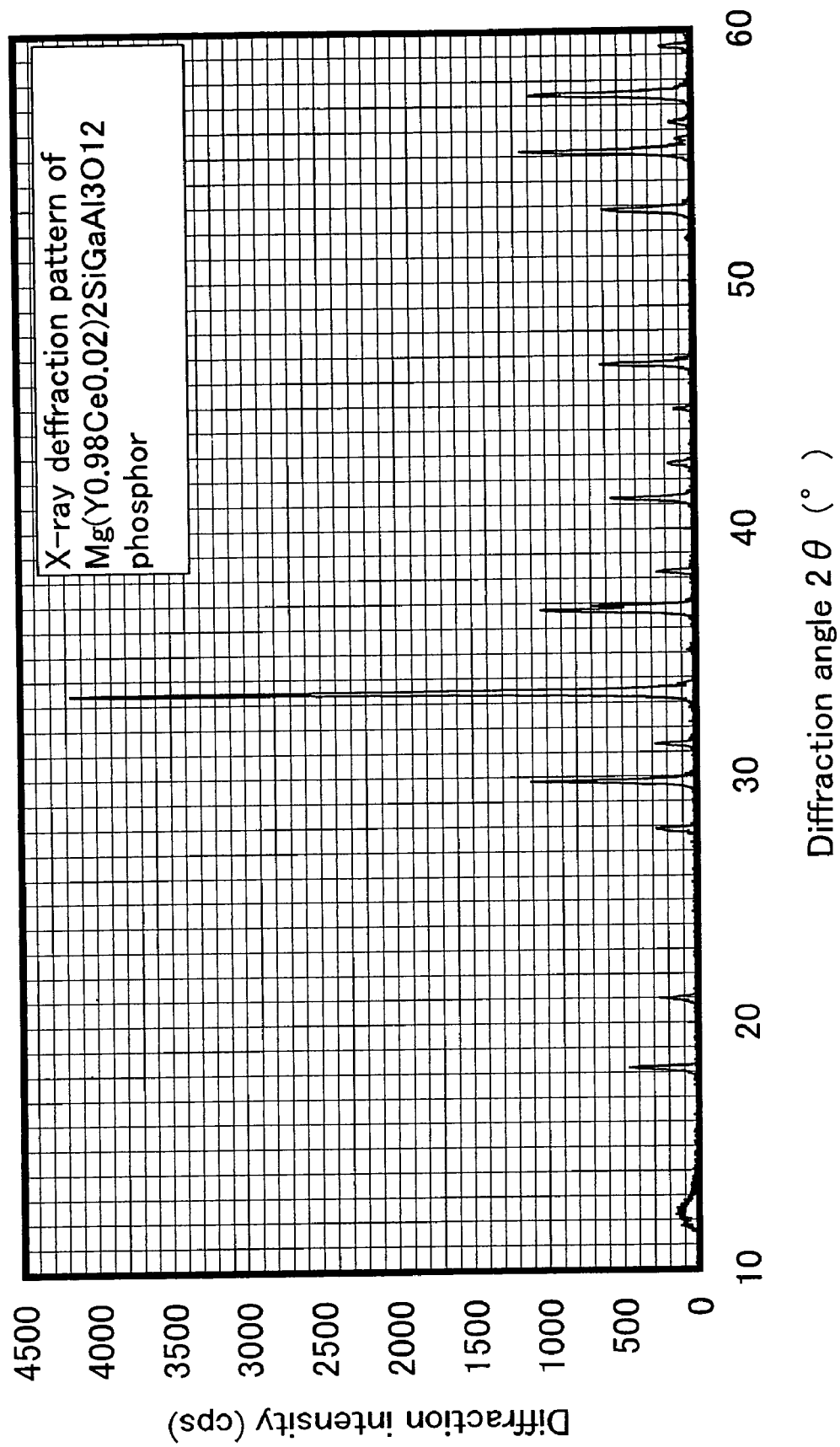
FIG. 34 is the X-ray diffraction pattern of a phosphor of Example 12 of the present invention.

A fired product was obtained in the same manner and conditions as in Example 1. The evaluation results of the crystal structure by X-ray diffraction indicate that the fired product is a composition having a garnet crystal structure. For reference, the X-ray diffraction pattern of the fired product is shown in FIG. 34. A comparison with FIG. 13B or 32B indicates that the fired product is a composition of a substantially single crystal phase having the garnet structure.

Figure 35:
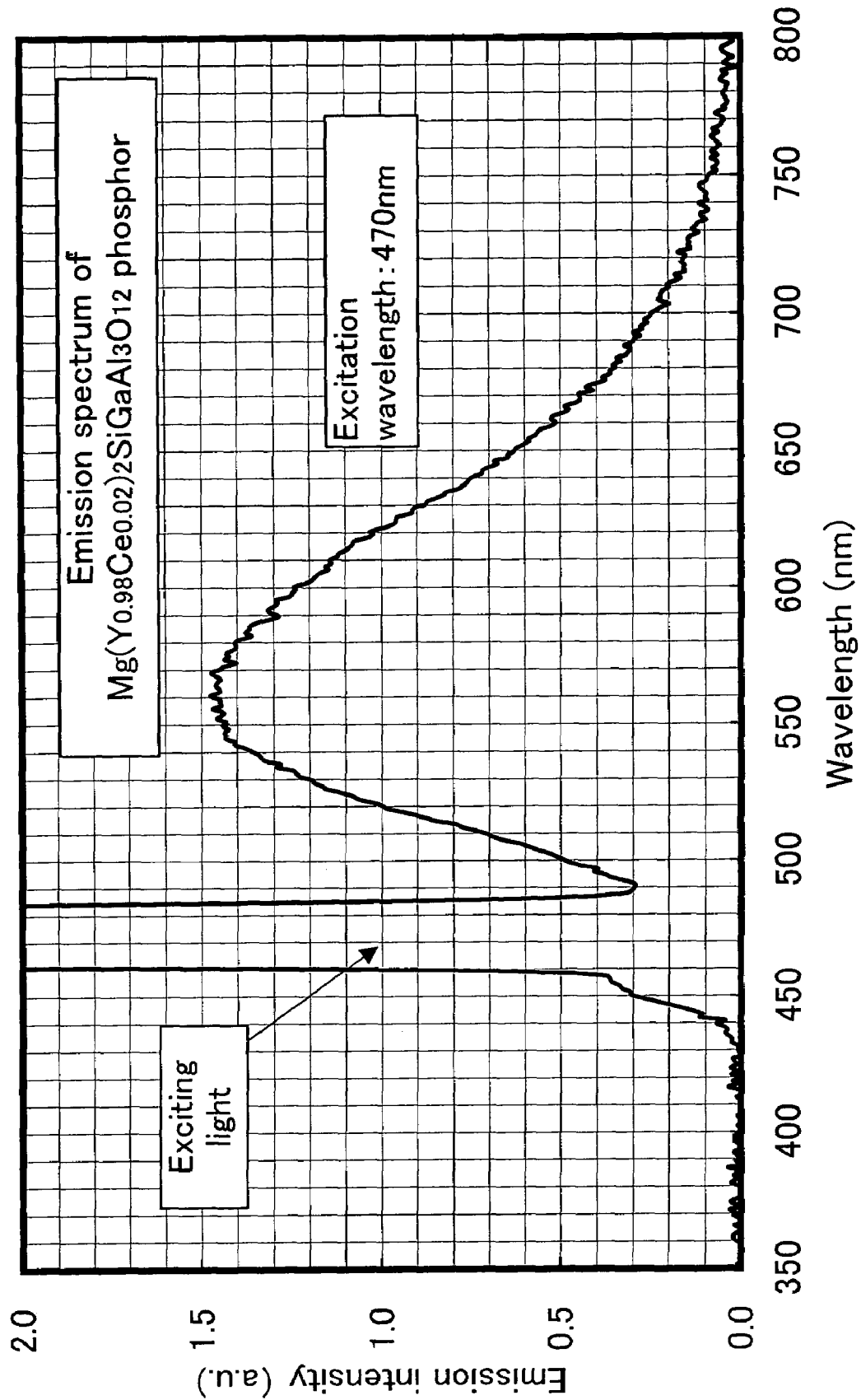
FIG. 35 is the emission spectrum of the phosphor of Example 12 of the present invention.

FIG. 35 shows the emission spectrum of the fired product that was measured under excitation of blue light of 470 nm. FIG. 35 indicates that the fired product is a phosphor having a luminescent peak in the vicinity of a wavelength 565 nm.

The above results confirmed that the fired product is a $Mg(Y_{0.98}Ce_{0.02})_2SiGaAl_3O_{12}$ inorganic oxide having a garnet crystal structure, and is a $MgY_2SiGaAl_3O_{12}:Ce^{3+}$ phosphor that is excited with bluish light and emits yellowish light.

Example 13

Hereinafter, a method of producing a $Mg(Y_{0.98}Ce_{0.02})_2SiIn_{0.4}Al_{3.6}O_{12}$ inorganic oxide, that is, a $MgY_2SiIn_{0.4}Al_{3.6}O_{12}:Ce^{3+}$ phosphor, and the characteristics thereof will be described in Example 13 of the present invention.

The following inorganic compound powders were used as the phosphor raw materials (inorganic oxide raw materials).
(1) basic magnesium carbonate (($MgCO_3)_4.Mg(OH)_2$. $3H_2O$): 4.80 g, the purity>99.9%
(2) yttrium oxide ($Y_2O_3$): 11.07 g, the purity 99.99%
(3) indium oxide ($In_2O_3$): 2.78 g, the purity 99.99%
(4) aluminum oxide ($Al_2O_3$): 9.18 g, the purity 99.99%
(5) silicon dioxide ($SiO_2$): 3.07 g, the purity 99.9%
(6) cerium oxide ($CeO_2$): 0.34 g, the purity 99.99%
Also in Example 13, no flux was used.

Figure 36:
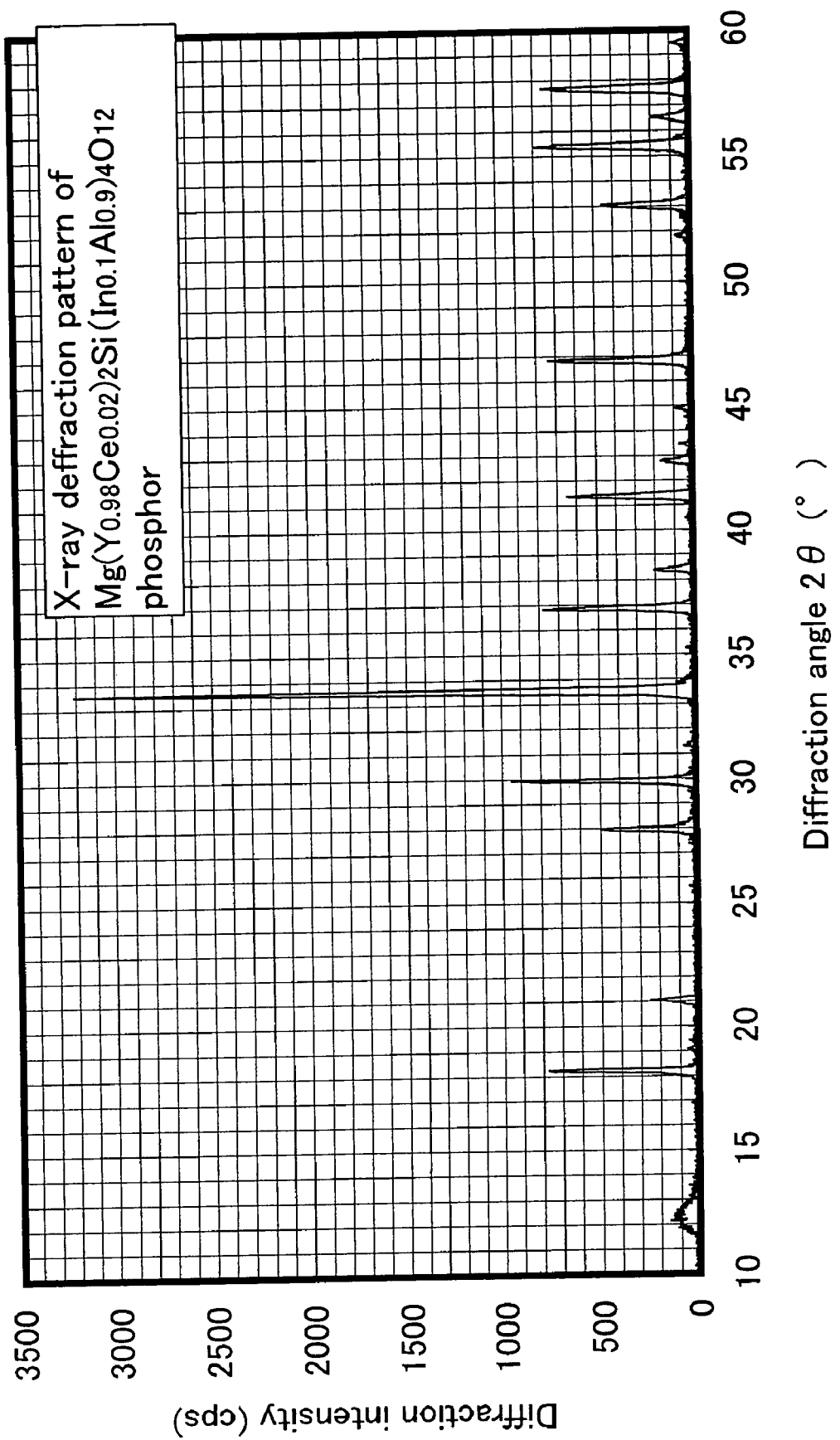
FIG. 36 is the X-ray diffraction pattern of a phosphor of Example 13 of the present invention.

A fired product was obtained in the same manner and conditions as in Example 1. The results of evaluating the crystal structure by X-ray diffraction indicate that the fired product is a composition having a garnet crystal structure. For reference, the X-ray diffraction pattern of the fired product is shown in FIG. 36. A comparison with FIG. 13B indicates that the fired product is a composition of a substantially single crystal phase having the garnet structure.

Figure 37:
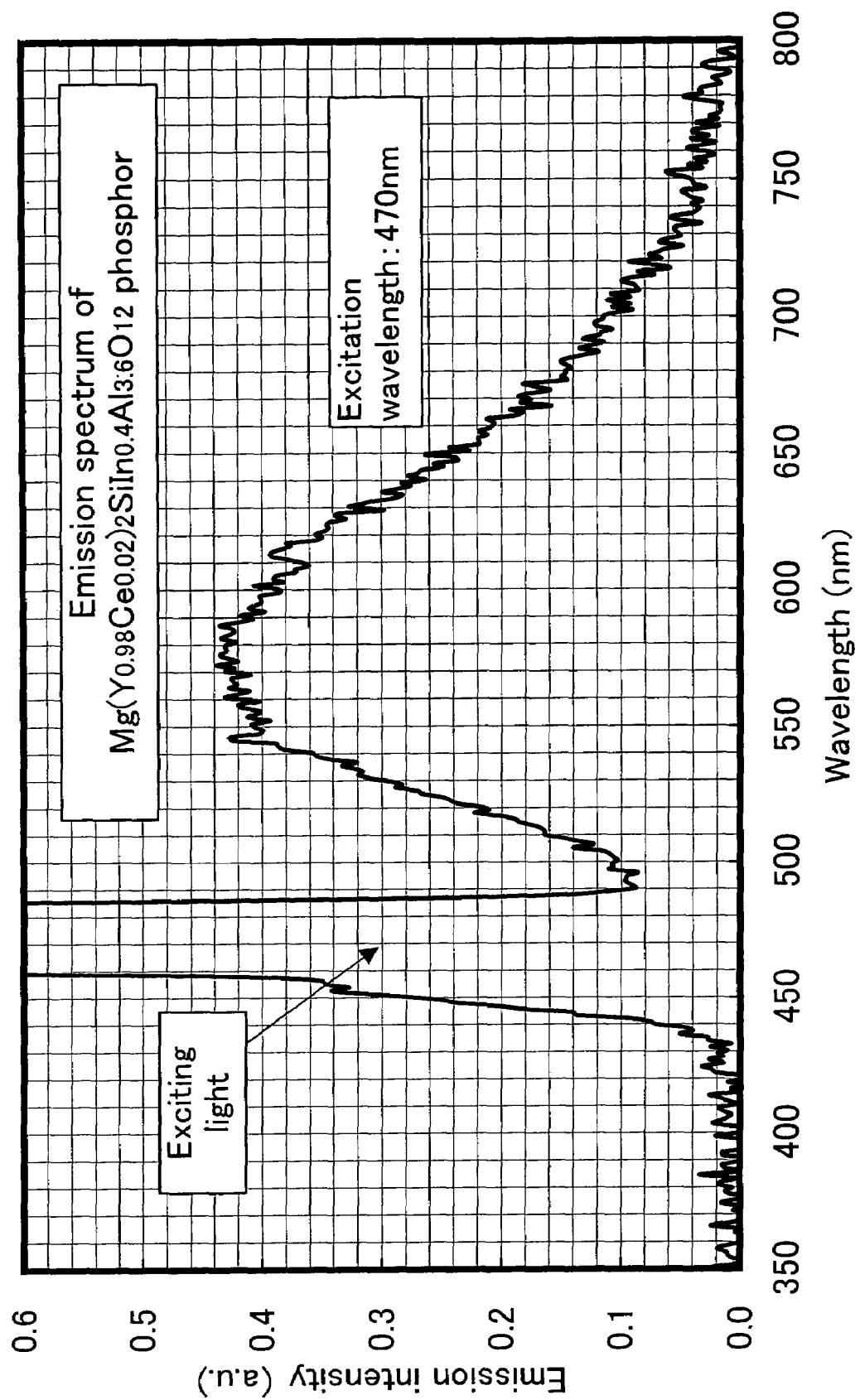
FIG. 37 is the emission spectrum of the phosphor of Example 13 of the present invention.

FIG. 37 shows the emission spectrum of the fired product that was measured under excitation of blue light of 470 nm. FIG. 37 indicates that the fired product is a phosphor having a luminescent peak in the vicinity of a wavelength 580 nm.

The above results confirmed that the fired product is a $Mg(Y_{0.98}Ce_{0.02})_2SiIn_{0.4}Al_{3.6}O_{12}$ inorganic oxide having a garnet crystal structure, and is a $MgY_2SiIn_{0.4}Al_{3.6}O_{12}:Ce^{3+}$ phosphor that is excited with bluish light and emits yellowish light.

Example 14

Hereinafter, a method of producing a $BaY_2SiB_4O_{12}$ inorganic oxide and the characteristics thereof will be described in Example 14 of the present invention.

The following inorganic compound powders were used as the phosphor raw materials (inorganic oxide raw materials).
(1) barium carbonate ($BaCO_3$): 9.87 g, the purity 99.95%
(2) yttrium oxide ($Y_2O_3$): 11.29 g, the purity 99.99%
(3) boric acid ($H_3BO_3$): 12.37 g, the purity 99.99%
(4) silicon dioxide ($SiO_2$): 3.07 g, the purity 99.9%
Also in Example 14, no flux was used.

Figure 38A:
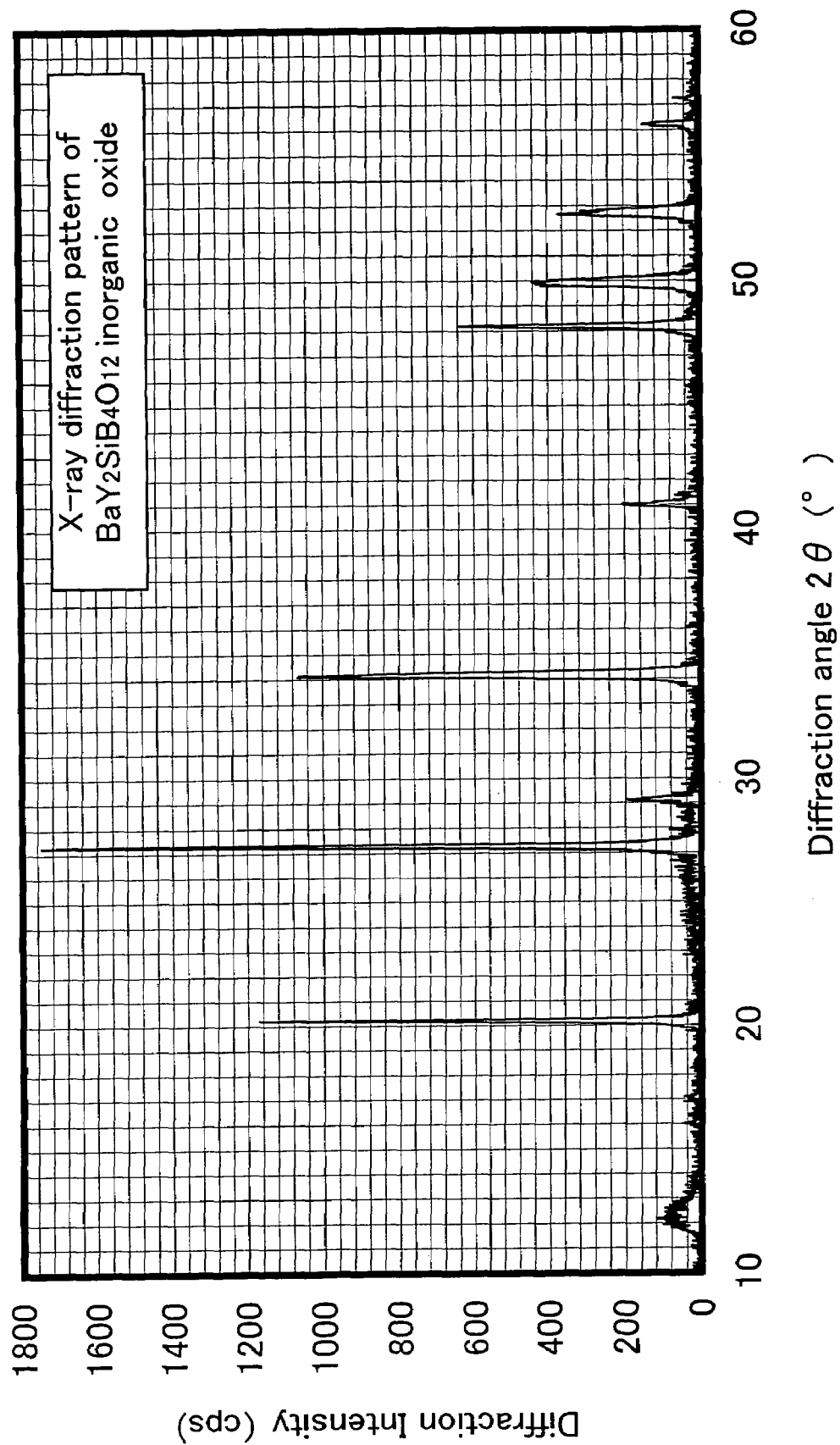
FIG. 38A is the X-ray diffraction pattern of an inorganic oxide $[BaY_2SiB_4O_{12}]$ of Example 14 of the present invention.
Figure 38B:
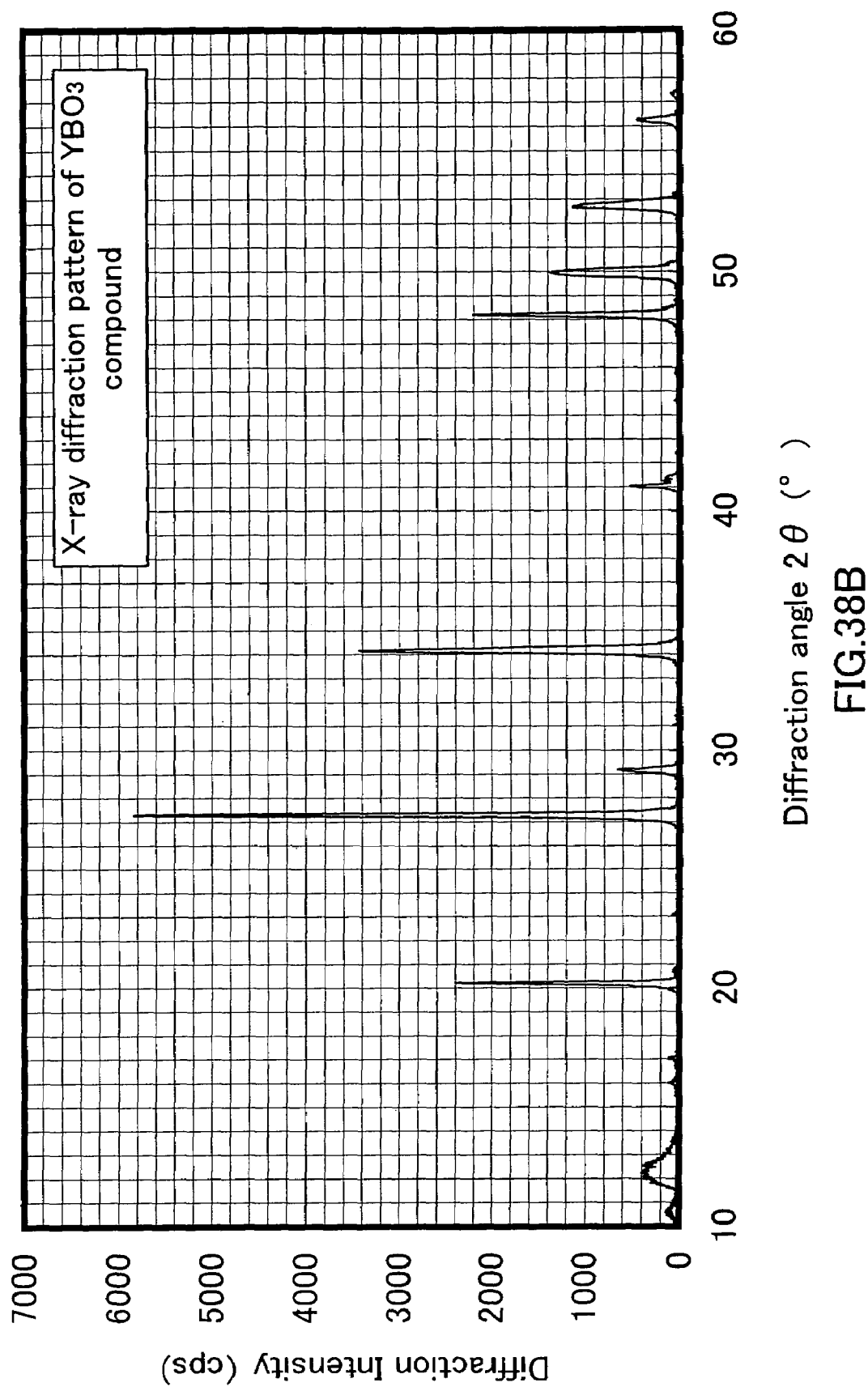
FIG. 38B is an X-ray diffraction pattern of an inorganic oxide $[YBO_3]$ of Example 14 of the present invention.

A fired product was obtained in the same manner and conditions as in Example 1 except that the firing temperature was 1200° C. The results of evaluating the crystal structure by X-ray diffraction indicate that the fired product is a composition having the same structure as that of $YBO_3$ compounds having a hexagonal crystal structure. For reference, the X-ray diffraction pattern of the fired product is shown in FIG. 38A, and FIG. 38B shows the X-ray diffraction pattern of a $YBO_3$ compound synthesized at a temperature of 1500° C. A comparison with FIG. 38B indicates that the fired product is a composition of a single crystal phase having the same crystal structure as that of the $YBO_3$ compound.

The above results confirmed that the fired product is a $BaY_2SiB_4O_{12}$ inorganic oxide having the same crystal structure as that of the $YBO_3$ compound.

Example 15

Hereinafter, a method of producing a $Sr(Gd_{0.98}Eu_{0.02})_2SiB_4O_{12}$ inorganic oxide, that is, a $SrGd_2SiB_4O_{12}:Eu^{3+}$ phosphor, and the characteristics thereof will be described in Example 15 of the present invention.

The following inorganic compound powders were used as the phosphor raw materials (inorganic oxide raw materials).
(1) strontium oxide ($SrCO_3$): 7.38 g, the purity 99.9%
(2) gadolinium oxide ($Gd_2O_3$): 17.76 g, the purity 99.9%
(3) boric acid ($H_3BO_3$): 12.37 g, the purity 99.99%
(4) silicon dioxide ($SiO_2$): 3.07 g, the purity 99.9%
(5) europium oxide ($Eu_2O_3$): 0.35 g, the purity 99.9%
Also in Example 15, no flux was used.

Figure 39A:
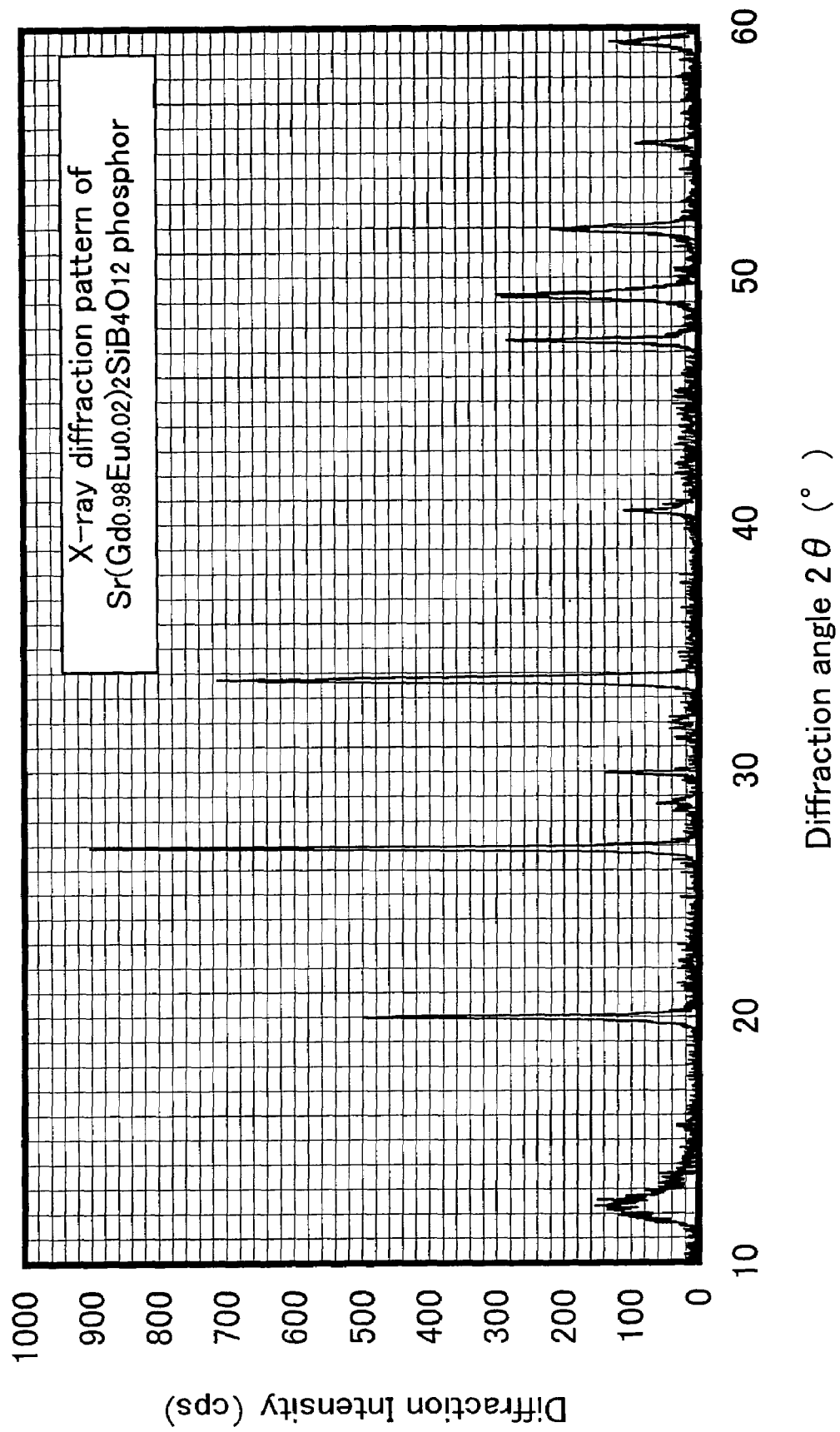
FIG. 39A is the X-ray diffraction pattern of a phosphor $[Sr(Gd_{0.98}Eu_{0.02})_2SiB_4O_{12}]$ of Example 15 of the present invention.
Figure 39B:
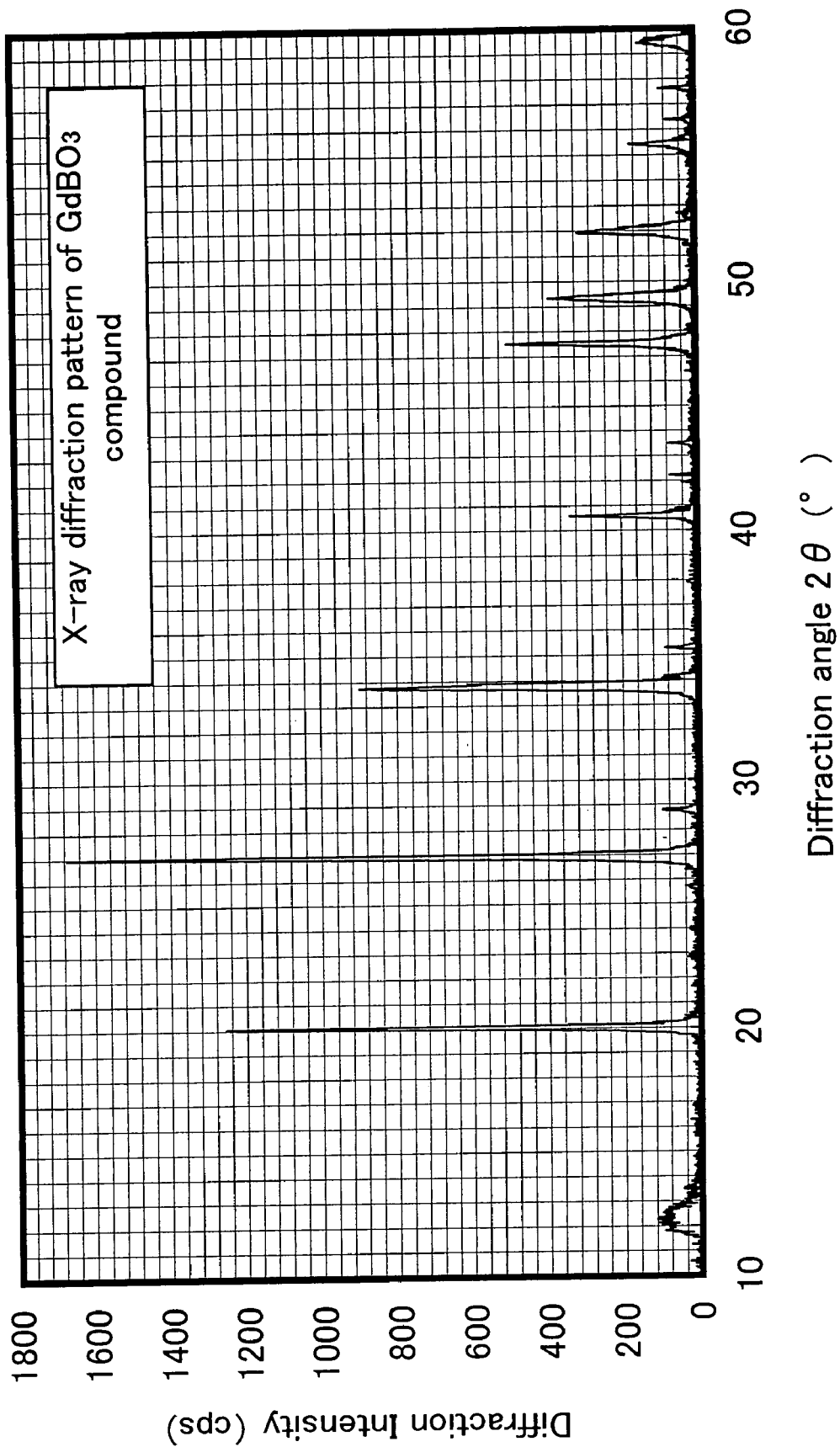
FIG. 39B is the X-ray diffraction pattern of a phosphor $[GdBO_3]$ of Example 15 of the present invention.

A fired product was obtained in the same manner and conditions as in Example 1 except that the firing temperature was 1000° C. The results of evaluating the crystal structure by X-ray diffraction indicate that the fired product is a composition having the same structure as that of $GdBO_3$ compounds having a hexagonal crystal structure. For reference, the X-ray diffraction pattern of the fired product is shown in FIG. 39A, and FIG. 39B shows the X-ray diffraction pattern of a $GdBO_3$ compound synthesized at a temperature of 1500° C. A comparison with FIG. 39B indicates that the fired product is a composition of a single crystal phase having the same crystal structure as that of the GdBO$_3$ compound.

Figure 40:
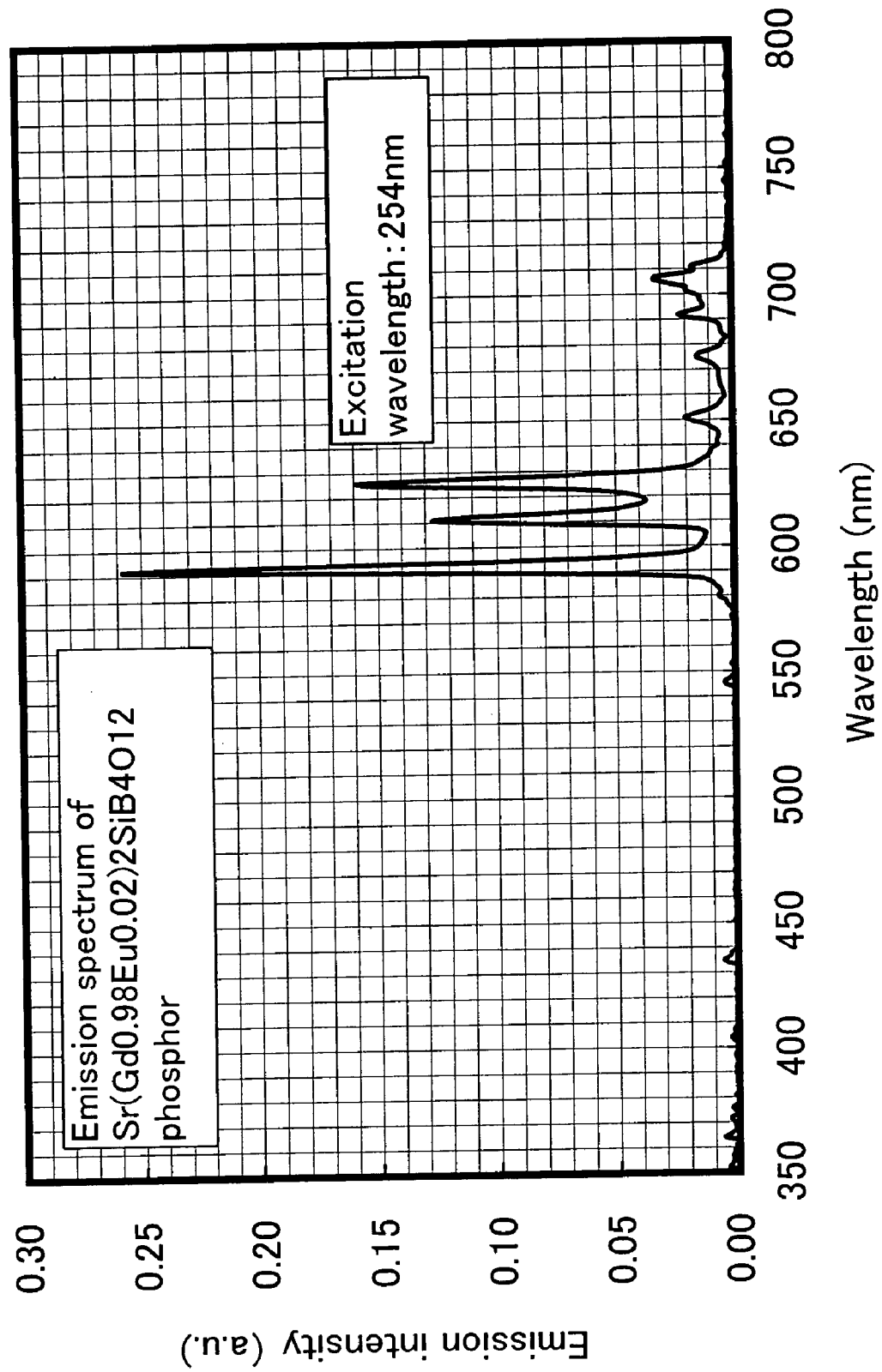
FIG. 40 is the emission spectrum of the phosphor of Example 15 of the present invention.

FIG. 40 shows the emission spectrum of the fired product that was measured under excitation of ultraviolet rays of 254 nm. FIG. 40 indicates that the fired product is a phosphor emitting light with a plurality of bright lines in orange to red regions in the vicinity of the wavelengths 592 nm, 611 nm, and 626 nm.

The above results confirmed that the fired product is a Sr(Gd$_{0.98}$Eu$_{0.02}$)$_2$SiB$_4$O$_{12}$ inorganic oxide having the same crystal structure as that of the GdBO$_3$ compound, and is a SrGd$_2$SiB$_4$O$_{12}$:Eu$^{3+}$ phosphor that is excited with ultraviolet light and emits redish light with sharp bright lines.

Example 16

Hereinafter, a method of producing a Sr(Gd$_{0.98}$Eu$_{0.02}$)$_2$SiAl$_4$O$_{12}$ inorganic oxide, that is, a SrGd$_2$SiAl$_4$O$_{12}$:Eu$^{3+}$ phosphor, and the characteristics thereof will be described in Example 16 of the present invention.

The following inorganic compound powders were used as the phosphor raw materials (inorganic oxide raw materials).
(1) strontium oxide (SrCO$_3$): 7.38 g, the purity 99.9%
(2) gadolinium oxide (Gd$_2$O$_3$): 17.76 g, the purity 99.9%
(3) aluminum oxide (Al$_2$O$_3$): 10.20 g, the purity 99.99%
(4) silicon dioxide (SiO$_2$): 3.07 g, the purity 99.9%
(5) europium oxide (Eu$_2$O$_3$): 0.35 g, the purity 99.9%
Also in Example 16, no flux was used.

Figure 41A:
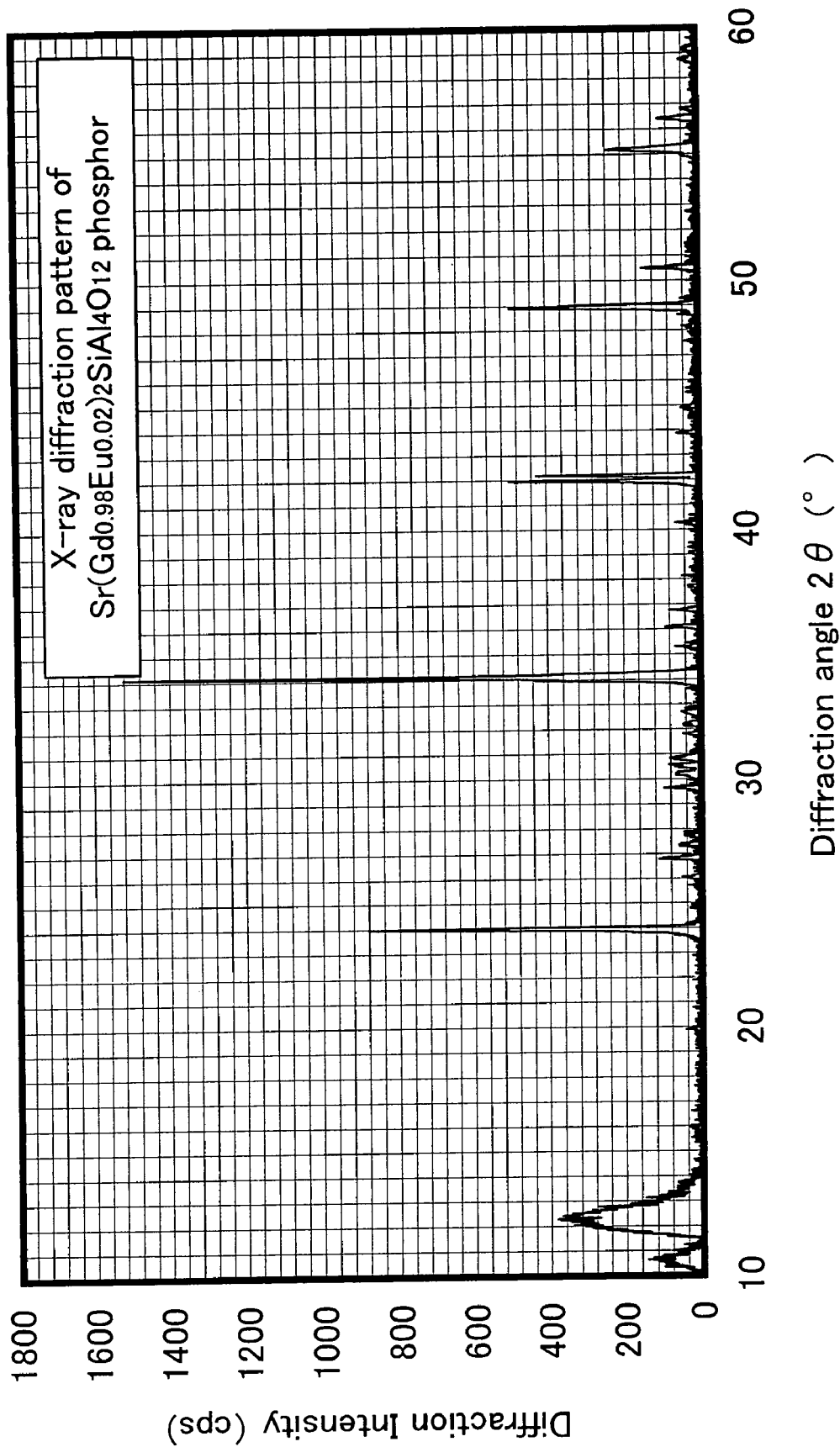
FIG. 41A is the X-ray diffraction pattern of a phosphor $[Sr(Gd_{0.98}Eu_{0.02})_2SiAl_4O_{12}]$ of Example 16 of the present invention.
Figure 41B:
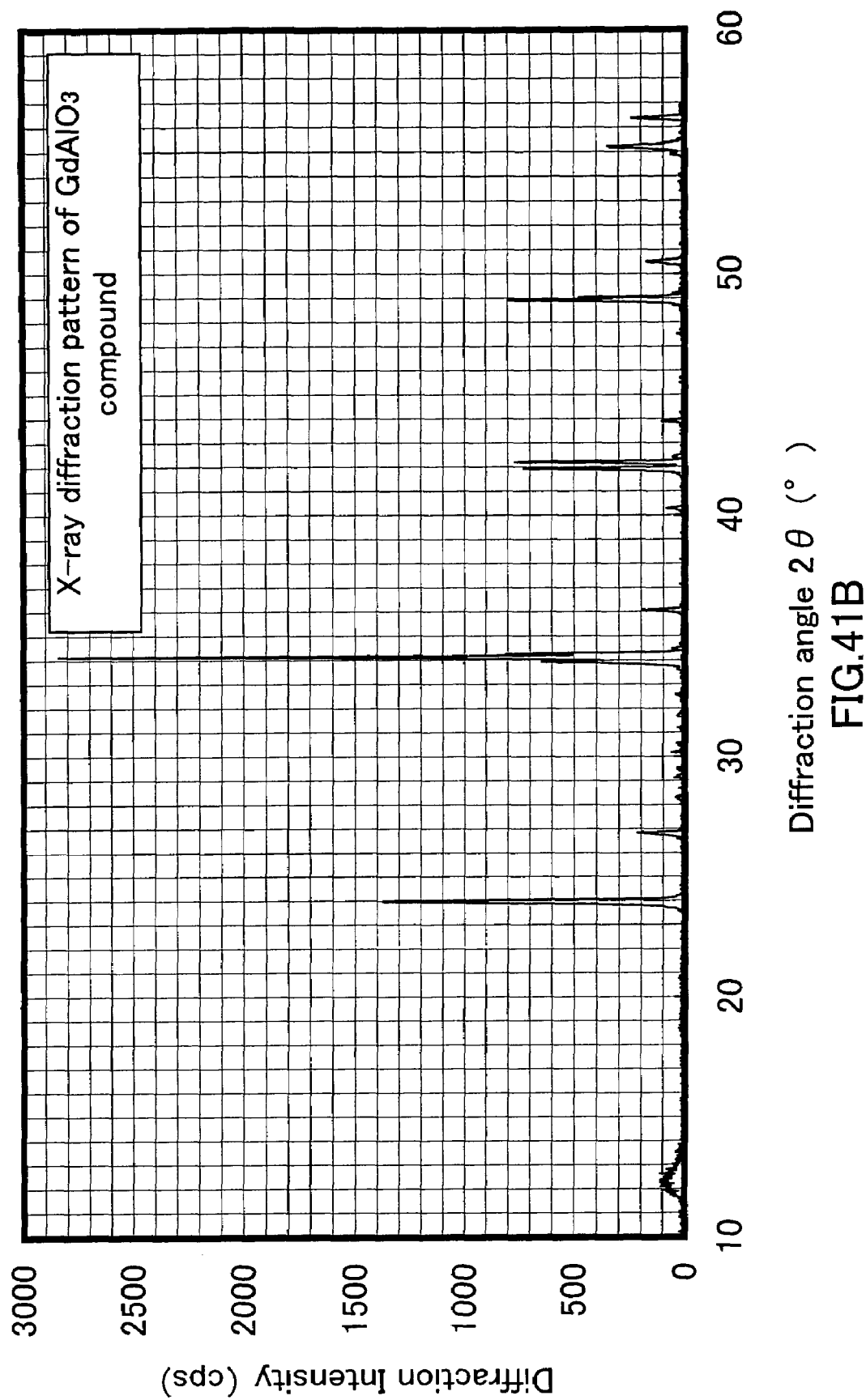
FIG. 41B is the X-ray diffraction pattern of a phosphor $[GdAl_3]$ of Example 16 of the present invention.

A fired product was obtained in the same manner and conditions as in Example 1. The results of evaluating the crystal structure by X-ray diffraction indicate that the fired product is a composition having the same crystal structure as that of GdAlO$_3$ compounds having a perovskite structure. For reference, the X-ray diffraction pattern of the fired product is shown in FIG. 41A, and FIG. 41B shows the X-ray diffraction pattern of a GdAlO$_3$ compound synthesized at a temperature of 1500° C. A comparison with FIG. 41B indicates that the fired product is a composition of a single crystal phase having the perovskite structure that is the same as the GdAlO$_3$ compound.

Figure 42:
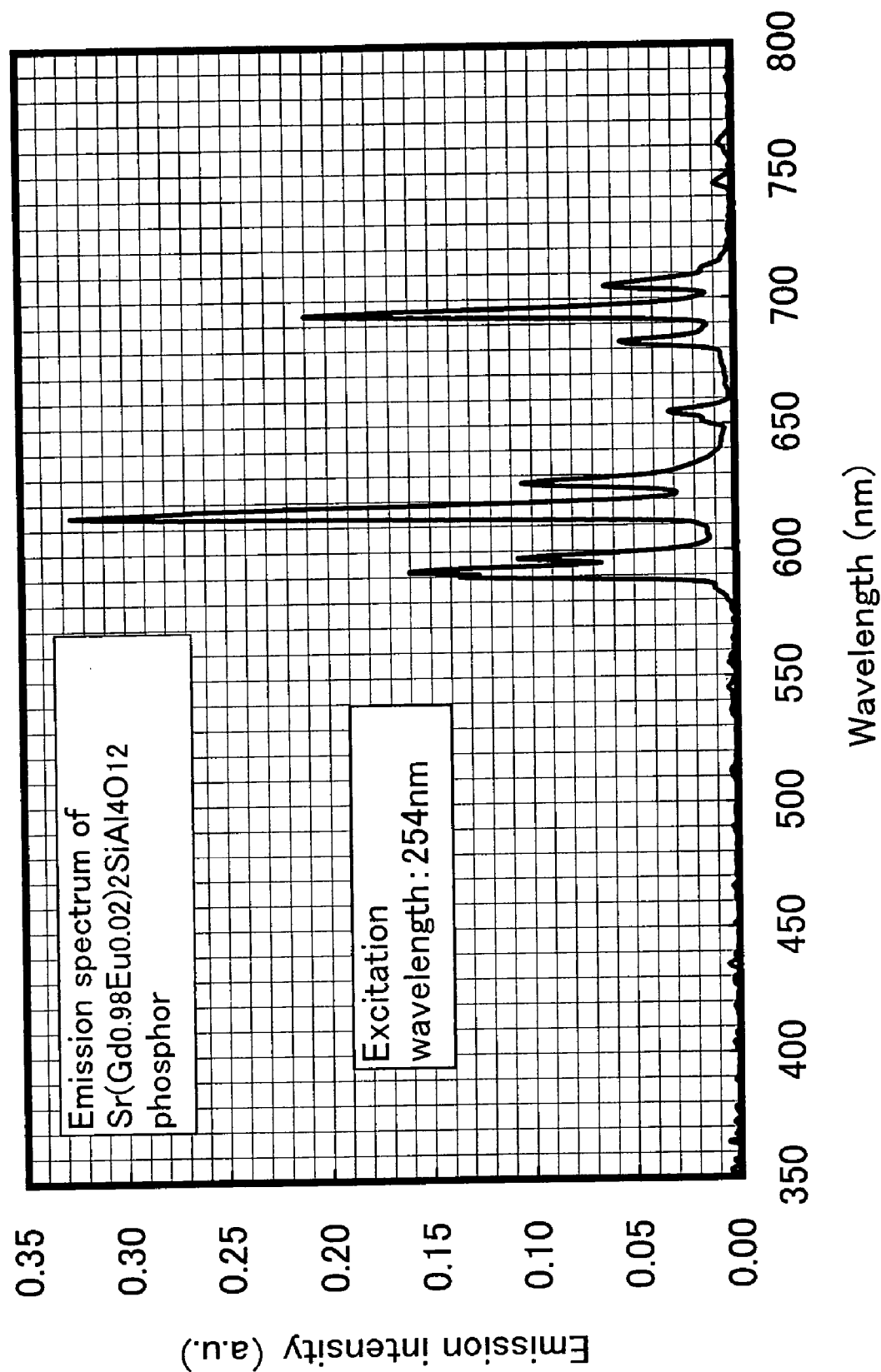
FIG. 42 is the emission spectrum of the phosphor of Example 16 of the present invention.
Figure 43:
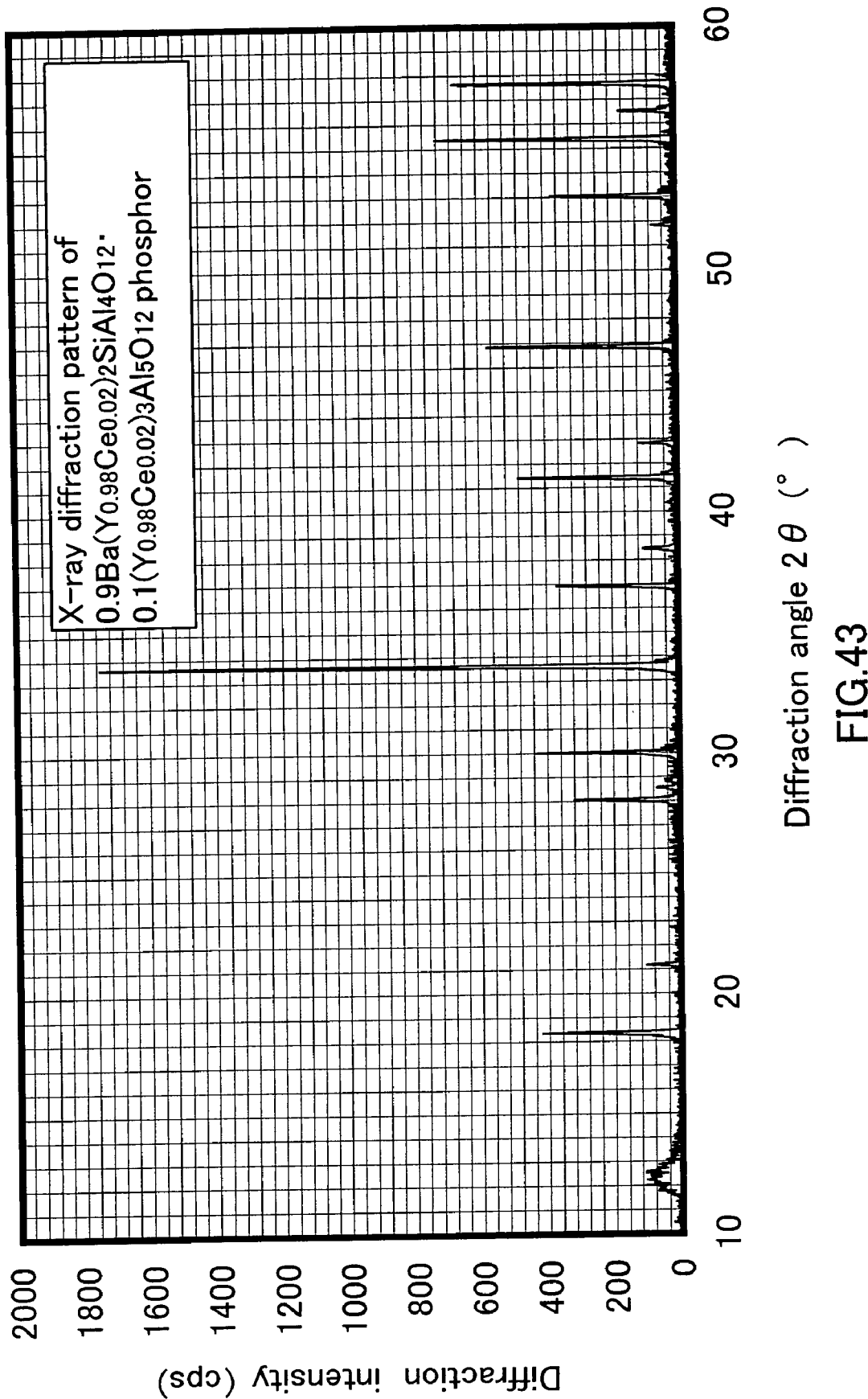
FIG. 43 is the X-ray diffraction pattern of a phosphor of Example 17 of the present invention.
Figure 44:
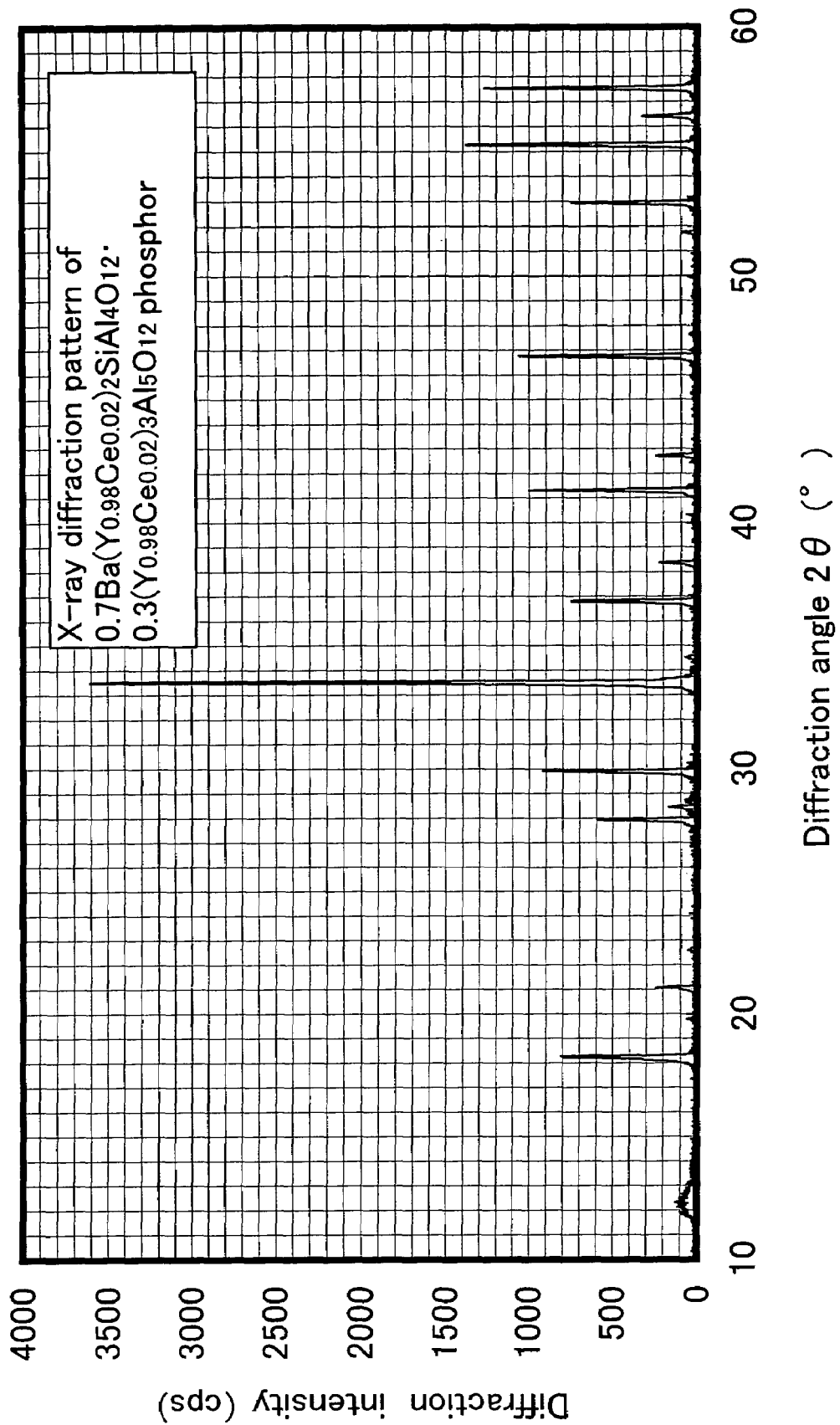
FIG. 44 is the X-ray diffraction pattern of the phosphor of Example 17 of the present invention.
Figure 45:
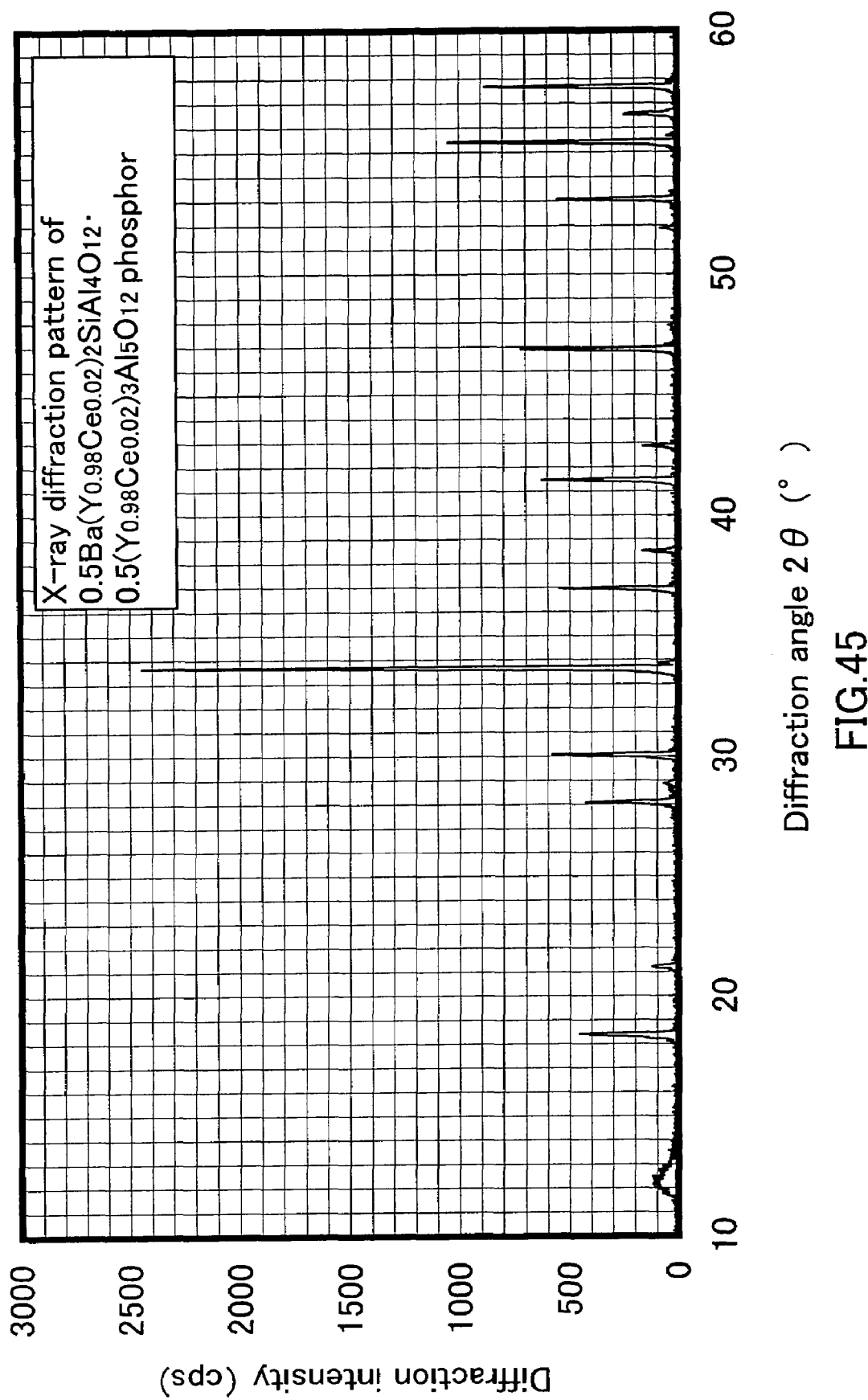
FIG. 45 is the X-ray diffraction pattern of the phosphor of Example 17 of the present invention.
Figure 46:
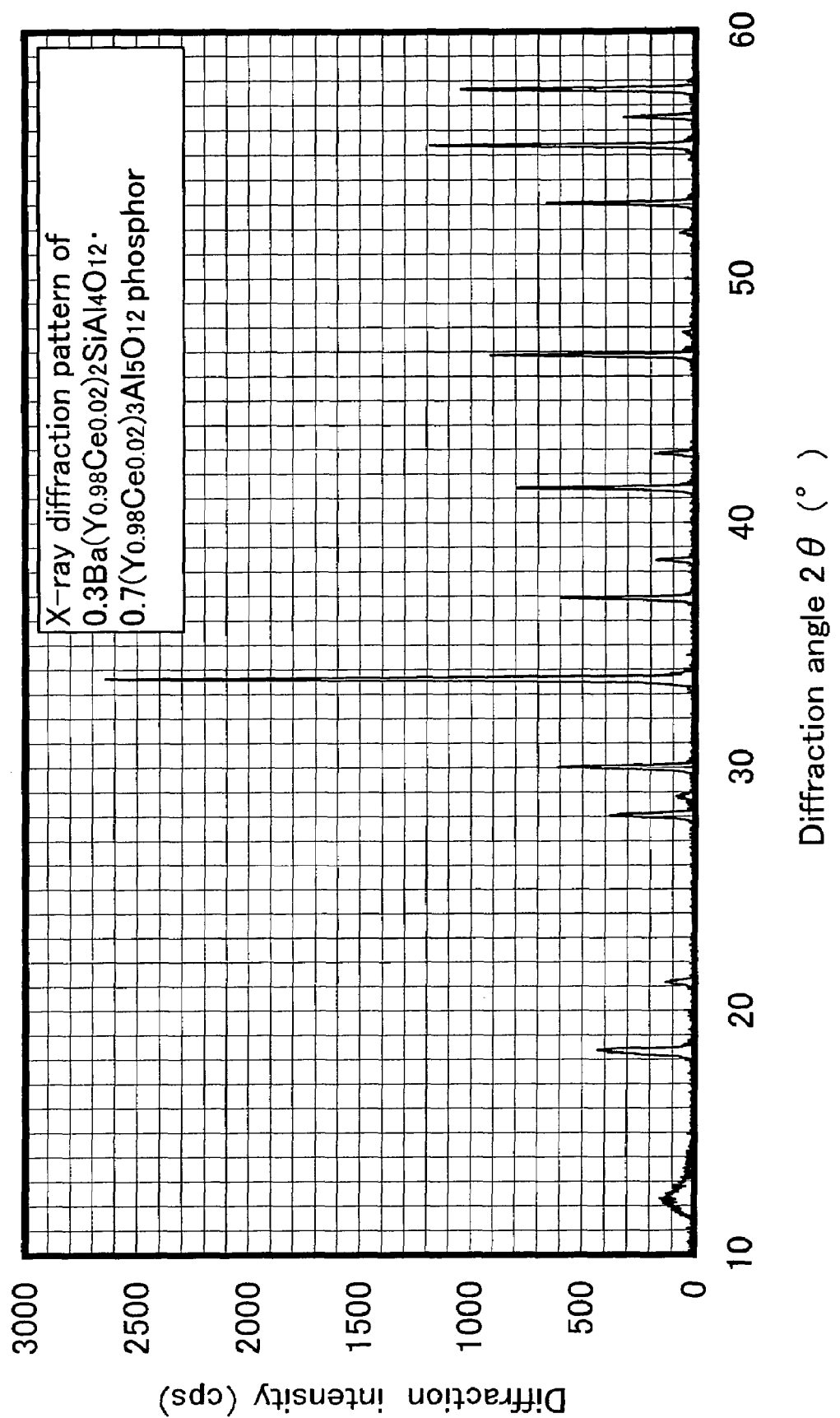
FIG. 46 is the X-ray diffraction pattern of the phosphor of Example 17 of the present invention.
Figure 47:
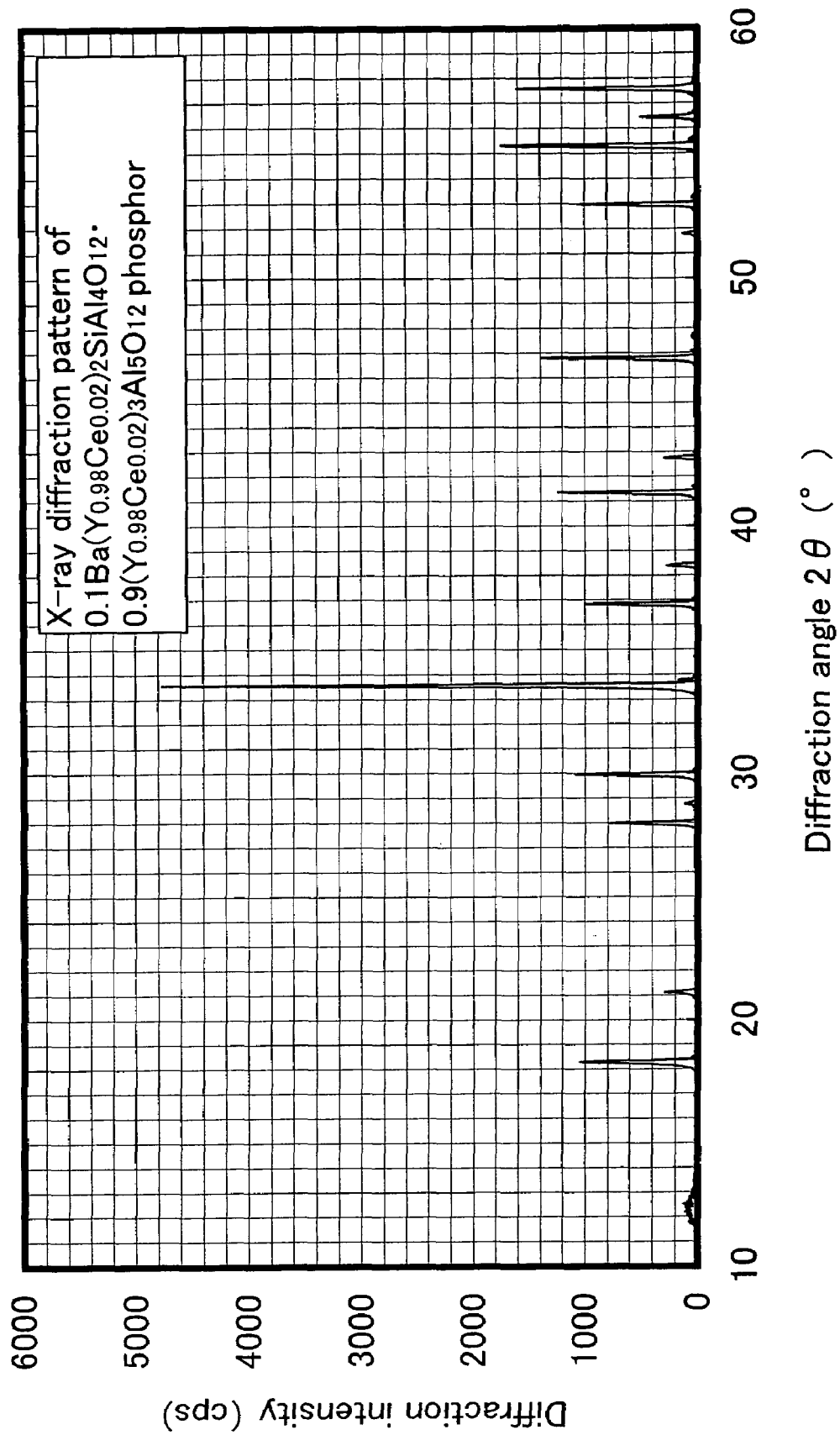
FIG. 47 is the X-ray diffraction pattern of the phosphor of Example 17 of the present invention.

FIG. 42 shows the emission spectrum of the fired product that was measured under excitation of ultraviolet rays of 254 nm. FIG. 42 indicates that the fired product is a phosphor emitting light with a plurality of bright lines in orange, red to infrared regions in the vicinity of the wavelengths 592 nm, 597 nm, 615 nm, 626 nm, and 694 nm.

The above results confirmed that the fired product is a Sr(Gd$_{0.98}$Eu$_{0.02}$)$_2$SiAl$_4$O$_{12}$ inorganic oxide having the perovskite structure that is the same as the GdAlO$_3$ compound, and is a SrGd$_2$SiAl$_4$O$_{12}$:Eu$^{3+}$ phosphor that is excited with ultraviolet light and emits redish light with sharp bright lines.

Example 17

Hereinafter, a method of producing a (1-x)Ba(Y$_{0.98}$Ce$_{0.02}$)$_2$ SiAl$_4$O$_{12}$·x(Y$_{0.98}$Ce$_{0.02}$)$_3$Al$_5$O$_{12}$ inorganic oxide, that is, a (1-x)BaY$_2$SiAl$_4$O$_{12}$·xY$_3$Al$_5$O$_{12}$:Ce$^{3+}$ phosphor, and the characteristics thereof will be described in Example 17 of the present invention. Nine samples with varied x of 0.0, 0.1, 0.3, 0.5, 0.7, 0.9, 0.95, 0.98, and 1.0 were produced and evaluated.

The following inorganic compound powders were used as the phosphor raw materials (inorganic oxide raw materials). Table 2 shows the ratio of the weighed weight of each value of x.

1) barium carbonate (BaCO$_3$): the purity 99.95%
(2) yttrium oxide (Y$_2$O$_3$): the purity 99.99%
(3) aluminum oxide (Al$_2$O$_3$): the purity 99.99%
(4) silicon dioxide (SiO$_2$): the purity 99.9%
(5) cerium oxide (CeO$_2$): the purity 99.99%

TABLE 2

| | X | | | | | | | | |
|---|---|---|---|---|---|---|---|---|---|
| | 0.0 | 0.1 | 0.3 | 0.5 | 0.7 | 0.9 | 0.95 | 0.98 | 1.0 |
| BaCo$_3$ | 9.87 g | 8.88 g | 6.91 g | 4.93 g | 2.96 g | 0.99 g | 0.49 g | 0.20 g | 0.00 g |
| Y$_2$O$_3$ | 11.07 g | 11.62 g | 12.72 g | 13.83 g | 14.94 g | 16.04 g | 16.32 g | 16.49 g | 16.60 g |
| Al$_2$O$_3$ | 10.20 g | 10.46 g | 10.97 g | 11.48 g | 11.99 g | 12.50 g | 12.62 g | 12.70 g | 12.75 g |
| SiO$_2$ | 3.07 g | 2.76 g | 2.15 g | 1.53 g | 0.92 g | 0.31 g | 0.15 g | 0.06 g | 0.00 g |
| CeO$_2$ | 0.34 g | 0.36 g | 0.40 g | 0.43 g | 0.47 g | 0.50 g | 0.51 g | 0.52 g | 0.52 g |

With x=0, the inorganic oxide is Ba(Y$_{0.98}$Ce$_{0.02}$)$_2$SiAl$_4$O$_{12}$, which is the same as that in Example 1, and with x=1, the inorganic oxide is (Y$_{0.98}$Ce$_{0.02}$)$_3$Al$_5$O$_{12}$, which is known. Also in Example 17, no flux was used. The phosphor raw materials were mixed sufficiently with an automatic mill, and then the mixed raw materials were fed into a firing container and were fired under the following firing conditions.
firing atmosphere: in the air
firing time: two hours The optimal synthesis conditions that can provide an inorganic oxide of a single crystal phase depend on the value of x, and a higher temperature is required as the value of x increases. The firing temperature of each sample having a different x is shown in Table 3.

TABLE 3

| x | firing temperature (° C.) |
|---|---|
| 0.0 | 1500 |
| 0.1 | 1520 |
| 0.3 | 1560 |
| 0.5 | 1600 |
| 0.7 | 1640 |
| 0.9 | 1680 |
| 0.95 | 1690 |
| 0.98 | 1690 |
| 1.0 | 1700 |

For simplicity of work, a post-treatment after firing (pulverizing/classification/washing and the like) was omitted.

The evaluation results of the crystal structure by X-ray diffraction indicate that the fired product is a composition of a substantially single crystal phase having a garnet crystal structure, regardless of the value of x. For reference, the X-ray diffraction patterns of the fired products when x is 0.1, 0.3, 0.5, 0.7, 0.9, and 1.0 are shown in FIGS. 43 to 48, respectively. The X-ray diffraction patterns of the fired products when x is 0.95 and 0.98 are omitted, but they were similar to that of FIG. 47 or 48. The case of x=0 has been shown in Example 1 (FIG. 13A).

Figure 48:
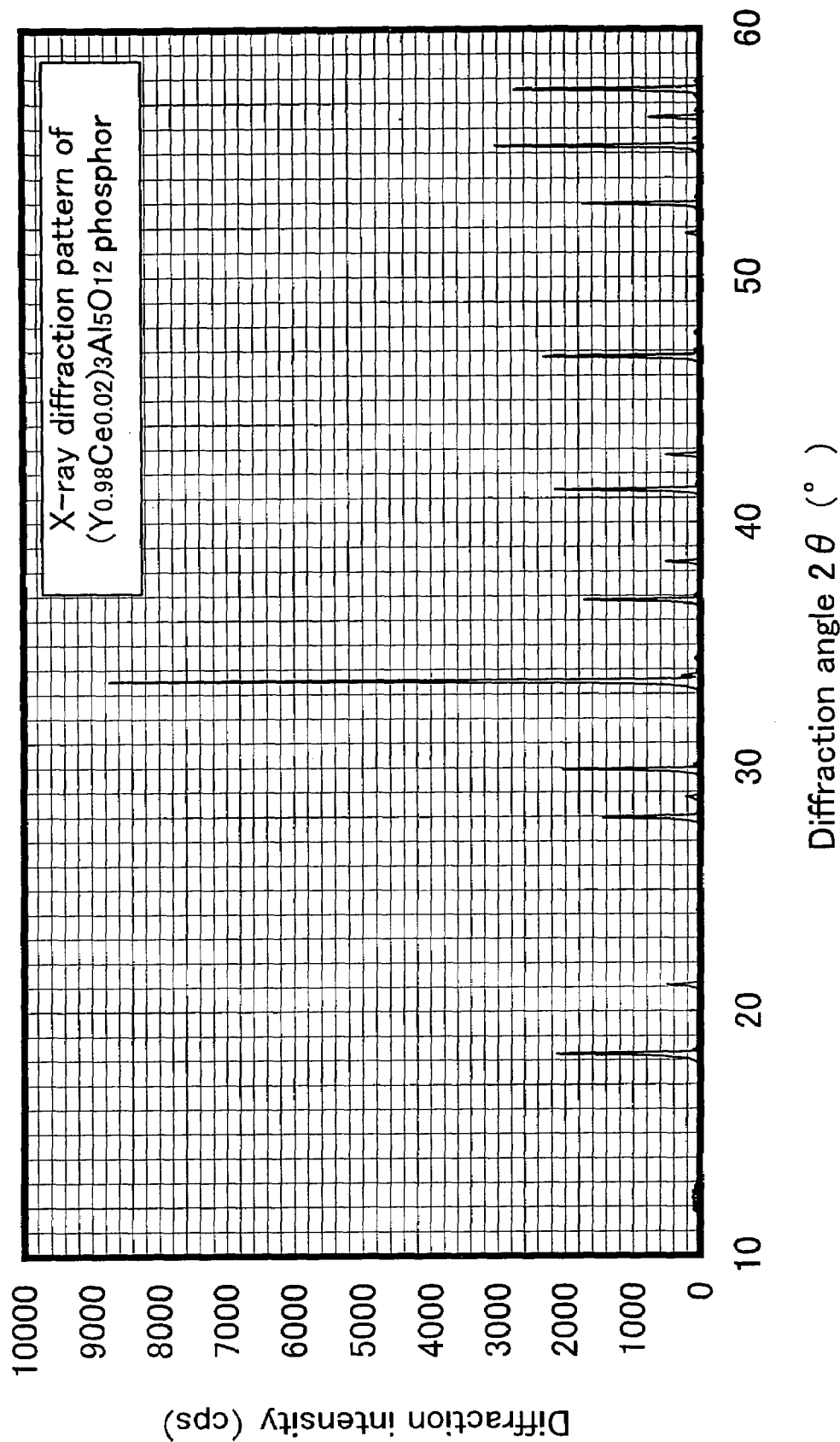
FIG. 48 is the X-ray diffraction pattern of the phosphor of Example 17 of the present invention.
Figure 49:
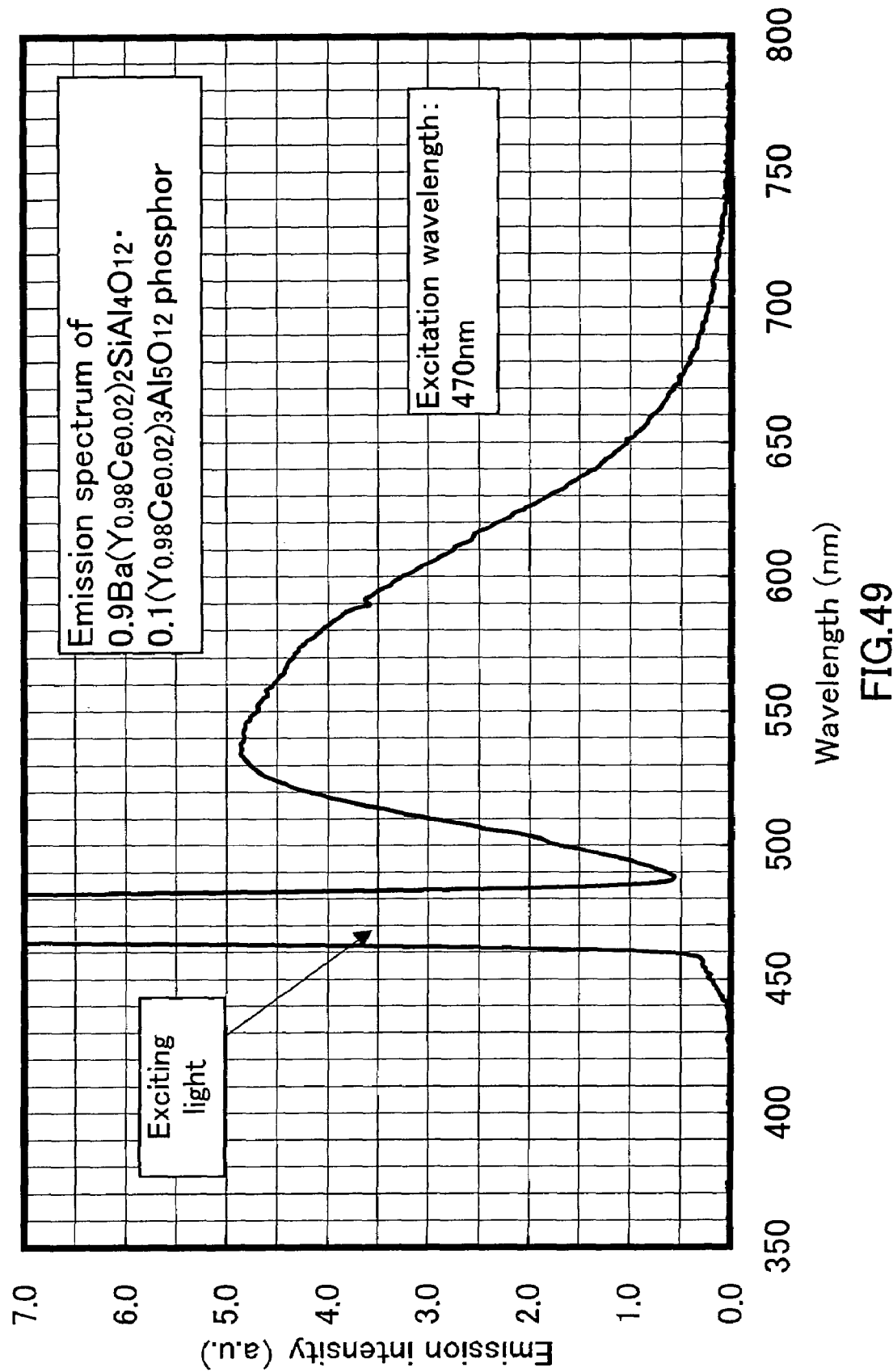
FIG. 49 is the emission spectrum of the phosphor of Example 17 of the present invention.
Figure 50:
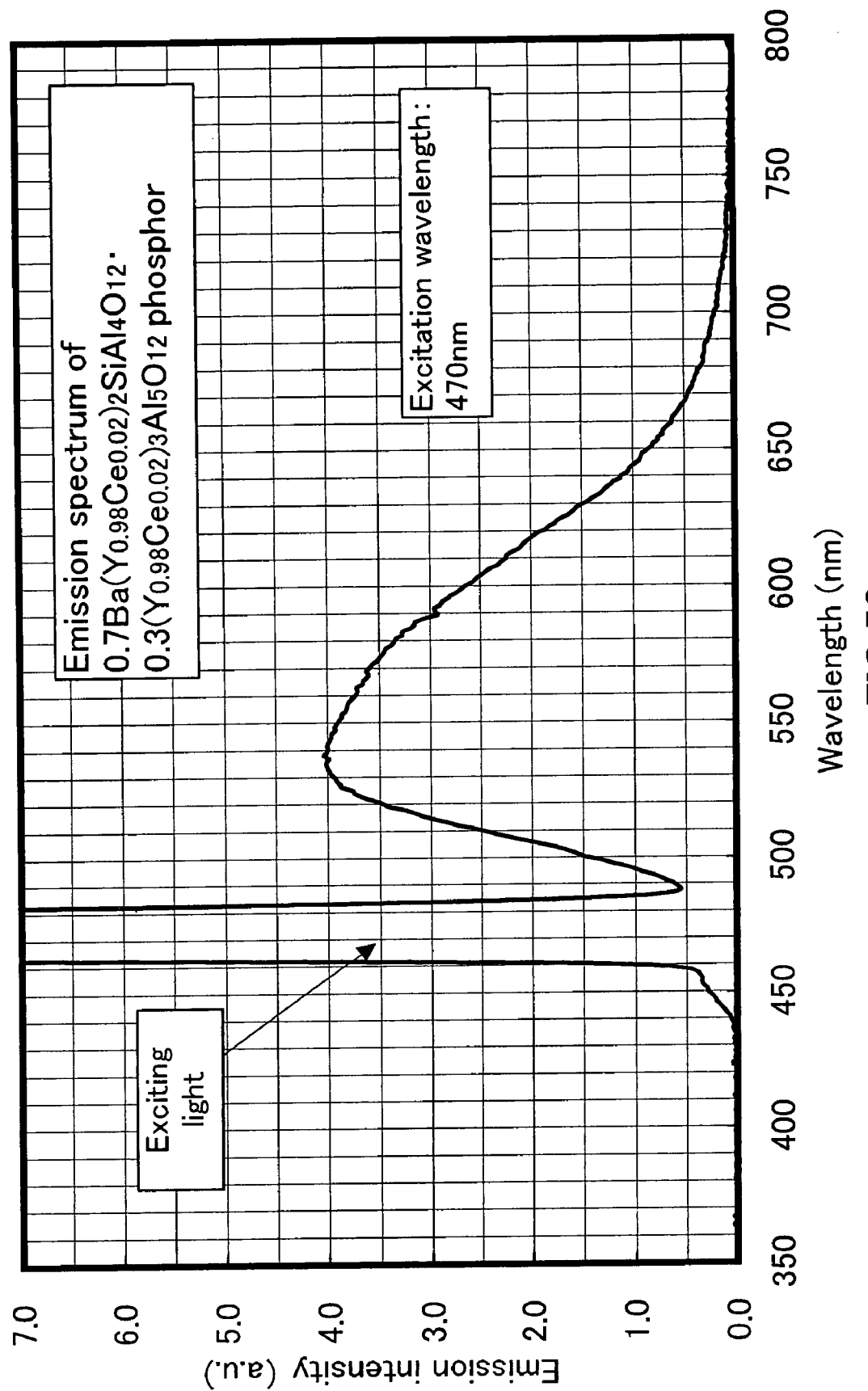
FIG. 50 is the emission spectrum of the phosphor of Example 17 of the present invention.
Figure 51:
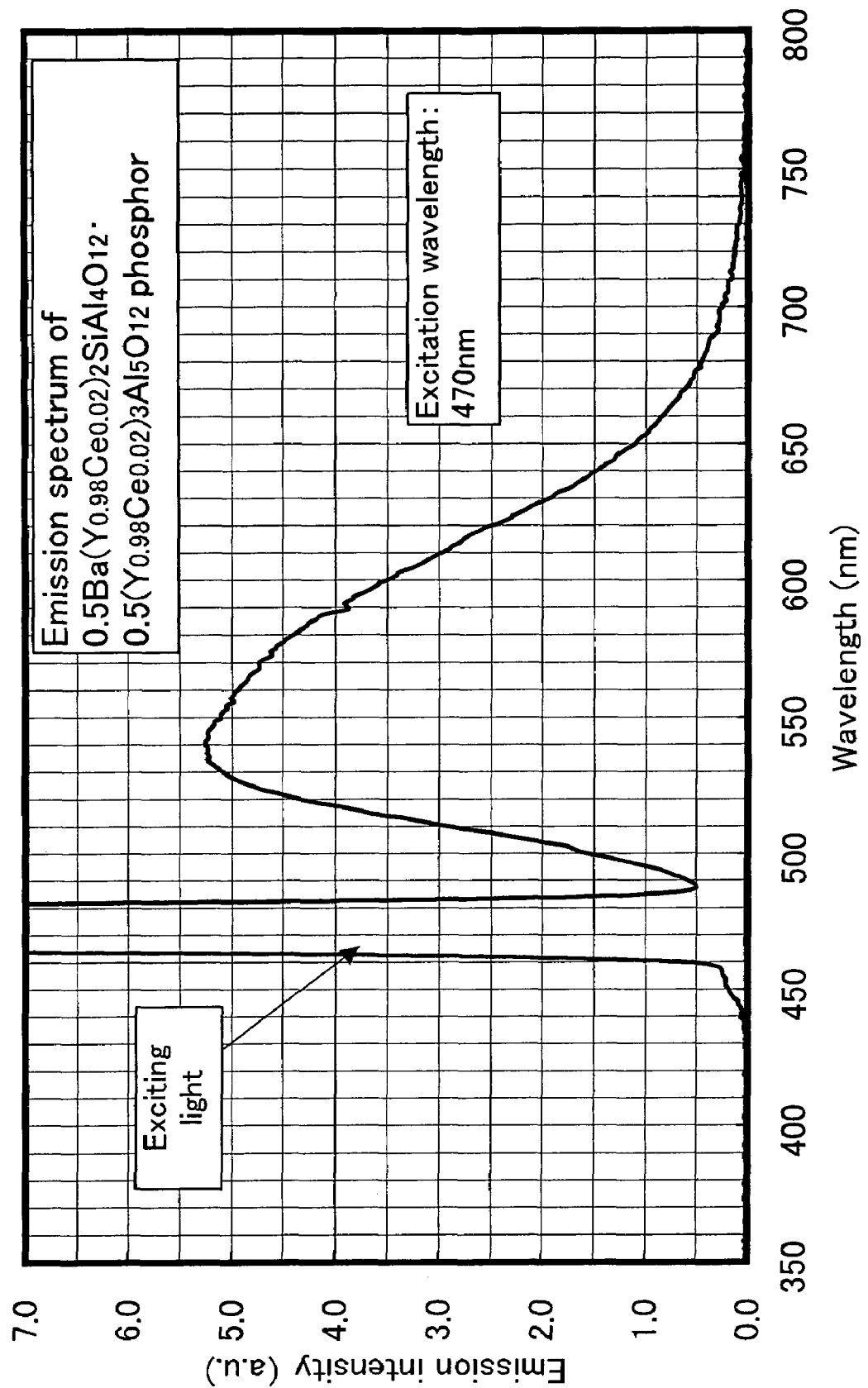
FIG. 51 is the emission spectrum of the phosphor of Example 17 of the present invention.
Figure 52:
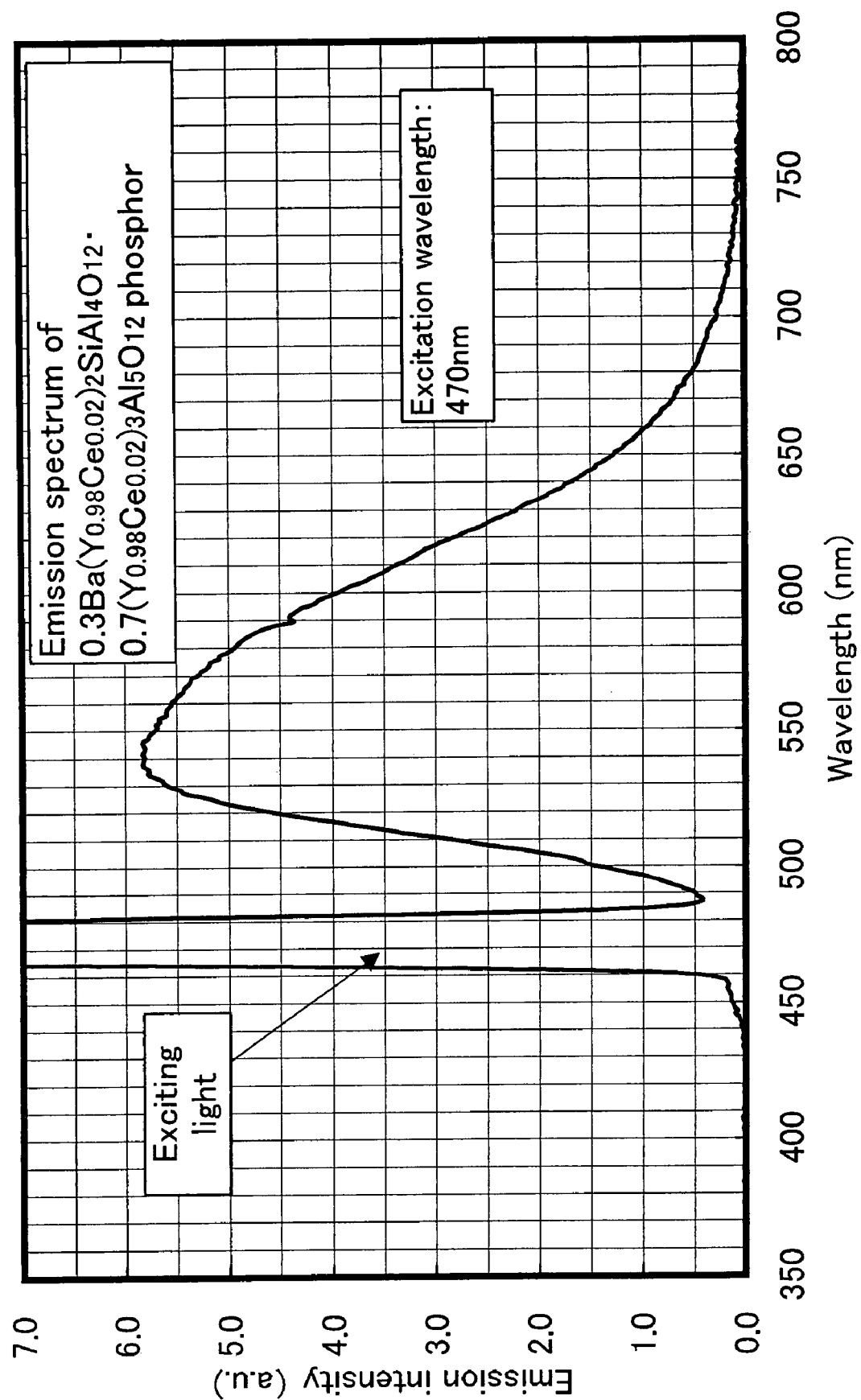
FIG. 52 is the emission spectrum of the phosphor of Example 17 of the present invention.
Figure 53:
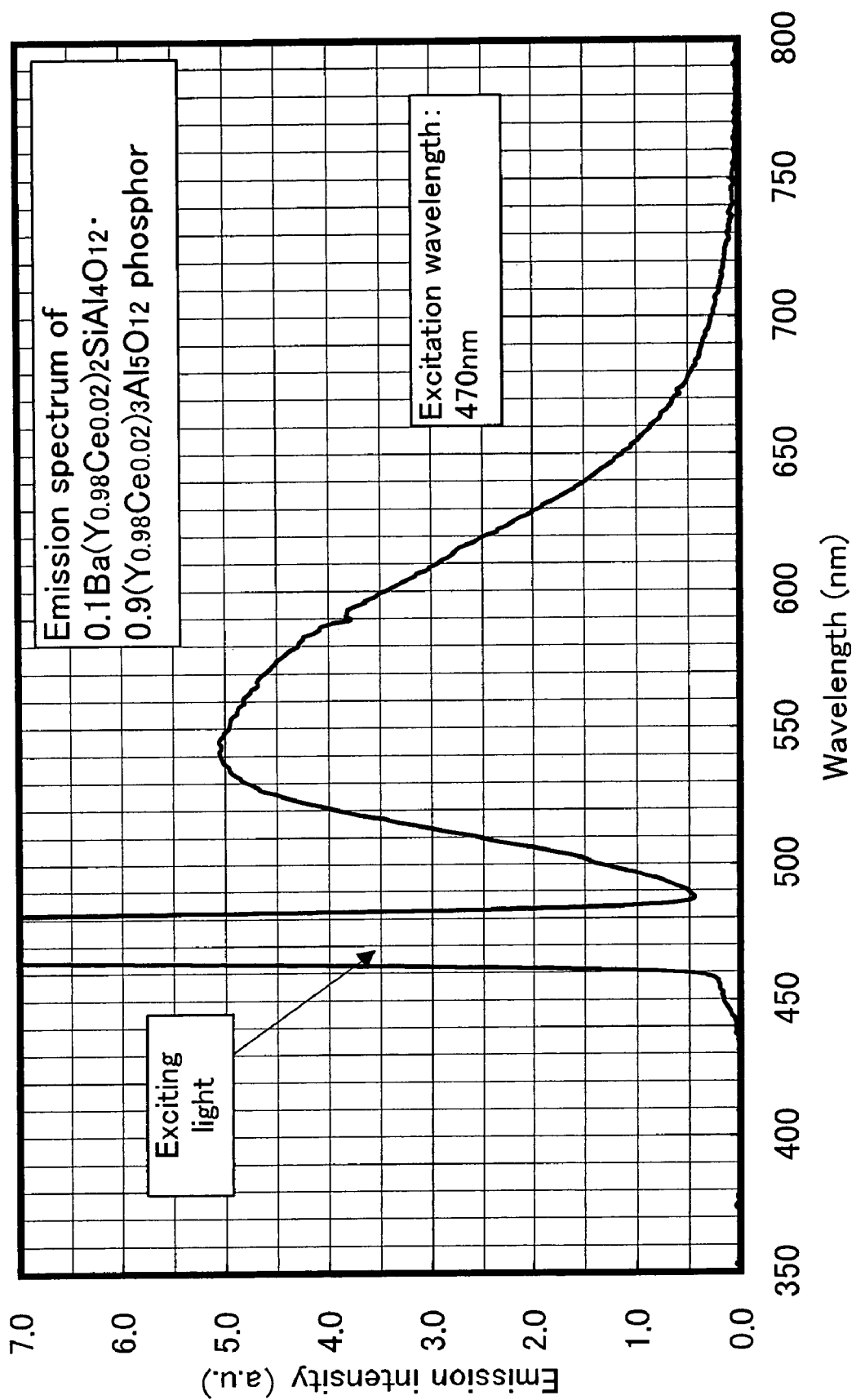
FIG. 53 is the emission spectrum of the phosphor of Example 17 of the present invention.
Figure 54:
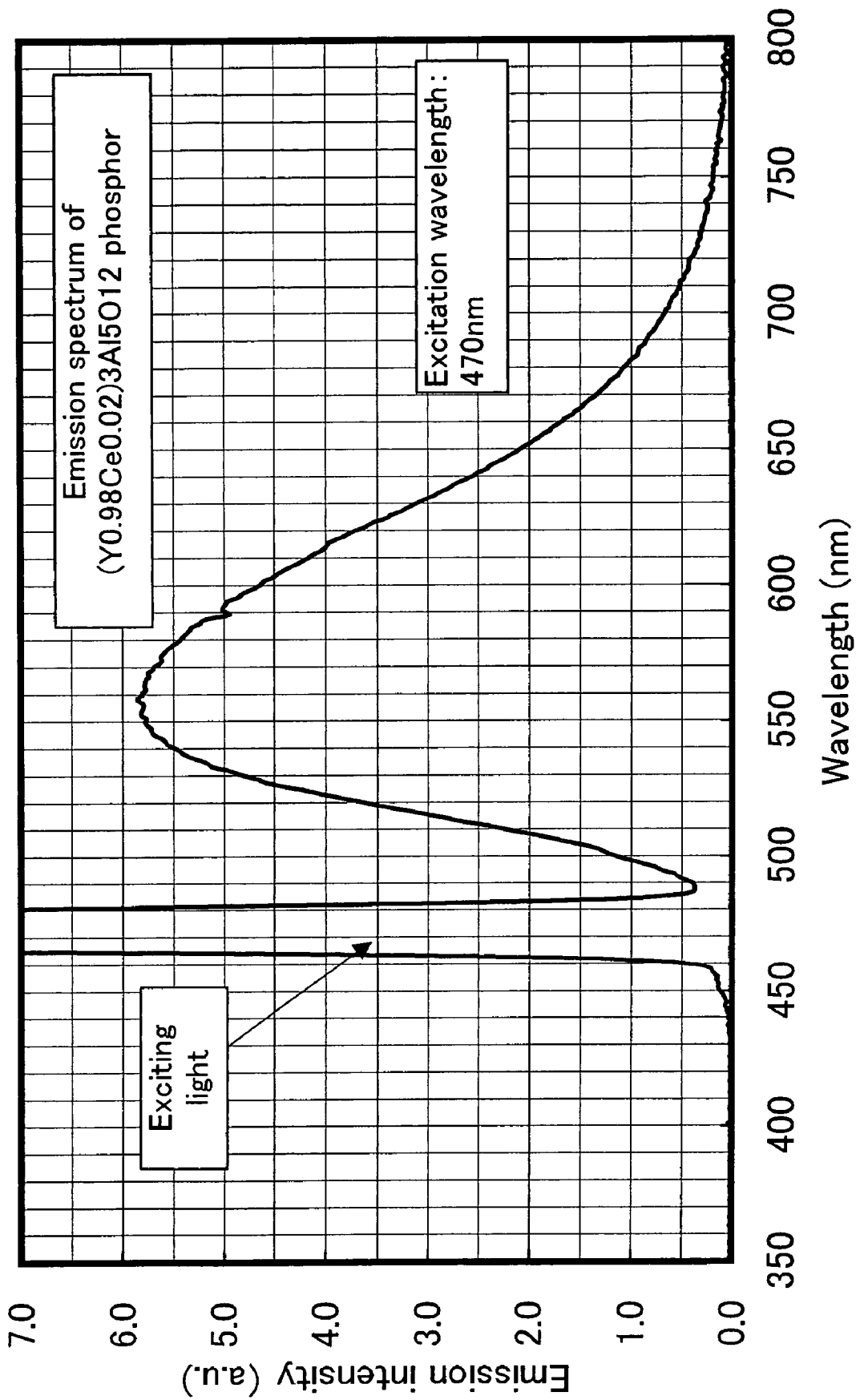
FIG. 54 is the emission spectrum of the phosphor of Example 17 of the present invention.

The diffraction patterns of the fired products are the same as that of $Y_3Al_5O_{12}$:$Ce^{3+}$ phosphor shown in FIG. 48 or 13B, and indicates that all the fired products are composition having a single crystal phase having the garnet structure, which is the same as the $Y_3Al_5O_{12}$:$Ce^{3+}$ phosphor, regardless of the value of x.

The results of evaluating the composition by the ICP emission spectrometry (the ratio of the only metal atoms) indicated that the fired product had the same composition as the composition when being fed for firing.

FIGS. 49 to 54 show the emission spectra of the fired products when x is 0.1, 0.3, 0.5, 0.7, 0.9, and 1.0 that were measured under excitation of blue light of 470 nm. The emission spectra of the fired products when x is 0.95 and 0.98 are omitted, but they were similar to that of FIG. 53 or 54.

FIGS. 49 to 54 indicate that the fired product is a phosphor emitting yellow-greenish light having a luminescent peak in the vicinity of a wavelength of 540 to 550 nm, regardless of the value of x.

The above results confirmed that all the fired products with $0 < x \leq 0.98$ are $(1-x)Ba(Y_{0.98}Ce_{0.02})_2SiAl_4O_{12}$·x$(Y_{0.98}Ce_{0.02})_3Al_5O_{12}$ inorganic oxides having a garnet crystal structure as in the case of x=0 described in Example 1 and in the case of x=1 of the known material, and also are $(1-x)BaY_2SiAl_4O_{12}$·x$Y_3Al_5O_{12}$:$Ce^{3+}$ phosphors that are excited with bluish light and emits yellow-green light containing a yellowish light-emitting component.

Figure 55:
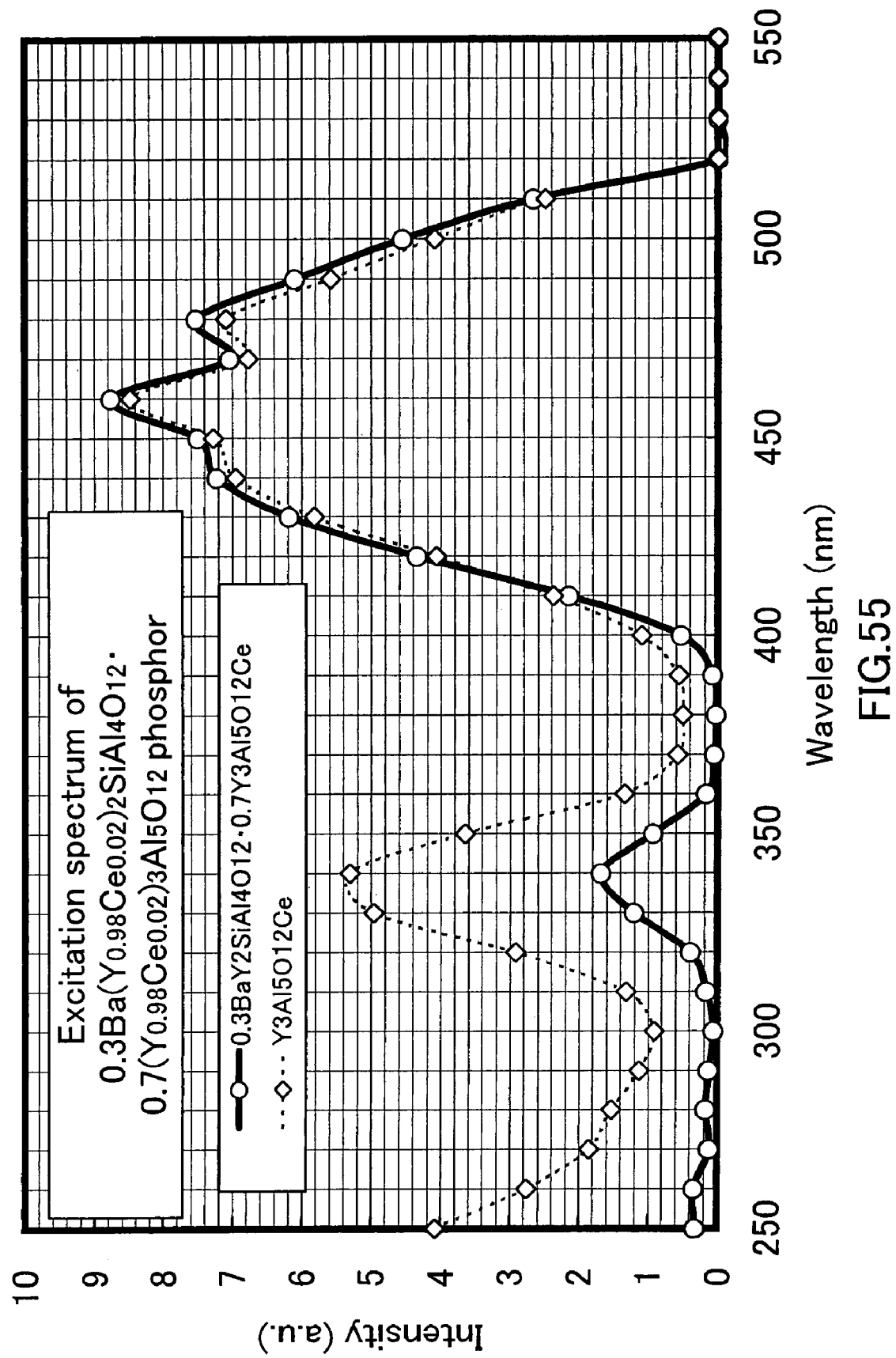
FIG. 55 is the excitation spectrum of the phosphor of Example 17 of the present invention.

FIG. 55 shows the emission spectrum in the excitation wavelength range of 250 to 550 nm (monitored luminescent wavelength: 540 nm) of a sample with x=0.7 (i.e., 0.3 $Ba(Y_{0.98}Ce_{0.02})_2SiAl_4O_{12}$·0.7$(Y_{0.98}Ce_{0.02})_3Al_5O_{12}$,) as an example of $(1-x)Ba(Y_{0.98}Ce_{0.02})_2SiAl_4O_{12}$·x$(Y_{0.98}Ce_{0.02})_3Al_5O_{12}$ inorganic oxide. For comparison, FIG. 57 also shows the excitation spectrum of a $Y_3Al_5O_{12}$:$Ce^{3+}$ phosphor as a reference.

The $Y_3Al_5O_{12}$:$Ce^{3+}$ phosphor as the reference is an inorganic oxide expressed by a chemical formula $(Y_{0.98}Ce_{0.02})_3Al_5O_{12}$ and was produced under the following conditions.
(1) phosphor raw materials
  yttrium oxide ($Y_2O_3$): 16.60 g, the purity 99.99%
  aluminum oxide ($Al_2O_3$): 12.75 g, the purity 99.99%
  cerium oxide ($CeO_2$): 0.62 g, the purity 99.99%
(2) flux
  barium fluoride ($BaF_2$): 0.088 g, the purity 99.9%
  (in a ratio of 0.01 mol (amount corresponding to 1 mol %) with respect to 1 mol of the $(Y_{0.98}Ce_{0.02})_3Al_5O_{12}$ inorganic oxide)
(3) firing conditions
  firing temperature: 1550° C.
  firing atmosphere: nitrogen hydrogen mixed gas (95 volume % nitrogen+5 volume % hydrogen) atmosphere
  firing time: two hours FIG. 55 indicates that the sample with x=0.7 is a phosphor that has substantially the same excitation spectrum as that of the $Y_3Al_5O_{12}$:$Ce^{3+}$ phosphor as the reference and is excited with blue light of 405 nm or more and 515 nm or less, further indicates that the phosphor emits light having a strong intensity equal to that of the $Y_3Al_5O_{12}$:$Ce^{3+}$ phosphor as the reference under the excitation conditions of blue light of 410 to 510 nm, in particular, 440 to 480 nm. Thus, it is confirmed that the phosphor of Example 17 of the present invention not only has the excitation characteristics similar to those of the $Y_3Al_5O_{12}$:$Ce^{3+}$ phosphor, but also has a light emitting performance comparable to the $Y_3Al_5O_{12}$:$Ce^{3+}$ phosphor.

Summing up the above-described results, it was confirmed that the $(1-x)BaY_2SiAl_4O_{12}$·x$Y_3Al_5O_{12}$:$Ce^{3+}$ phosphor can have a light emitting performance comparable to the $Y_3Al_5O_{12}$:$Ce^{3+}$ phosphor.

In Example 17, only the $(1-x)Ba(Y_{0.98}Ce_{0.02})_2SiAl_4O_{12}$·x$(Y_{0.98}Ce_{0.02})_3Al_5O_{12}$ inorganic oxide has been described, but the same results are obtained in the case of a $(1-x)Mg(Y_{0.98}Ce_{0.02})_2SiAl_4O_{12}$·x$(Y_{0.98}Ce_{0.02})_3Al_5O_{12}$ inorganic oxide, a $(1-x)Sr(Y_{0.98}Ce_{0.02})_2SiAl_4O_{12}$·x$(Y_{0.98}Ce_{0.02})_3Al_5O_{12}$ inorganic oxide, and a $(1-x)Ba(Y_{0.88}Gd_{0.1}Ce_{0.02})_2SiAl_4O_{12}$·x$(Y_{0.88}Gd_{0.1}Ce_{0.02})_3Al_5O_{12}$ inorganic oxide, and these inorganic oxides have the garnet crystal structure, and are excited with blue light and emit yellowish light, regardless of the value of x.

In the phosphor of the Example 17 as well, the $Pr^{3+}$ co-addition effect as described in Example 6, that is, the effect that bright-line light is emitted in a red region in the vicinity of 610 nm so that the phosphor has a red light-emitting component in a large content can be obtained.

Furthermore, in the examples, for the purpose of understanding the gist of the present invention, the amounts of Ce, Eu, and Tb that are substituted with respect to Ln are constant amounts corresponding to 2 at %, but other amounts can provide the same function and effects, although the extent thereof is varied.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An inorganic oxide expressed by a chemical formula III $$(1-x)MLn_2QR_4O_{12}\cdot xLn_3R_5O_{12} \tag{III}$$

where M is at least one element selected from the group consisting of Mg, Ca, Sr, and Ba, wherein M is 50 atomic % or more of Ba;

Ln is at least one rare earth element selected from the group consisting of Sc, Y, La, Ce, Pr, Nd, Sm, Eu, Gd, Tb, Dy, Ho, Er, Tm, Yb, and Lu;

Q is at least one element selected from the group consisting of Si, Ge, Sn, and Pb;

R is at least one element selected from the group consisting of B, Al, Ga, In, and Tl; and x is in a range of $0 \leq x \leq 0.7$.

2. The inorganic oxide according to claim 1, wherein the range of x is $0 \leq x \leq 0.5$.

3. The inorganic oxide according to claim 1, wherein the Ln is at least one rare earth element selected from the group consisting of Sc, Y, La and Gd, the Q is at least one element selected from the group consisting of Si and Ge, and the R is at least one element selected from the group consisting of B, Al and Ga.

4. The inorganic oxide according to claim 3, wherein the majority of the Ln is made up of Y.

5. The inorganic oxide according to claim 3, wherein the majority of the Q is made up of Si.

6. The inorganic oxide according to claim 3, wherein the majority of the R is made up of at least one selected from Al and Ga.

7. The inorganic oxide according to claim 1, wherein the inorganic oxide has a garnet crystal structure.

8. The inorganic oxide according to claim 1, wherein the inorganic oxide further comprises at least one rare earth element selected from the group consisting of Ce, Pr, Nd, Sm, Eu, Gd, Tb, Dy, Ho, Er, Tm, Yb and Lu.

9. A phosphor having an inorganic oxide expressed by a chemical formula III as a phosphor host or an active component $$(1-x)MLn_2QR_4O_{12} \cdot xLn_3R_5O_{12} \quad \text{(III)}$$

where M is at least one element selected from the group consisting of Mg, Ca, Sr, and Ba, wherein M is 50 atomic % or more of Ba;

Ln is at least one rare earth element selected from the group consisting of Sc, Y, La, Ce, Pr, Nd, Sm, Eu, Gd, Tb, Dy, Ho, Er, Tm, Yb, and Lu;

Q is at least one element selected from the group consisting of Si, Ge, Sn, and Pb;

R is at least one element selected from the group consisting of B, Al, Ga, In, and Tl; and x is in a range of $0 \leqq x \leqq 0.7$.

10. The phosphor according to claim 9, further comprising at least one selected from the group consisting of $Ce^{3+}$ ions, $Pr^{3+}$ ions, $Eu^{3+}$ ions, and $Tb^{3+}$ ions as a luminescent center of the phosphor.

11. An inorganic oxide expressed by a chemical formula III below which is a solid solution, in which an inorganic oxide expressed by a chemical formula II below is doped into an inorganic oxide expressed by the chemical formula I below $$MLn_2QR_4O_{12} \quad \text{(I)}$$

$$Ln_3R_5O_{12} \quad \text{(II)}$$

$$(1-x)MLn_2QR_4O_{12} \cdot xLn_3R_5O_{12} \quad \text{(III)}$$

where M is at least one element selected from the group consisting of Mg, Ca, Sr, and Ba;

Ln is at least one rare earth element selected from the group consisting of Sc, Y, La, Ce, Pr, Nd, Sm, Eu, Gd, Tb, Dy, Ho, Er, Tm, Yb, and Lu;

Q is at least one element selected from the group consisting of Si, Ge, Sn, and Pb;

R is at least one element selected from the group consisting of B, Al and Ga; and x is in a range of $0 < x \leqq 0.98$.

wherein the majority of a combination of M is made up of Ba and the majority of Q is made of Si.

12. The inorganic oxide according to claim 11, wherein to majority of the Ln is made up of Y.

13. The inorganic oxide according to claim 11, wherein the majority of the R is made up of Al.

14. The inorganic oxide according to claim 11, wherein the inorganic oxide further comprises at least one rare earth element selected from the group consisting of Ce, Pr, Eu, Tb.

15. The inorganic oxide according to claim 11, further comprising at least one selected from the group consisting of $Ce^{3+}$ ions, $Pr^{3+}$ ions, $Eu^{3+}$ ions, and $Tb^{3+}$ ions as a luminescent center of the phosphor.

16. An inorganic oxide expressed by a chemical formula I below $$MLn_2QR_4O_{12} \quad \text{(I)}$$

wherein the inorganic oxide has a hexagonal crystal structure or a perovskite structure, M is at least one element selected from the group consisting of Mg, Ca, Sr, and Ba;

Ln is at least one rare earth element selected from the group consisting of Sc, Y, La, Ce, Pr, Nd, Sm, Eu, Gd, Tb, Dy, Ho, Er, Tm, Yb, and Lu;

Q is Si; and

R is B or Al.

17. The inorganic oxide according to claim 16, wherein the majority of a combination of the M is made up of Sr or Ba and the majority of the Ln is made up of Y or Gd.

18. The inorganic oxide according to claim 16, wherein R is B.

19. The inorganic oxide according to claim 16, wherein the majority of the M is made up of Sr and the majority of the Ln is made up of Gd.

20. The inorganic oxide according to claim 16, further comprising at least one selected from the group consisting of $Ce^{3+}$ ions, $Pr^{3+}$ ions, $Eu^{3+}$ ions, and $Tb^{3+}$ ions as a luminescent center of the phosphor.

* * * * *

UNITED STATES PATENT AND TRADEMARK OFFICE
CERTIFICATE OF CORRECTION

PATENT NO. : 7,029,602 B2 Page 1 of 1
APPLICATION NO. : 10/672345
DATED : April 18, 2006
INVENTOR(S) : Oshio It is certified that error appears in the above-identified patent and that said Letters Patent is hereby corrected as shown below:

On Title Page
Item 56, second column, line16(other publications): "New york" should read --New York--
Item 57, second column, line 33(abstract): "and Pb,;" should read --and Pb;--
Column 32, line 5(claim 11): "0.98." should read --0.98,--

Signed and Sealed this

Sixteenth Day of January, 2007

JON W. DUDAS
*Director of the United States Patent and Trademark Office*